US010686469B2

(12) United States Patent
Lou et al.

(10) Patent No.: US 10,686,469 B2
(45) Date of Patent: Jun. 16, 2020

(54) PAYLOAD SIZE AMBIGUITY AND FALSE ALARM RATE REDUCTION FOR POLAR CODES

(71) Applicant: QUALCOMM Incorporated, San Diego, CA (US)

(72) Inventors: Huang Lou, San Diego, CA (US); Jing Jiang, San Diego, CA (US); Enoch Shiao-Kuang Lu, San Diego, CA (US); Gabi Sarkis, San Diego, CA (US); Yang Yang, San Diego, CA (US); Hari Sankar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 98 days.

(21) Appl. No.: 15/953,239

(22) Filed: Apr. 13, 2018

(65) Prior Publication Data
US 2018/0331693 A1 Nov. 15, 2018

Related U.S. Application Data
(60) Provisional application No. 62/506,439, filed on May 15, 2017.

(51) Int. Cl.
*H03M 13/09* (2006.01)
*H03M 13/15* (2006.01)
*H04L 1/00* (2006.01)
*H03M 13/13* (2006.01)
*H03M 13/00* (2006.01)

(52) U.S. Cl.
CPC .......... *H03M 13/09* (2013.01); *H03M 13/13* (2013.01); *H03M 13/15* (2013.01);
(Continued)

(58) Field of Classification Search
USPC .......................................... 714/758, 762, 761
See application file for complete search history.

(56) References Cited

U.S. PATENT DOCUMENTS 10,340,950 B2 * 7/2019 Klein
10,361,717 B2 * 7/2019 Ge
(Continued)

OTHER PUBLICATIONS

Huawei et al., "Evaluation of Channel Coding Schemes for Control Channel", 3GPP TSG RAN WG1 Meeting #86b, R1-1608863, Oct. 14, 2016, 4 pages.
(Continued)

*Primary Examiner* — Fritz Alphonse
(74) *Attorney, Agent, or Firm* — Holland & Hart LLP/Qualcomm

(57) ABSTRACT

Size ambiguity and false alarm rate reduction for polar codes. A user equipment (UE) may determine a decoding candidate bit sequence for a polar-encoded codeword having a codeword size based on a decoding hypothesis for control information having a particular bit length of multiple different bit lengths for the codeword size. The UE may calculate an error detection code (EDC) value for a payload portion of the decoding candidate bit sequence using an EDC algorithm, and may initialize an EDC variable state with at least one non-zero bit value. Scrambling or interleaving of bits may also be performed prior to, or after, polar encoding and may depend on the bit length. In examples, information bits may be bit-reversed prior to generating an EDC value. In examples, the encoded bits may include multiple EDC values to assist the UE in performing early termination and to reduce a false alarm rate.

54 Claims, 21 Drawing Sheets

(52) U.S. Cl.
CPC ...... *H03M 13/6362* (2013.01); *H04L 1/0041* (2013.01); *H04L 1/0057* (2013.01); *H04L 1/0061* (2013.01); *H04L 1/0072* (2013.01); *H04L 1/0045* (2013.01)

(56) References Cited

U.S. PATENT DOCUMENTS 10,361,728 B2* 7/2019 Shi
10,374,754 B2* 8/2019 Shen

OTHER PUBLICATIONS

Huawei, et al., "Polar Code Design," 3GPP Draft; R1-1706965 Polar Code Design, 3rd Generation Partnership Project (3GPP), Mobile Competence Centre; 650, Route Des Lucioles; F-06921 Sophia-Antipolis Cedex; France, vol. RAN WG1, No. Hangzhou, China; 20170515-20170519, May 14, 2017, XP051272195, 12 pages, Retrieved from the Internet: URL: http://www.3gpp.org/ftp/Meetings_3GPP_SYNC/RAN1/Docs/ [retrieved on May 14, 2017].
International Search Report and Written Opinion—PCT/US2018/027712—ISA/EPO—dated Jul. 24, 2018.
Qualcomm Incorporated: "DCI CRC Initialization and Masking," 3GPP Draft; R1-1720704-DCI CRC Initialization and Masking, 3rd Generation Partnership Project (3GPP), Mobile Competence Centre; 650, Route Des Lucioles; F-06921 Sophia-Antipolis Cedex; France, vol. RAN WG1, No. Reno, USA; 20171127-20171201, Nov. 18, 2017, XP051370165, 5 pages, Retrieved from the Internet: URL: http://www.3gpp.org/tsg_ran/WG1_RL1/TSGR1_91/Docs/ [retrieved on Nov. 18, 2017].

* cited by examiner

PAYLOAD SIZE AMBIGUITY AND FALSE ALARM RATE REDUCTION FOR POLAR CODES

CROSS REFERENCES

The present Application for Patent claims priority to U.S. Provisional Patent Application No. 62/506,439 by Lou et al., entitled "Payload Size Ambiguity And False Alarm Rate Reduction For Polar Codes," filed May 15, 2017, assigned to the assignee hereof.

BACKGROUND

The following relates generally to wireless communication, and more specifically to size ambiguity reduction and false alarm rate reduction for polar codes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

In LTE systems, a physical downlink shared channel (PDCCH) carries data and signaling information to a UE, including a downlink control information (DCI) message. The DCI message includes information regarding downlink scheduling assignments, uplink resource grants, transmission scheme, uplink power control, hybrid automatic return repeat request (HARQ) information, modulation and coding schemes (MCS) and other information. A DCI message can be UE-specific (dedicated) or cell-specific (common) and placed in different dedicated and common search spaces within the PDCCH depending on a format of the DCI message. A UE attempts to decode the DCI by performing a process known as a blind decode, during which multiple decode attempts are carried out in the search spaces until the DCI message is detected. The different formats may result in the DCI messages being of different sizes, and ambiguity in the size of the DCI message creates challenges for existing implementations during blind decoding.

SUMMARY

The described techniques relate to improved methods, systems, devices, or apparatuses that support size ambiguity reduction and false alarm rate reduction for polar codes. Generally, the described techniques provide for improving the ability of a receiver to determine which of multiple bit lengths a transmitter used to send a transmitted control information vector, improving decoder performance by supporting early termination decisions, and reducing a false alarm rate. A base station may transmit control information in a control channel that can be UE-specific (dedicated) or cell-specific (common). The control information may be transmitted in different dedicated and common search spaces within the control channel. Challenges arise in successfully detecting control information intended for a particular UE, while maintaining a low false alarm rate.

The base station may select one of multiple different bit lengths for the control information, and a problem with conventional techniques is the UE may be unable to determine which bit length was used. In some cases, a UE may receive a signal that includes a polar-encoded codeword generated from the control information that has a particular bit length. However, the UE may decode the polar-encoded codeword to generate one or more decoded bit sequences according to a bit length hypothesis that is different than the bit length of the transmitted control information. For example, the polar-encoded codeword may be generated according to a different control information format than the bit length of a decode hypothesis used for decoding the polar-encoded codeword. If a portion of the information vector (the portion that is different between the transmitted bit length and the decoding hypothesis bit length) generates a repeating cyclic redundancy check (CRC) state (e.g., all zeros), the UE may determine that the decoding hypothesis passes error detection. Thus, a false alarm may occur, causing the UE to parse incorrect information. Alternatively, the UE may detect that multiple decoding hypotheses result in decoded bit sequences that pass error detection. In such scenarios, the UE is unable to determine the bit length of the control information that was actually transmitted by the base station.

In accordance with the examples described herein, a base station may generate a polar-encoded codeword that assists the UE in determining which bit length was used for the transmitted control information. In some examples, the base station may initialize a variable state for an error detection code (EDC) calculation algorithm to be a non-all-zero state. In some examples, the base station may scramble bits prior to, or after, polar encoding. In some additional examples, the base station may interleave bits differently depending on which bit length is used. In further examples, the base station may bit reverse the information bits prior to generating a EDC value. In additional examples, the base station may polar encode a data block that includes multiple EDC values to assist the UE in making a decision on whether to early terminate decoding and to reduce a false alarm rate.

A method of wireless communication is described. The method may include monitoring a signal for a polar-encoded codeword having a codeword size, determining a decoding candidate bit sequence based at least in part on the signal, wherein the decoding candidate bit sequence is associated with a decoding hypothesis for control information having a particular bit length of a plurality of different bit lengths for the codeword size, calculating an EDC value for a payload portion of the decoding candidate bit sequence using an EDC algorithm, wherein the calculating comprises initializing a variable state for the EDC algorithm with at least one non-zero bit value, and determining a decoding output state for the payload portion of the decoding candidate bit sequence based at least in part on the EDC value and an EDC portion of the decoding candidate bit sequence.

An apparatus for wireless communication is described. The apparatus may include means for monitoring a signal for a polar-encoded codeword having a codeword size, means for determining a decoding candidate bit sequence based at least in part on the signal, wherein the decoding candidate bit sequence is associated with a decoding hypothesis for control information having a particular bit length of a plurality of different bit lengths for the codeword size, means for calculating an EDC value for a payload portion of the decoding candidate bit sequence using an EDC algorithm, wherein the calculating comprises initializing a variable state for the EDC algorithm with at least one non-zero bit value, and means for determining a decoding output state for the payload portion of the decoding candidate bit sequence based at least in part on the EDC value and an EDC portion of the decoding candidate bit sequence.

Another apparatus for wireless communication is described. The apparatus may include a processor, memory in electronic communication with the processor, and instructions stored in the memory. The instructions may be operable to cause the processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, calculate an EDC value for a payload portion of the decoding candidate bit sequence using an EDC algorithm, wherein the calculating comprises initializing a variable state for the EDC algorithm with at least one non-zero bit value, and determine a decoding output state for the payload portion of the decoding candidate bit sequence based at least in part on the EDC value and an EDC portion of the decoding candidate bit sequence.

A non-transitory computer readable medium for wireless communication is described. The non-transitory computer-readable medium may include instructions operable to cause a processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, calculate an EDC value for a payload portion of the decoding candidate bit sequence using an EDC algorithm, wherein the calculating comprises initializing a variable state for the EDC algorithm with at least one non-zero bit value, and determine a decoding output state for the payload portion of the decoding candidate bit sequence based at least in part on the EDC value and an EDC portion of the decoding candidate bit sequence.

Some examples of the method, apparatus, and non-transitory computer-readable medium described above may further include processes, features, means, or instructions for descrambling the EDC portion of the decoding candidate bit sequence with a mask, wherein the decoding output state may be based at least in part on the descrambled EDC portion. In some examples of the method, apparatus, and non-transitory computer-readable medium described above, the decoding output state may be based at least in part on a comparison of the EDC value and the EDC portion of the decoding candidate bit sequence. In some examples of the method, apparatus, and non-transitory computer-readable medium described above, the EDC value corresponds to a subset of the payload portion, and wherein the decoding output state indicates to terminate decoding of the payload portion prior to decoding at least a last bit of the payload portion.

Some examples of the method, apparatus, and non-transitory computer-readable medium described above may further include processes, features, means, or instructions for extracting a second EDC portion from the decoding candidate bit sequence. Some examples of the method, apparatus, and non-transitory computer-readable medium described above may further include processes, features, means, or instructions for calculating a second EDC value based at least in part on the payload portion of the decoding candidate bit sequence, wherein the decoding output state may be based at least in part on a comparison of the second EDC portion and the second EDC value. In some examples of the method, apparatus, and non-transitory computer-readable medium described above, the EDC portion of the decoding candidate bit sequence may be separated by one or more bits from the second EDC portion of the decoding candidate bit sequence.

In some examples of the method, apparatus, and non-transitory computer-readable medium described above, the variable state may be initialized based at least in part on an identifier of the UE. In some examples of the method, apparatus, and non-transitory computer-readable medium described above, the variable state may be initialized to include a plurality of bits each having a value set to one. In some examples of the method, apparatus, and non-transitory computer-readable medium described above, the payload portion of the decoding candidate bit sequence may include information bits and/or a plurality of EDC bits. In some cases, each frozen bit of a plurality of frozen bits used to generate the polar-encoded codeword may have a value set to zero and each bit of a plurality of bits of the initialized variable state may have a value set to one. In some examples of the method, apparatus, and non-transitory computer-readable medium described above, the decoding output state comprises a decoding error or decoded control information extracted from the decoding candidate bit sequence.

A method of wireless communication is described. The method may include monitoring a signal for a polar-encoded codeword having a codeword size, determining a decoding candidate bit sequence based at least in part on the signal, wherein the decoding candidate bit sequence is associated with a decoding hypothesis for control information having a particular bit length of a plurality of different bit lengths for the codeword size, calculating an EDC value for a payload portion of the decoding candidate bit sequence using an EDC algorithm, wherein the calculating comprises performing bit-reversal on bits of the payload portion, and determining a decoding output state for the payload portion of the decoding candidate bit sequence based at least in part on the EDC value and an EDC portion of the decoding candidate bit sequence.

An apparatus for wireless communication is described. The apparatus may include means for monitoring a signal for a polar-encoded codeword having a codeword size, means for determining a decoding candidate bit sequence based at least in part on the signal, wherein the decoding candidate bit sequence is associated with a decoding hypothesis for control information having a particular bit length of a plurality of different bit lengths for the codeword size, means for calculating an EDC value for a payload portion of the decoding candidate bit sequence using an EDC algorithm, wherein the calculating comprises performing bit-reversal on bits of the payload portion, and means for determining a decoding output state for the payload portion of the decoding candidate bit sequence based at least in part on the EDC value and an EDC portion of the decoding candidate bit sequence.

Another apparatus for wireless communication is described. The apparatus may include a processor, memory in electronic communication with the processor, and instructions stored in the memory. The instructions may be operable to cause the processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, calculate an EDC value for a payload portion of the decoding candidate bit sequence using an EDC algorithm, wherein the calculating comprises performing bit-reversal on bits of the payload portion, and determine a decoding output state for the payload portion of the decoding candidate bit sequence based at least in part on the EDC value and an EDC portion of the decoding candidate bit sequence.

A non-transitory computer readable medium for wireless communication is described. The non-transitory computer-readable medium may include instructions operable to cause a processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, calculate an EDC value for a payload portion of the decoding candidate bit sequence using an EDC algorithm, wherein the calculating comprises performing bit-reversal on bits of the payload portion, and determine a decoding output state for the payload portion of the decoding candidate bit sequence based at least in part on the EDC value and an EDC portion of the decoding candidate bit sequence.

In some examples of the method, apparatus, and non-transitory computer-readable medium described above, a length of the payload portion of the decoding candidate bit sequence corresponds to one of the plurality of different bit lengths. In some examples of the method, apparatus, and non-transitory computer-readable medium described above, the decoding output state comprises a decoding error or decoded control information extracted from the decoding candidate bit sequence. In some examples of the method, apparatus, and non-transitory computer-readable medium described above, the decoding output state may be based at least in part on a comparison of the EDC value and the EDC portion of the decoding candidate bit sequence.

A method of wireless communication is described. The method may include monitoring a signal for a polar-encoded codeword having a codeword size, modifying the polar-encoded codeword to generate a modified polar-encoded codeword based at least in part on a decoding hypothesis for control information having a particular bit length of a plurality of different bit lengths for the codeword size, wherein the modifying comprises descrambling, deinterleaving, or both, the polar-encoded codeword based at least in part on the particular bit length, determining a decoding candidate bit sequence based at least in part on the modified polar-encoded codeword and the decoding hypothesis, calculating an EDC value for a payload portion of the decoding candidate bit sequence using an EDC algorithm, and determining a decoding output state for the payload portion of the decoding candidate bit sequence based at least in part on the EDC value and an EDC portion of the decoding candidate bit sequence.

An apparatus for wireless communication is described. The apparatus may include means for monitoring a signal for a polar-encoded codeword having a codeword size, means for modifying the polar-encoded codeword to generate a modified polar-encoded codeword based at least in part on a decoding hypothesis for control information having a particular bit length of a plurality of different bit lengths for the codeword size, wherein the modifying comprises descrambling, deinterleaving, or both, the polar-encoded codeword based at least in part on the particular bit length, means for determining a decoding candidate bit sequence based at least in part on the modified polar-encoded codeword and the decoding hypothesis, means for calculating an EDC value for a payload portion of the decoding candidate bit sequence using an EDC algorithm, and means for determining a decoding output state for the payload portion of the decoding candidate bit sequence based at least in part on the EDC value and an EDC portion of the decoding candidate bit sequence.

Another apparatus for wireless communication is described. The apparatus may include a processor, memory in electronic communication with the processor, and instructions stored in the memory. The instructions may be operable to cause the processor to monitor a signal for a polar-encoded codeword having a codeword size, modify the polar-encoded codeword to generate a modified polar-encoded codeword based at least in part on a decoding hypothesis for control information having a particular bit length of a plurality of different bit lengths for the codeword size, wherein the modifying comprises descrambling, deinterleaving, or both, the polar-encoded codeword based at least in part on the particular bit length, determine a decoding candidate bit sequence based at least in part on the modified polar-encoded codeword and the decoding hypothesis, calculate an EDC value for a payload portion of the decoding candidate bit sequence using an EDC algorithm, and determine a decoding output state for the payload portion of the decoding candidate bit sequence based at least in part on the EDC value and an EDC portion of the decoding candidate bit sequence.

A non-transitory computer readable medium for wireless communication is described. The non-transitory computer-readable medium may include instructions operable to cause a processor to monitor a signal for a polar-encoded codeword having a codeword size, modify the polar-encoded codeword to generate a modified polar-encoded codeword based at least in part on a decoding hypothesis for control information having a particular bit length of a plurality of different bit lengths for the codeword size, wherein the modifying comprises descrambling, deinterleaving, or both, the polar-encoded codeword based at least in part on the particular bit length, determine a decoding candidate bit sequence based at least in part on the modified polar-encoded codeword and the decoding hypothesis, calculate an EDC value for a payload portion of the decoding candidate bit sequence using an EDC algorithm, and determine a decoding output state for the payload portion of the decoding candidate bit sequence based at least in part on the EDC value and an EDC portion of the decoding candidate bit sequence.

In some examples of the method, apparatus, and non-transitory computer-readable medium described above, the decoding output state may be based at least in part on a comparison of the EDC value and the EDC portion of the decoding candidate bit sequence. In some examples of the method, apparatus, and non-transitory computer-readable medium described above, the decoding output state comprises a decoding error or decoded control information extracted from the decoding candidate bit sequence.

A method of wireless communication is described. The method may include monitoring a signal for a polar-encoded codeword having a codeword size, determining a decoding candidate bit sequence based at least in part on the signal, wherein the decoding candidate bit sequence is associated with a decoding hypothesis for control information having a particular bit length of a plurality of different bit lengths for the codeword size, descrambling a payload portion of the decoding candidate bit sequence, calculating an EDC value for the descrambled payload portion using an EDC algorithm, and determining a decoding output state for the descrambled payload portion based at least in part on the EDC value and an EDC portion of the decoding candidate bit sequence.

An apparatus for wireless communication is described. The apparatus may include means for monitoring a signal for a polar-encoded codeword having a codeword size, means for determining a decoding candidate bit sequence based at least in part on the signal, wherein the decoding candidate bit sequence is associated with a decoding hypothesis for control information having a particular bit length of a plurality of different bit lengths for the codeword size, means for descrambling a payload portion of the decoding candidate bit sequence, means for calculating an EDC value for the descrambled payload portion using an EDC algorithm, and means for determining a decoding output state for the descrambled payload portion based at least in part on the EDC value and an EDC portion of the decoding candidate bit sequence.

Another apparatus for wireless communication is described. The apparatus may include a processor, memory in electronic communication with the processor, and instructions stored in the memory. The instructions may be operable to cause the processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, descramble a payload portion of the decoding candidate bit sequence, calculate an EDC value for the descrambled payload portion using an EDC algorithm, and determine a decoding output state for the descrambled payload portion based at least in part on the EDC value and an EDC portion of the decoding candidate bit sequence.

A non-transitory computer readable medium for wireless communication is described. The non-transitory computer-readable medium may include instructions operable to cause a processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, descramble a payload portion of the decoding candidate bit sequence, calculate an EDC value for the descrambled payload portion using an EDC algorithm, and determine a decoding output state for the descrambled payload portion based at least in part on the EDC value and an EDC portion of the decoding candidate bit sequence.

In some examples of the method, apparatus, and non-transitory computer-readable medium described above, the decoding output state may be based at least in part on a comparison of the EDC value and the EDC portion of the decoding candidate bit sequence. In some examples of the method, apparatus, and non-transitory computer-readable medium described above, the decoding output state comprises a decoding error or decoded control information extracted from the decoding candidate bit sequence. In some examples of the method, apparatus, and non-transitory computer-readable medium described above, the descrambled payload portion of the decoding candidate bit sequence comprises frozen bits, information bits, or both.

A method of wireless communication is described. The method may include monitoring a signal for a polar-encoded codeword having a codeword size, determining a decoding candidate bit sequence based at least in part on the signal, wherein the decoding candidate bit sequence is associated with a decoding hypothesis for control information having a particular bit length of a plurality of different bit lengths for the codeword size, extracting a masked EDC portion of the decoding candidate bit sequence and descrambling the masked EDC portion with a mask to generate a processed EDC value, applying an EDC algorithm to a subset of a payload portion of the decoding candidate bit sequence to generate a calculated EDC value, and generating an early termination decision based at least in part on the processed EDC value and the calculated EDC value.

An apparatus for wireless communication is described. The apparatus may include means for monitoring a signal for a polar-encoded codeword having a codeword size, means for determining a decoding candidate bit sequence based at least in part on the signal, wherein the decoding candidate bit sequence is associated with a decoding hypothesis for control information having a particular bit length of a plurality of different bit lengths for the codeword size, means for extracting a masked EDC portion of the decoding candidate bit sequence and descrambling the masked EDC portion with a mask to generate a processed EDC value, means for applying an EDC algorithm to a subset of a payload portion of the decoding candidate bit sequence to generate a calculated EDC value, and means for generating an early termination decision based at least in part on the processed EDC value and the calculated EDC value.

Another apparatus for wireless communication is described. The apparatus may include a processor, memory in electronic communication with the processor, and instructions stored in the memory. The instructions may be operable to cause the processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, extract a masked EDC portion of the decoding candidate bit sequence and descrambling the masked EDC portion with a mask to generate a processed EDC value, apply an EDC algorithm to a subset of a payload portion of the decoding candidate bit sequence to generate a calculated EDC value, and generate an early termination decision based at least in part on the processed EDC value and the calculated EDC value.

A non-transitory computer readable medium for wireless communication is described. The non-transitory computer-readable medium may include instructions operable to cause a processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, extract a masked EDC portion of the decoding candidate bit sequence and descrambling the masked EDC portion with a mask to generate a processed EDC value, apply an EDC algorithm to a subset of a payload portion of the decoding candidate bit sequence to generate a calculated EDC value, and generate an early termination decision based at least in part on the processed EDC value and the calculated EDC value.

In some examples of the method, apparatus, and non-transitory computer-readable medium described above, the early termination decision may be to terminate decoding of the payload portion prior to decoding at least a last bit of the payload portion. In some examples of the method, apparatus, and non-transitory computer-readable medium described above, the early termination decision may be to continue decoding of the decoding candidate bit sequence.

Some examples of the method, apparatus, and non-transitory computer-readable medium described above may further include processes, features, means, or instructions for extracting a second EDC portion from the decoding candidate bit sequence. Some examples of the method, apparatus, and non-transitory computer-readable medium described above may further include processes, features, means, or instructions for applying an EDC algorithm to the payload portion to calculate a second EDC value. Some examples of the method, apparatus, and non-transitory computer-readable medium described above may further include processes, features, means, or instructions for determining a decoding output state for the payload portion of the decoding candidate bit sequence based at least in part on the second EDC portion and the second EDC value.

In some examples of the method, apparatus, and non-transitory computer-readable medium described above, the decoding output state comprises a decoding error or decoded control information extracted from the decoding candidate bit sequence.

A method of wireless communication is described. The method may include monitoring a signal for a polar-encoded codeword having a codeword size, determining a decoding candidate bit sequence based at least in part on the signal, wherein the decoding candidate bit sequence is associated with a decoding hypothesis for control information having a particular bit length of a plurality of different bit lengths for the codeword size, extracting an EDC portion and a bit set from a payload portion of the decoding candidate bit sequence, the bit set generated by an EDC algorithm, determining a correlation state between the EDC portion and the bit set, and generating an early termination decision based at least in part on the correlation state.

An apparatus for wireless communication is described. The apparatus may include means for monitoring a signal for a polar-encoded codeword having a codeword size, means for determining a decoding candidate bit sequence based at least in part on the signal, wherein the decoding candidate bit sequence is associated with a decoding hypothesis for control information having a particular bit length of a plurality of different bit lengths for the codeword size, means for extracting an EDC portion and a bit set from a payload portion of the decoding candidate bit sequence, the bit set generated by an EDC algorithm, means for determining a correlation state between the EDC portion and the bit set, and means for generating an early termination decision based at least in part on the correlation state.

Another apparatus for wireless communication is described. The apparatus may include a processor, memory in electronic communication with the processor, and instructions stored in the memory. The instructions may be operable to cause the processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, extract an EDC portion and a bit set from a payload portion of the decoding candidate bit sequence, the bit set generated by an EDC algorithm, determine a correlation state between the EDC portion and the bit set, and generate an early termination decision based at least in part on the correlation state.

A non-transitory computer readable medium for wireless communication is described. The non-transitory computer-readable medium may include instructions operable to cause a processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, extract an EDC portion and a bit set from a payload portion of the decoding candidate bit sequence, the bit set generated by an EDC algorithm, determine a correlation state between the EDC portion and the bit set, and generate an early termination decision based at least in part on the correlation state.

In some examples of the method, apparatus, and non-transitory computer-readable medium described above, the early termination decision may be to terminate decoding of the payload portion prior to decoding at least a last bit of the payload portion. In some examples of the method, apparatus, and non-transitory computer-readable medium described above, the early termination decision may be to continue decoding of the payload portion.

Some examples of the method, apparatus, and non-transitory computer-readable medium described above may further include processes, features, means, or instructions for extracting a second EDC portion of the decoding candidate bit sequence. Some examples of the method, apparatus, and non-transitory computer-readable medium described above may further include processes, features, means, or instructions for applying an EDC algorithm to the payload portion of the decoding candidate bit sequence to generate a second EDC value. Some examples of the method, apparatus, and non-transitory computer-readable medium described above may further include processes, features, means, or instructions for determining a decoding output state for the payload portion of the decoding candidate bit sequence based at least in part on the second EDC value and the second EDC portion of the decoding candidate bit sequence.

In some examples of the method, apparatus, and non-transitory computer-readable medium described above, applying the EDC algorithm comprises initializing a variable state for the EDC algorithm with at least one non-zero bit value. In some examples of the method, apparatus, and non-transitory computer-readable medium described above, applying the EDC algorithm comprises scrambling a defined number of bits output by the EDC algorithm with a mask to generate the second EDC value. In some examples of the method, apparatus, and non-transitory computer-readable medium described above, the decoding output state comprises a decoding error or decoded control information extracted from the decoding candidate bit sequence.

In some examples of the method, apparatus, and non-transitory computer-readable medium described above, extracting the EDC portion from the decoding candidate bit sequence comprises extracting a defined number of bits from the decoding candidate bit sequence corresponding to a candidate location for the EDC portion within the decoding candidate bit sequence. In some examples of the method, apparatus, and non-transitory computer-readable medium described above, the candidate location may be at a beginning of a decoding order of the payload portion or intermediate to the decoding order.

A method of wireless communication is described. The method may include monitoring a signal for a polar-encoded codeword having a codeword size, determining a decoding candidate bit sequence based at least in part on the signal, wherein the decoding candidate bit sequence is associated with a decoding hypothesis for control information having a particular bit length of a plurality of different bit lengths for the codeword size, determining that a payload portion of the decoding candidate bit sequence comprises a demarcation bit located at a beginning of a decoding order of the payload portion, calculating an EDC value for the payload portion using an EDC algorithm, and determining a decoding output state for the payload portion of the decoding candidate bit sequence based at least in part on the EDC value and an EDC portion of the decoding candidate bit sequence.

An apparatus for wireless communication is described. The apparatus may include means for monitoring a signal for a polar-encoded codeword having a codeword size, means for determining a decoding candidate bit sequence based at least in part on the signal, wherein the decoding candidate bit sequence is associated with a decoding hypothesis for control information having a particular bit length of a plurality of different bit lengths for the codeword size, means for determining that a payload portion of the decoding candidate bit sequence comprises a demarcation bit located at a beginning of a decoding order of the payload portion, means for calculating an EDC value for the payload portion using an EDC algorithm, and means for determining a decoding output state for the payload portion of the decoding candidate bit sequence based at least in part on the EDC value and an EDC portion of the decoding candidate bit sequence.

Another apparatus for wireless communication is described. The apparatus may include a processor, memory in electronic communication with the processor, and instructions stored in the memory. The instructions may be operable to cause the processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, determine that a payload portion of the decoding candidate bit sequence comprises a demarcation bit located at a beginning of a decoding order of the payload portion, calculate an EDC value for the payload portion using an EDC algorithm, and determine a decoding output state for the payload portion of the decoding candidate bit sequence based at least in part on the EDC value and an EDC portion of the decoding candidate bit sequence.

A non-transitory computer readable medium for wireless communication is described. The non-transitory computer-readable medium may include instructions operable to cause a processor to monitor a signal for a polar-encoded codeword having a codeword size, determine a decoding candidate bit sequence based at least in part on the signal, wherein the decoding candidate bit sequence is associated with a decoding hypothesis for control information having a particular bit length of a plurality of different bit lengths for the codeword size, determine that a payload portion of the decoding candidate bit sequence comprises a demarcation bit located at a beginning of a decoding order of the payload portion, calculate an EDC value for the payload portion using an EDC algorithm, and determine a decoding output state for the payload portion of the decoding candidate bit sequence based at least in part on the EDC value and an EDC portion of the decoding candidate bit sequence.

In some examples of the method, apparatus, and non-transitory computer-readable medium described above, the decoding output state may be based at least in part on a comparison of the EDC value and the EDC portion of the decoding candidate bit sequence. In some examples of the method, apparatus, and non-transitory computer-readable medium described above, the decoding output state comprises a decoding error or decoded control information extracted from the decoding candidate bit sequence.

A method of wireless communication is described. The method may include monitoring a signal for a polar-encoded codeword having a codeword size, determining a decoding candidate bit sequence based at least in part on the signal, wherein the determining identifies that a frozen bit portion of the decoding candidate bit sequence is masked with an identifier of the UE, and wherein the decoding candidate bit sequence is associated with a decoding hypothesis for control information having a particular bit length of a plurality of different bit lengths for the codeword size, calculating an EDC value for a payload portion using an EDC algorithm, and determining a decoding output state for the payload portion of the decoding candidate bit sequence based at least in part on the EDC value and an EDC portion of the decoding candidate bit sequence.

An apparatus for wireless communication is described. The apparatus may include means for monitoring a signal for a polar-encoded codeword having a codeword size, means for determining a decoding candidate bit sequence based at least in part on the signal, wherein the determining identifies that a frozen bit portion of the decoding candidate bit sequence is masked with an identifier of the UE, and wherein the decoding candidate bit sequence is associated with a decoding hypothesis for control information having a particular bit length of a plurality of different bit lengths for the codeword size, means for calculating an EDC value for a payload portion using an EDC algorithm, and means for determining a decoding output state for the payload portion of the decoding candidate bit sequence based at least in part on the EDC value and an EDC portion of the decoding candidate bit sequence.

Another apparatus for wireless communication is described. The apparatus may include a processor, memory in electronic communication with the processor, and instructions stored in the memory. The instructions may be operable to cause the processor to monitor a signal for a polar-encoded codeword having a codeword size, determine a decoding candidate bit sequence based at least in part on the signal, wherein the determining identifies that a frozen bit portion of the decoding candidate bit sequence is masked with an identifier of the UE, and wherein the decoding candidate bit sequence is associated with a decoding hypothesis for control information having a particular bit length of a plurality of different bit lengths for the codeword size, calculate an EDC value for a payload portion using an EDC algorithm, and determine a decoding output state for the payload portion of the decoding candidate bit sequence based at least in part on the EDC value and an EDC portion of the decoding candidate bit sequence.

A non-transitory computer readable medium for wireless communication is described. The non-transitory computer-readable medium may include instructions operable to cause a processor to monitor a signal for a polar-encoded codeword having a codeword size, determine a decoding candidate bit sequence based at least in part on the signal, wherein the determining identifies that a frozen bit portion of the decoding candidate bit sequence is masked with an identifier of the UE, and wherein the decoding candidate bit sequence is associated with a decoding hypothesis for control information having a particular bit length of a plurality of different bit lengths for the codeword size, calculate an EDC value for a payload portion using an EDC algorithm, and determine a decoding output state for the payload portion of the decoding candidate bit sequence based at least in part on the EDC value and an EDC portion of the decoding candidate bit sequence.

In some examples of the method, apparatus, and non-transitory computer-readable medium described above, the decoding output state may be based at least in part on a comparison of the EDC value and the EDC portion of the decoding candidate bit sequence.

In some examples of the method, apparatus, and non-transitory computer-readable medium described above, the decoding output state comprises a decoding error or decoded control information extracted from the decoding candidate bit sequence.

DETAILED DESCRIPTION

Figure 1:
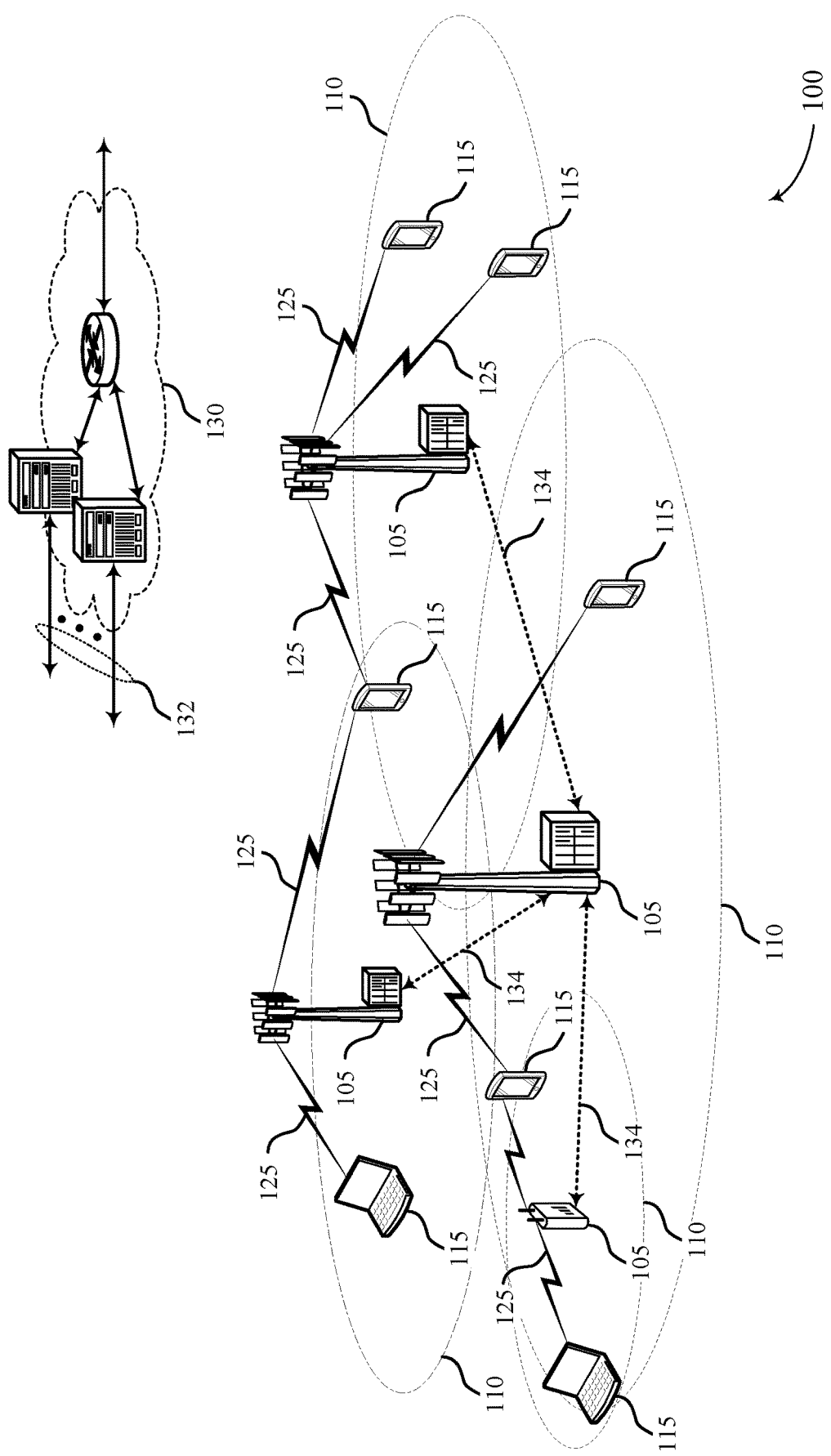
FIG. 1 illustrates an example of a system for wireless communication that supports size ambiguity reduction and false alarm rate reduction for polar codes in accordance with aspects of the present disclosure.

The described techniques relate to improved methods, systems, devices, or apparatuses that support size ambiguity reduction and false alarm rate reduction for polar codes. Generally, the described techniques provide for improving the ability of a receiver to determine which of multiple bit lengths a transmitter used to send a transmitted control information vector, improving decoder performance by supporting early termination decisions, and reducing a false alarm rate. A base station may transmit control information in a control channel that can be UE-specific (dedicated) or cell-specific (common). The control information may be transmitted in different dedicated and common search spaces within the control channel. Challenges arise in successfully detecting control information intended for a particular UE, while maintaining a low false alarm rate.

In accordance with the examples described herein, a base station may generate a polar-encoded codeword that assists a UE in determining which bit length was used for the control information. In some examples, the base station may initialize a variable state for an error detection code (EDC) calculation algorithm to be a non-all-zero state. In some other examples, the base station may scramble bits prior to, or after, polar encoding. In some additional examples, the base station may interleave bits differently depending on which bit length is used. In further examples, the base station may bit reverse the information bits prior to generating a EDC value. In additional examples, the base station may polar encode a data block that includes multiple EDC values to assist the UE in making a decision on whether to early terminate decoding and to reduce a false alarm rate.

In some examples, a base station may transmit a physical downlink shared channel (PDCCH) that carries a downlink control information (DCI) message to a UE. The DCI message can be UE-specific (dedicated) or cell-specific (common) and placed in different dedicated and common search spaces within the PDCCH depending on a format of the DCI (e.g., format 1/2/3/4/5). A PDCCH can carry DCI messages associated with multiple UEs. Challenges arise in successfully detecting control information intended for a particular UE, while maintaining a low false alarm rate. In conventional systems, a UE is assigned one or more radio network identifiers (e.g., a cell radio network temporary identifier (C-RNTI)) that facilitate DCI detection. A UE attempts to decode the DCI by performing a process known as a blind decode, during which multiple decode attempts are carried out in the search spaces until the DCI is detected (e.g., when a CRC check masked by one of the radio network identifiers passes for the decoded DCI). The DCI may have one of a fixed number of different lengths, and the UE may attempt to decode the search space based on one or more of the different lengths.

In some examples, a base station may select one of multiple different bit lengths for control information, and a problem with conventional techniques is the UE may be unable to determine which bit length was used. In some cases, a UE may receive a signal that includes a polar-encoded codeword generated from the control information that has a particular bit length. However, the UE may decode the polar-encoded codeword to generate one or more decoded bit sequences according to a bit length hypothesis that is different than the bit length of the transmitted control information.

For example, the polar-encoded codeword may be generated according to a different control information format than the bit length of a decode hypothesis used for decoding the polar-encoded codeword. If a portion of the information vector (the portion that is different between the transmitted bit length and the decoding hypothesis bit length) generates a repeating cyclic redundancy check (CRC) state (e.g., all zeros), the UE may determine that the decoding hypothesis passes error detection. Thus, a false alarm may occur, causing the UE to parse the incorrect information. Alternatively or additionally, the UE may detect that multiple decoding hypotheses result in decoded bit sequences that pass error detection. In such scenarios, the UE is unable to determine the bit length of the control information that was actually transmitted by the base station.

In communication systems, the base station may generate a CRC as a function of the DCI that is included in the DCI message. The UE may use the included CRC to detect decoding errors in the received DCI. In many instances, a linear-feedback-shift-register is used to perform the CRC computation. The CRC computation starts with an initial state that is conventionally a sequence of zeros corresponding to an order P of a polynomial used to calculate the CRC value, where P is a positive integer (e.g., the linear-feedback-shift-registers is initially loaded with P zeros). When the base station has DCI to transmit to the UE, the base station may generate a CRC value for the DCI, may scramble the CRC value with a mask corresponding to the C-RNTI of the UE, and may transmit a DCI message that includes the scrambled CRC value and the DCI. The UE may descramble the CRC with its C-RNTI and calculate a CRC value from the received DCI. The UE may compare the calculated CRC to the descrambled CRC to determine whether a decoding error occurred (e.g., due to noise corruption by a wireless communication channel or an incorrect decoding hypothesis).

A problem with conventional techniques is that a same CRC value that passes CRC may be generated for DCIs having different lengths. In such a scenario, the UE is unable to determine which length DCI was actually transmitted by the base station. Thus, the CRC value scrambled with the radio network identifier may not protect against false alarms where DCI with a different size was transmitted.

To overcome at least these problems, a transmitter, such as a base station, may generate a polar-encoded codeword that assists the UE in determining which bit length was used for control information encoded in the codeword. In some examples, the base station may initialize a variable state for an error detection code (EDC) calculation algorithm to be a non-all-zero state, and apply the EDC calculation algorithm initialized with the variable state to information bits to generate one or more EDC values. In some examples, bits of one or more EDC values may be distributed throughout a data block that is to be polar encoded (e.g., separated by one or more information bits), and may be referred to herein as a distributed EDC (e.g., a distributed CRC). The data block may include frozen bits, the information bits, and the distributed EDC. In some cases, frozen bits of a polar code may each be set as zero and up to all bits in a bit sequence of the variable state may be set to one, and thus the EDC calculation algorithm may be initialized with a variable state that has at least one bit value that is different from the value associated with the frozen bits of the polar code.

In some other examples, the base station may scramble bits prior to, or after, polar encoding. In some additional examples, the base station may interleave bits differently depending on which bit length is used. In additional or alternative examples, the base station may bit reverse the information bits prior to generating an EDC value. The UE may perform inverse operations when decoding a received signal that includes a polar-encoded codeword. In additional examples, the base station may polar encode a data block that includes multiple EDC values to assist the UE in making a decision on whether to early terminate decoding and to reduce a false alarm rate.

Aspects of the disclosure are initially described in the context of a wireless communications system. The wireless communications system may improve the ability of a receiver to determine a bit length of a transmitted control information vector, decoder performance by supporting early termination decisions, and a false alarm rate. Aspects of the disclosure are further illustrated by and described with reference to apparatus diagrams, system diagrams, and flowcharts that relate to size ambiguity reduction and false alarm rate reduction for polar codes.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices.

A base station 105 may generate a polar-encoded codeword that assists a UE 115 in determining which bit length was used for control information encoded in the codeword. In some examples, the base station 105 may initialize a variable state for an EDC calculation algorithm to be a non-all-zero state. In some other examples, the base station 105 may scramble bits prior to, or after, polar encoding. In some additional examples, the base station 105 may interleave bits differently depending on which bit length is used. In further examples, the base station 105 may bit reverse the information bits prior to generating a EDC value. The UE 115 may perform inverse operations when decoding a received signal that includes a polar-encoded codeword. In additional examples, the base station 105 may polar encode a data block that includes multiple EDC values to assist the UE 115 in making a decision on whether to early terminate decoding and to reduce a false alarm rate.

A polar code is an example of a linear block error correcting code and has been shown to asymptotically approach the theoretical channel capacity as the code length increases. A polar code may be composed of multiple sub-channels having different levels of reliability. Sub-channel reliability may represent a capacity of the sub-channel to carry information as part of the encoded codeword. Sub-channels of a polar code having higher reliabilities are used to encode information bits and the remaining sub-channels are used to encode frozen bits. For N sub-channels, k information bits may be loaded into the k most reliable sub-channels and N−k frozen bits may be loaded into the N−k least reliable sub-channels, where k<N. A frozen bit is a bit having a known value to a decoder and is generally set as '0'. The value of a frozen bit, however, may be any value as long as the value of the frozen bit is known to the decoder.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, IP connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operates according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARQ) to provide retransmission at the MAC layer to improve link efficiency. In the control plane, the Radio Resource Control (RRC) protocol layer may provide establishment, configuration, and maintenance of an RRC connection between a UE 115 and a network device, base station 105, or core network 130 supporting radio bearers for user plane data. At the Physical (PHY) layer, transport channels may be mapped to physical channels.

Time intervals in LTE or NR may be expressed in multiples of a basic time unit (which may be a sampling period of $T_s = 1/30{,}720{,}000$ seconds). Time resources may be organized according to radio frames of length of 10 ms ($T_f = 307200 T_s$), which may be identified by a system frame number (SFN) ranging from 0 to 1023. Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some cases the subframe may be the smallest scheduling unit, also known as a TTI. In other cases, a TTI may be shorter than a subframe or may be dynamically selected (e.g., in short TTI bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each OFDM symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

Wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both FDD and TDD component carriers.

In some cases, wireless communications system 100 may utilize enhanced component carriers (eCCs). An eCC may be characterized by one or more features including wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some cases, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some cases, wireless communications system 100 may utilize both licensed and unlicensed radio frequency spectrum bands. For example, wireless communications system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

The described techniques improve the ability of a receiver to determine a bit length of a control information vector encoded into a codeword, decoder performance by supporting early termination decisions, and a false alarm rate.

Figure 2:
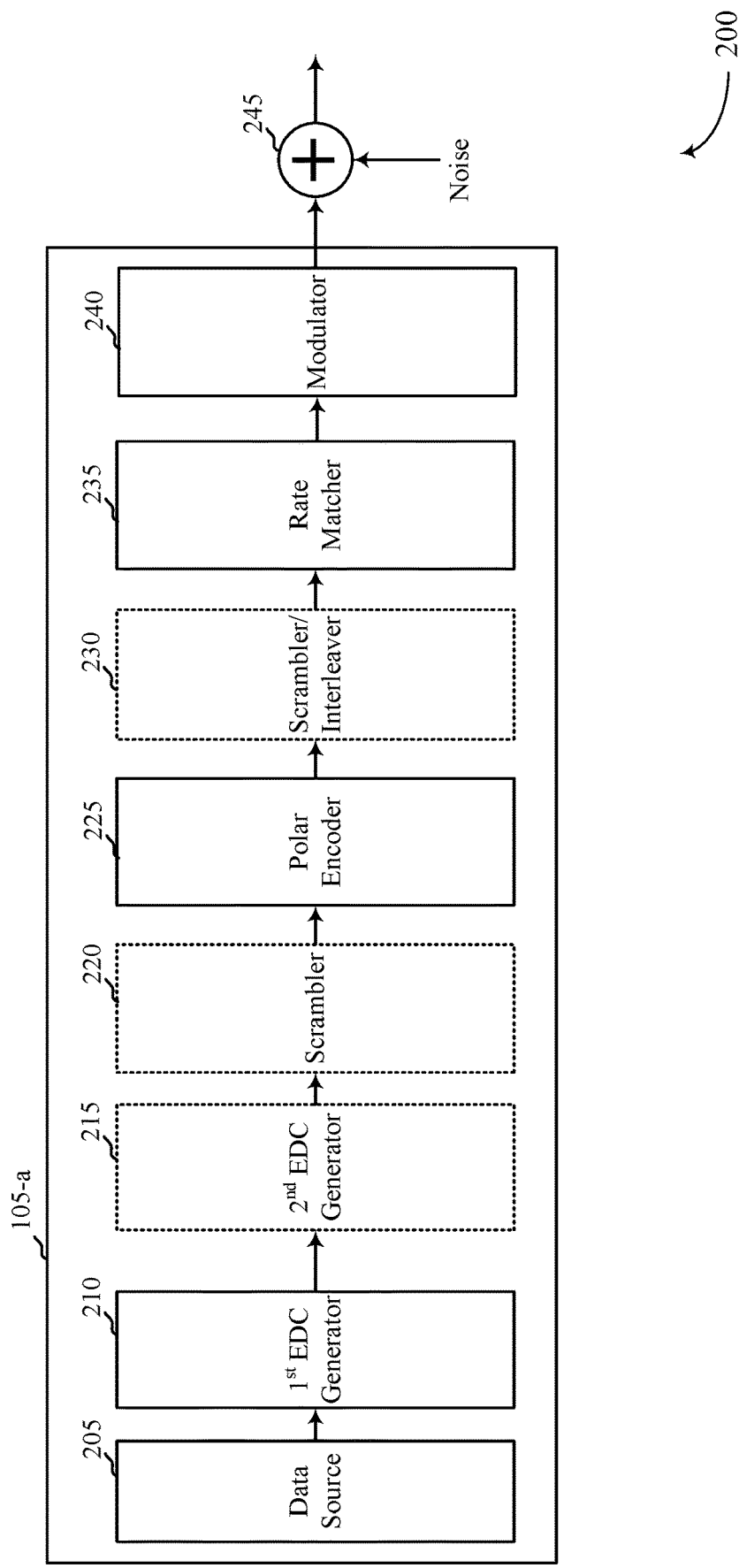
FIG. 2 illustrates an example diagram of a transmitter in a wireless communications system that supports size ambiguity reduction and false alarm rate reduction for polar codes in accordance with aspects of the present disclosure.

FIG. 2 illustrates an example diagram of a transmitter in a wireless communications system 200 that supports size ambiguity reduction and false alarm rate reduction for polar codes in accordance with various aspects of the present disclosure. In some examples, wireless communications system 200 may implement aspects of wireless communication system 100. Wireless communications system 200 may include a base station 105-*a* and a UE 115-*a* (depicted in FIG. 3). Base station 105-*a* is an example of base station 105 of FIG. 1, and user equipment 115-*a* is an example of user equipment 115 of FIG. 1.

Base station 105-*a* may generate control information and polar encode the control information into codewords that are transmitted to UE 115-*a*, to a different base station, or to other device, via a wireless communication channel 245. In other examples, user equipment 115-*a* may generate control information and polar encode the control information for transmission to base station 105-*a*, another UE, or other device, using these same techniques. Moreover, devices other than base station 105-*a* and user equipment 115-*a* may use the techniques described herein.

In the depicted example, base station 105-*a* may include a data source 205, a first EDC generator 210, a second EDC generator 215, a scrambler 220, a polar encoder 225, a scrambler/interleaver 230, a rate matcher 235, and a modulator 240. The data source 205 may provide control information (e.g., DCI) to be encoded and transmitted to the UE 115-*a*. The control information may be an information vector that includes a sequence of k information bits, where k is a positive integer. The data source 205 may be coupled to a network, a storage device, or the like. The data source 205 may output the control information vector to the first EDC generator 210.

The first EDC generator 210 may apply an error detecting algorithm to the information vector to generate an EDC value. The EDC value may be a sequence of one or more bits to enable the UE 115-*a* to detect an error in the information vector due to, for example, corruption caused by noise in a wireless communication channel 245. In some examples, a variable state for the error detecting algorithm used to calculate the EDC value may be initialized to a non-all-zero state. The error detection algorithm may be applied to bits of the control information to generate one or more EDC values. In an example, the error detecting algorithm (e.g., an EDC calculating algorithm) may be a CRC algorithm and the EDC value may be a CRC value. In some examples, bits of the EDC value may be distributed throughout a data block that is to be encoded with a polar code to generate a polar-encoded codeword, and may be referred to herein as a distributed EDC (e.g., a distributed CRC). The data block may include frozen bits, information bits, and bits of the one or more EDC values. In some cases, frozen bits of a polar code may each be set as '0' and up to all bits in a bit sequence of the initialized variable state may be set as '1', and thus the error detecting algorithm may be initialized with a variable state that has at least one bit value that is different from the value associated with the frozen bits of the polar code.

The length of the EDC value in bits may be selected to enable the UE 115-*a* to identify errors in a received message that includes the information vector and to suppress a false alarm rate. In some examples, the selected number of bits j of the EDC value may be based at least in part on a defined false alarm rate, a defined detection rate, or both, where j is a positive integer. The first EDC generator 210 may append the EDC value to the information vector to generate a first payload having k+j bits, where k+j is less than N. In another example, the EDC value may be one or more parity check bits that may be a function of one or more bits within the control information vector. In an example, a parity check bit may be added to string of binary bits to ensure that the total number of 1-bits in the string is even or odd. The first EDC generator 210 may generate the first payload by inserting one or more parity check bits at one or more locations within the control information vector. The transmitter and the receiver may know the bit locations of the EDC value and the receiver may process the EDC value to perform error detection. The first EDC generator 210 may output the first payload to a second EDC generator 215.

The second EDC generator 215 may generate a second EDC value as a function of the control information vector or the first payload (including the EDC value generated by the first EDC generator 210). The second EDC value may be a CRC value, one or more parity check bits, or the like. The second EDC generator 215 is shown in dashed lines as it is optional. The base station 105-*a* may also include more than two EDC generators that generate more than two EDC values. The second EDC generator 215 may generate a second payload by inserting the second EDC value at one or more locations within the control information vector. In an example, the second EDC value may include j' bits and the second payload may include k+j+j' bits, where k+j+j' is less than N. The transmitter and the receiver may know the bit locations of the second EDC value and the receiver may process the EDC value to perform error detection. The second EDC generator 215 may output the payload to a scrambler 220.

The scrambler 220 may add a frozen bit sequence to the second payload to generate a data block of length N, and the scrambler 220 may scramble some or all bits of the data block. As noted above, the length N may correspond to the number of sub-channels of the polar code, and the frozen bit sequence may be added to generate the data block of length N. The scrambler 220 may apply a mask to scramble one or more of the frozen bits, the k information bits, one or more of the EDC values, or any combination thereof. The mask may be, for example, an identifier of the UE 115-*a* (e.g., C-RNTI). The scrambler 220 is shown in dashed lines as it is optional. The scrambler 220 may output the data block of length N to the polar encoder 225.

The polar encoder 225 may polar encode the data block to generate a polar-encoded codeword. If the optional second EDC generator 215 and the optional scrambler 220 are not included, the polar encoder 225 may add a frozen bit sequence to the first payload or the second payload to generate the data block of length N for polar encoding. Each frozen bit in the frozen bit sequence may be set to a defined value, such as to zero. The polar encoder 225 may output the polar-encoded codeword of length N to a scrambler/interleaver 230 or to the rate matcher 235.

The scrambler/interleaver 230 may perform one or both of a scrambling or interleaving operation on the polar-encoded codeword. The scrambler/interleaver 230 may scramble the polar-encoded codeword with a mask to generate a scrambled polar-encoded codeword. The mask may be, for example, a function of the bit length of the control information vector, and may be unique or different to each different bit length. Instead of or in addition to scrambling the polar-encoded codeword, the scrambler/interleaver 230 may perform interleaving on the polar-encoded codeword. Interleaving may involve rearranging bits of the polar-encoded codeword. The interleaving technique may be, for example, a function of the bit length of the control information vector, and a unique or different interleaving technique may be applied to each different bit length. The scrambler/interleaver 230 may generate a modified polar-encoded codeword. The modified polar-encoded codeword may have a length N and may be the polar-encoded codeword after scrambling, interleaving, or both. The scrambler/interleaver 230 is shown in dashed lines as it is optional. The scrambler/interleaver 230 may output the modified polar-encoded codeword to the rate matcher 235.

The rate matcher 235 may perform rate matching on the polar-encoded codeword received from the polar encoder 225 or the modified polar-encoded codeword received from the scrambler/interleaver 230. Rate matching may involve selecting some of the coded bits of the codeword for transmission in a particular TTI. For example, the rate matcher 235 may puncture some of the N bits of the polar-encoded codeword or the modified polar-encoded codeword and output M of the N bits for transmission, where M is a positive integer that is less than N. In some cases, the rate matcher 235 may repeat one or more bits of the N bits of the polar-encoded codeword to generate and output M bits for transmission, where M is greater than N The rate matcher 235 may output a rate-matched polar-encoded codeword to the modulator 240. The modulator 240 may modulate the rate-matched polar-encoded codeword for transmission to the UE 115-a via wireless communication channel 245 which may distort the signal carrying the polar-encoded codeword with noise.

Figure 3:
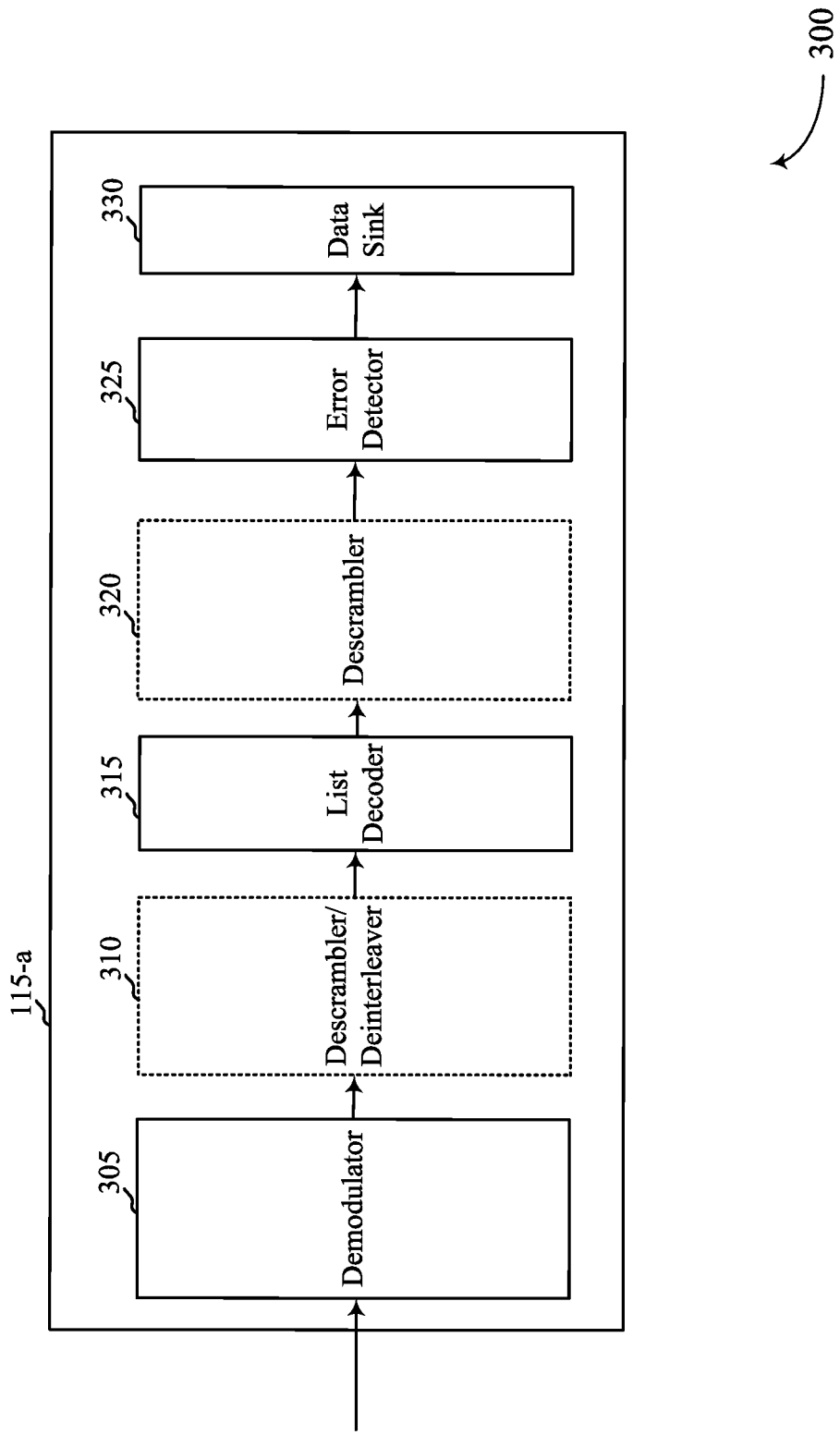
FIG. 3 illustrates an example diagram of a receiver in a wireless communications system that supports size ambiguity reduction and false alarm rate reduction for polar codes in accordance with aspects of the present disclosure.

FIG. 3 illustrates an example diagram 300 of a receiver in a wireless communications system that supports size ambiguity reduction and false alarm rate reduction for polar codes in accordance with various aspects of the present disclosure. In the depicted example, the receiver is UE 115-a, which is an example of a UE 115 of FIG. 1. The UE 115-a may receive a signal that includes a polar-encoded codeword. In an example, the UE 115-a may include a demodulator 305, a descrambler/deinterleaver 310, a list decoder 315, a descrambler 320, an error detector 325, and a data sink 330.

As the UE 115-a is unaware of the bit length of the control information vector in the polar-encoded codeword, the UE 115-a may process the received signal in accordance with multiple decoding hypotheses. A decoding hypothesis may be that the bit length of the control information vector is a particular length of the possible bit lengths. For example, if DCI may have one of five different bit lengths, the UE 115-a may have five different decoding hypotheses, one for each of the five different bit lengths. The UE 115-a may process the signal that includes the polar-encoded codeword to eliminate one or more of the decoding hypotheses. If all but a single bit sequence from a single decoding hypothesis can be eliminated, then the UE 115-a determines that it was able to successfully decode the signal that includes the polar-encoded codeword. If all of the hypothesis can be eliminated, or two or more hypotheses cannot be eliminated, then the UE 115-a declares a decoding error.

The demodulator 305 may receive a signal including the transmitted polar-encoded codeword and input the demodulated signal into the descrambler/deinterleaver 310. The demodulated signal(s) may be, for example, a sequence of logarithmic-likelihood ratio (LLR) values representing a probability value of a received bit being a '0' or a '1'. The descrambler/deinterleaver 310 may perform operations that are inverse to the operations performed by scrambler/interleaver 230. The descrambler/deinterleaver 310 may descramble, deinterleave, or both, the LLR values in accordance with each of the different decoding hypotheses. The descrambler/deinterleaver 310 is optional and may be omitted if the scrambler/interleaver 230 is not used by the base station 105-a. The descrambler/deinterleaver 310 may output descrambled, deinterleaved, or both, sets of LLR values to the list decoder 315 for each decoding hypothesis.

The list decoder 315 may perform a list decoding algorithm on each set of the LLR values (e.g., Successive Cancellation List (SCL) decoding CRC-aided SCL decoding, etc.) for each decoding hypothesis. In some cases, SCL decoding may be used for decoding the polar-encoded codeword. In SCL decoding, the decoder 315 may determine candidate paths through a code tree and, to limit computational complexity, keep only a list size L number of paths through the code tree at each decoding level. A candidate path may also be referred to herein as a decoding path. In an example, during decoding, a candidate path may be extended at each sub-channel of a code tree through hard decision values of '0' or '1.' Extending L candidate paths by one additional bit results in 2L possible paths. In SCL decoding, a decoder may calculate a path metric for each candidate path and select L paths of the 2L possible paths having the best path metrics. A path metric may be a sum of costs for transitioning from bit value to bit value along a candidate path. Adding a bit having a particular value to a candidate path may be associated with a cost representing a probability of the bit value being correct. Each candidate path may correspond to a bit sequence through the code tree and may be associated with a path metric for that bit sequence. The list decoder 315 may output a list size L of decoding candidate bit sequences and corresponding path metrics for each decoding hypothesis to a descrambler 320.

The descrambler 320 may perform operations that are inverse to the operations performed by the scrambler 220. For the list size L of bit sequences for each decoding hypothesis, the descrambler 320 may descramble each of the bit sequences using a mask. The mask may be, for example, an identifier of the UE 115-a (e.g., C-RNTI). The UE 115-a may be aware of the locations of the frozen bits, the k information bits, one or more of the EDC values, or any combination thereof, for each decoding hypothesis, and may descramble the frozen bits, the k information bits, one or more of the EDC values, or any combination thereof, to generate a list size L of descrambled bit sequences for each decoding hypothesis. The descrambler 320 is optional and may be omitted if the scrambler 220 is not used by the base station 105-a. The descrambler 320 may output to the error detector 325 the list size L of descrambled decoding candidate bit sequences for each decoding hypothesis. If the descrambler 320 is omitted, the list decoder 315 may output to the error detector 325 the list size L of decoding candidate bit sequences for each decoding hypothesis.

The error detector 325 may extract a payload portion of a decoding candidate bit sequence for a decoding hypothesis for generation of an EDC value. The payload portion may include the information bits and the EDC bits. The error detector 325 may extract one or more EDC values from the decoding candidate bit sequences, may calculate one or more EDC values from the decoding candidate bit sequences using the same EDC algorithms used by the first and second (or additional) EDC generators 210, 215, and determine whether the extracted one or more EDC values correspond to the calculated one or more EDC values (e.g., compare to determine if they match). In this example, the UE 115-a may be aware of the locations of each EDC value and of the information bits within the decoding candidate bit sequences for each decoding hypothesis. In some examples, the error detector 325 may determine whether any of the decoding candidate bit sequences pass error detection for any of the decoding hypotheses.

The error detector 325 may check the decoding candidate bit sequences in path metric order for each decoding hypothesis, with the decoding candidate bit sequence having the best path metric checked first, followed by the decoding candidate bit sequence having the next best path metric checked, and so forth. For a particular decoding hypothesis, the error detector 325 may stop when a decoding candidate bit sequence passes error detection, or when all decoding candidate bit sequences fail for that decoding hypothesis. If all but one decoding hypothesis can be eliminated, then the UE 115-a determines that it was able to successfully decode the signal that includes the polar-encoded codeword. The error detector 325 may extract the control information vector from the decoding candidate bit sequence for the decoding hypothesis that passed error detection. If all of the hypothesis are eliminated, or two or more hypotheses cannot be eliminated, then the UE 115-a declares a decoding error.

The error detector 325 may output a decoding output state. The decoding output state may identify a decoding error if some or all of the decoding candidate bit sequences for each decoding hypothesis fail. The decoding output state may include decoded control information extracted from a decoding candidate bit sequence that passes the EDC check. In an example, if successfully able to decode the polar-encoded codeword, the error detector 325 may output the control information (e.g., the DCI) extracted from the decoding candidate bit sequence that passed error detection to a data sink 330 for use, storage, communication to another device (e.g., transmission via a wired or wireless communication channel), communication via a network, or the like. As noted above, while the example of FIG. 2 describes the base station 105-a performing the encoding and the example of FIG. 3 describes the user equipment 115-a performing the decoding, the roles may be reversed. Moreover, devices other than the base station 105-a and the user equipment 115-a may perform the encoding and decoding.

Figure 4:
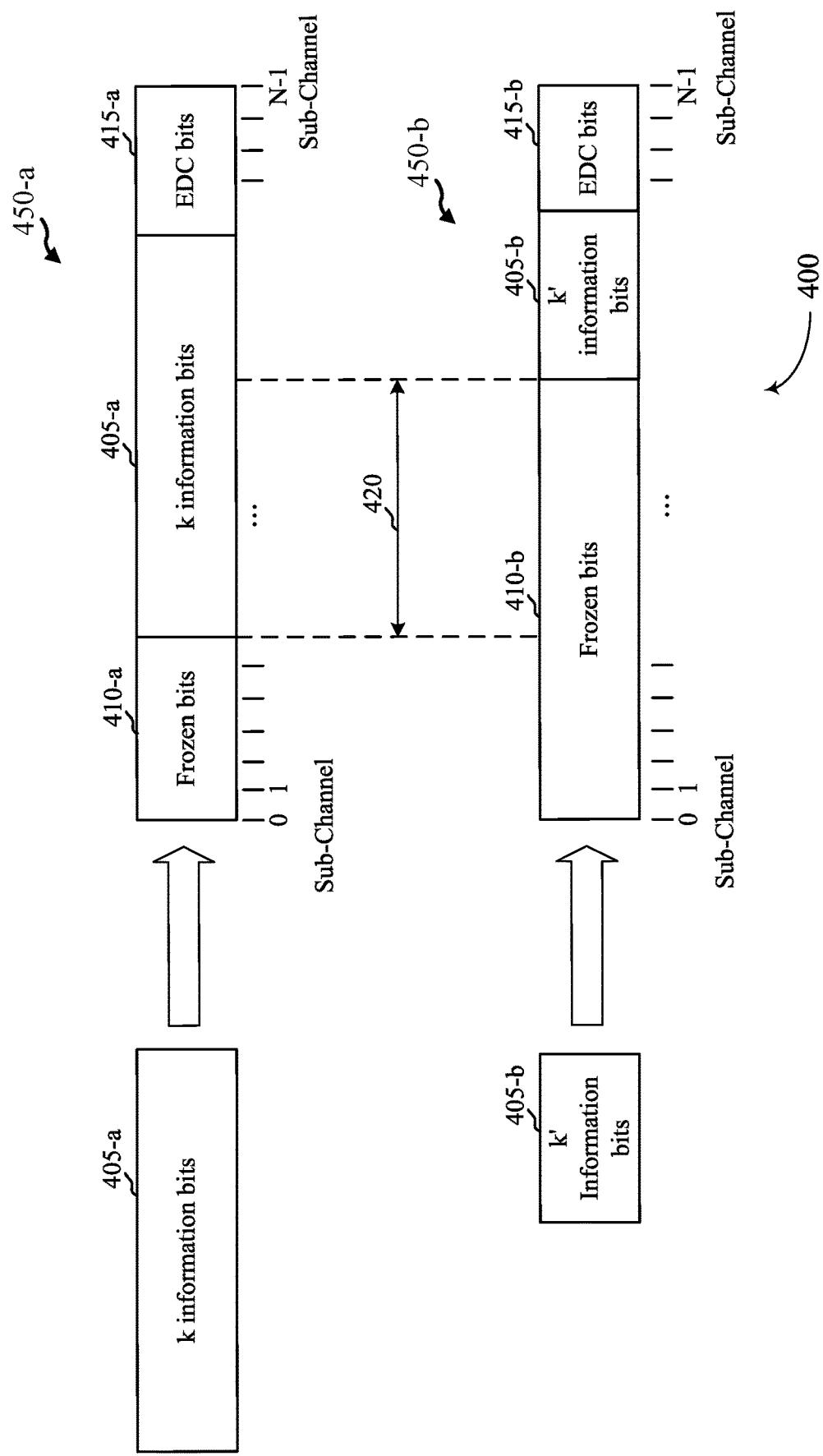
FIG. 4 illustrates an example diagram of data blocks that support size ambiguity reduction and false alarm rate reduction for polar codes in accordance with aspects of the present disclosure.

The techniques described herein reduce the possibility of having matching EDC values that prevent the UE 115-a from being unable to determine which length of control information vector was transmitted by the base station 105-a. FIG. 4 illustrates an example diagram 400 of data blocks that supports size ambiguity reduction and false alarm rate reduction for polar codes in accordance with various aspects of the present disclosure. In some examples, the base station 105-a may select a bit length for a control information vector from multiple different bit lengths. A first control information vector 405-a may include k information bits and a second control information vector 405-b may include k' information bits, where k'<k. In the depicted example, the control information vectors 405-a, 405-b, are shown on the left, and data blocks 450-a, 450-b of length N are shown on the right. The data blocks 450-a, 450-b are input to sub-channels 0 to N−1 of a polar code for polar encoding by the polar encoder 225. The hash marks underneath data blocks 450-a, 450-b represent bits to be loaded into respective sub-channels and may or might not be to scale. Data blocks 450-a, 450-b correspond to the base station 105-a of FIG. 2 including only the first EDC generator 210, but not the second EDC generator 215.

Data block 450-a may include a sequence of frozen bits 410-a, the k information bits of the control information vector 405-a, and the EDC bits 415-a of the EDC value generated by the first EDC generator 210 based on the k information bits. Data block 450-b may include a sequence of frozen bits 410-b, the k' information bits of the control information vector 405-b, and the EDC bits 415-b of the EDC value generated by the first EDC generator 210 based on the k' information bits.

In conventional systems, there are instances when the control information vector 405-a may include a subsequence of information bits having values that match the values of the frozen bits 410-b. For example, the subsequence of information bits 420 may include a bit sequence each having a bit value of zero, and the frozen bits 410-b may each be set to a bit value of zero. In such a scenario, the EDC bits 415-a of the data block 450-a and the EDC bits 415-b of data block 450-b may have the same value. Thus, the UE 115-a may be unable to determine whether the base station 105-a transmitted k information bits or k' information bits. In such a scenario, the UE 115-a may determine a decoding error or, in some instances, may incorrectly determine the bit length of the control information bit vector transmitted by the base station 105-a.

The following provides a number of different techniques used by the base station 105-a to generate the polar-encoded codeword to reduce the possibility of the UE 115-a being unable to determine which bit length of the control information bit vector that was transmitted by the base station 105-a. The examples may be used individually or in any combination.

In an example, the base station 105-a may initialize a variable state for an EDC algorithm used by the first EDC generator 210 (or other EDC generator) to generate an EDC value. In some examples, the EDC may be a CRC computation and a linear-feedback-shift-register may be used to perform the CRC computation. The CRC computation may begin with an initial state that, in conventional systems, is conventionally a sequence of zeros (e.g., an all-zero initial state) corresponding to an order P of a polynomial used to calculate the CRC value, where P is a positive integer (e.g., the linear-feedback-shift-registers is initially loaded with P zeros). Using the all-zero initial state for the CRC computation is problematic as it may result in the same CRC state (e.g., an all-zero CRC state) for an all-zero subsequence of information bits 420 and all-zero sequence of frozen bits 410.

To avoid this scenario, the base station 105-*a* may initialize a variable state for the EDC algorithm with a non-all-zero state. In an example, the variable state may be a sequence of bits at least one of which has a non-zero value. In some examples, the variable state may be a sequence of all ones, the sequence may include some or all of an identifier of the UE 115-*a* (e.g., C-RNTI), or the like. The first EDC generator 210 may generate an EDC value using the non-all-zero initial variable state, and hence have a non-all-zero EDC value. In some examples, the base station 105-*a* may apply the EDC algorithm initialized with the variable state to information bits of a control information vector to generate one or more EDC values. In some examples, bits of the EDC value(s) may be distributed throughout a data block that is to be polar encoded. In some cases, frozen bits of a polar code may each be set as zero and up to all bits in a bit sequence of the variable state may be set to one, and thus the EDC calculation algorithm may be initialized with a variable state that has at least one bit value that is different from the value associated with the frozen bits of the polar code. Beneficially, using the non-all-zero initial variable state for the EDC computation may result in first EDC generator 210 generating different EDC values for control information bit vectors having different bit lengths. Thus, EDC bits 415-*a* may be different than EDC bits 415-*a* due to control information vectors 405-*a*, 405-*b* having different lengths, even when the subsequence of information bits 420 and frozen bits 410 each are all-zero sequences of the same length.

The error detector 325 of the UE 115-*a* may use the same non-all-zero initial variable state for calculating an EDC value for error detection. To do so, the error detector 325 may calculate an EDC value using a payload portion of the decoding candidate bit sequence. In FIG. 4, for a decoding hypothesis of length k, the payload portion of a decoding candidate bit sequence may correspond to a location of the control information vector 405-*a* within the data block 450-*a*. For a decoding hypothesis of length k', the payload portion of a decoding candidate bit sequence may correspond to a location of the control information vector 405-*b* within the data block 450-*b*. Because the EDC algorithm is initialized with a non-all-zero initial variable state, the error detector 325 generates different EDC values due to the different bit lengths of the control information vectors 405-*a*, 405-*b*, and hence the error detector 325 may be able to distinguish between control information vectors 405-*a*, 405-*b* having different lengths.

In some cases, the first EDC generator 210 may generate an EDC value using the non-all-zero initial variable state, and may scramble the EDC value with a mask to generate a masked EDC value, where the mask may be an identifier of the UE 115-*a* (e.g., C-RNTI). The error detector 325 of the UE 115-*a* may be aware of which mask was used, and may descramble the masked EDC value using the same mask during error detection.

In another example, the base station 105-*a* may insert a demarcation bit at a beginning of the control information bit vector 405. The demarcation bit may be set to a bit value of one, to signify an end of the frozen bits 410 and a beginning of the control information bit vector 405. Because of the different bit lengths, the location of the demarcation bit within each of the data blocks 450 may vary, resulting in the first EDC generator 210 generating an EDC value that differs as a function of bit length of the control information bit vector 405. The error detector 325 may calculate an EDC value for a payload portion of a decoding candidate bit sequence using an EDC algorithm, where the payload portion corresponds to the location of the control information vector 405 within the data block 450 (e.g., control information vector 405-*a* within data block 450-*a*). The error detector 325 may output a decoding output state for the payload portion (e.g., decoding error, bits of control information vector 405).

In another example, the base station 105-*a* may perform bit reversal on the information bits for generating EDC values that can be used to distinguish between control information vectors 405-*a*, 405-*b* having different lengths. In an example, first EDC generator 210 may reverse the bit order of the information bits and then generate an EDC value using the bit-reversed information bits. For example, the first EDC generator 210 may process the information bits and determine that the information bits includes a subsequence 420 of all-zero bits that could result in the UE 115-*a* being unable to distinguish between whether k information bits or k' information bits was transmitted. The first EDC generator 210 may generate an EDC as a function of the bit-reversed information bits. Because of the bit-reversal, a first EDC value generated from k bit-reversed information bits may differ from a second EDC value generated from bit-reversed bit sequence that includes the k' information bits and the subsequence 420.

The error detector 325 of the UE 115-*a* may be aware the EDC bits 415 were calculated using bit-reversed information bits. The error detector 325 may extract an information bit portion from a decoding candidate bit sequence (e.g., corresponding to the location of control information vector 405-*a* within data block 450-*a*, corresponding to the location of control information vector 405-*b* within data block 450-*b*, etc.), perform bit-reversal on the bits of the information bit portion, calculate an EDC value using the bit-reversed bits of the information bit portion, and compare the calculated EDC value with bits from an EDC portion of the decoding candidate bit sequence. If the comparison results in a match (and no other bit sequences have matching calculated and extracted EDC values), the error detector 325 outputs a decoding output state that includes the bits of the information bit portion from the decoding candidate bit sequence as the control information bit vector 405. Otherwise, the error detector 325 outputs decoding output state that declares a decoding error.

In a further example, the base station 105-*a* may scramble, interleave, or both, the polar-encoded codeword with a different mask, interleaving technique, or both, that is a function of the bit length of the control information bit vector being transmitted. In an example, the scrambler/interleaver 230 of the base station 105-*a* may scramble the polar-encoded codeword with a mask to generate a scrambled polar-encoded codeword. The mask may be, for example, a function of the bit length of the control information vector. For example, each different bit length of a DCI may be assigned to a different mask, and a unique or different mask may be applied to each different bit length. The scrambler/interleaver 230 may select the mask associated with the bit length of the control information vector being encoded, and scramble the polar-encoded codeword with the selected mask to generate a modified polar-encoded codeword.

Instead of or in addition to scrambling the polar-encoded codeword, the scrambler/interleaver 230 may performing interleaving on the polar-encoded codeword. Interleaving may involve rearranging bits of the polar-encoded codeword. The interleaving technique may be, for example, a function of the bit length of the control information vector, and a unique or different interleaving technique may be applied to each different bit length. The scrambler/interleaver 230 may select the interleaving technique associated with the bit length of the control information vector being encoded, and apply the selected interleaving technique to the polar-encoded codeword to generate a modified polar-encoded codeword. The modified polar-encoded codeword have a length N and may be the polar-encoded codeword after scrambling, interleaving, or both.

Because the scrambling, interleaving, or both, are a function of the bit length of the control information bit vector being transmitted, and the UE 115-a may be aware of the relationship between bit length of the control information bit vector and scrambling/interleaving, the UE 115-a may use that known relationship to determine which bit length of the control information bit vector was transmitted. In an example, the descrambler/deinterleaver 310 may perform operations that are inverse to the operations performed by the scrambler/interleaver 230. The descrambler/deinterleaver 310 of the UE 115-a may descramble, deinterleave, or both, the LLR values in accordance with each of the different decoding hypotheses. For example, the descrambler/deinterleaver 310 may generate multiple descrambled sets of LLR values using the different masks, where each descrambled set of LLR values corresponds to a particular one of the masks and a corresponding decoding hypothesis.

In another example, the descrambler/deinterleaver 310 may generate multiple deinterleaved sets of LLR values based on the different interleaving techniques and corresponding decoding hypotheses, where each deinterleaved set of LLR values corresponds to a particular one of the interleaving techniques. In some examples, the descrambler/deinterleaver 310 may perform both descrambling and deinterleaving.

The error detector 325 may receive one or more descrambled/deinterleaved decoding candidate bit sequences, for one or more decoding hypothesis, that are a function of the descrambling, deinterleaving, or both, performed by the descrambler/deinterleaver 310. The error detector 325 may extract one or more EDC values from a payload portion (e.g., information bit portion and/or EDC bit portion) of the or more descrambled/deinterleaved bit sequences, and calculate one or more EDC values from an information bit portion of the descrambled/deinterleaved bit sequences. If the descrambling, deinterleaving, or both, performed by the descrambler/deinterleaver 310 differs from the scrambling, interleaving, or both, performed by the scrambler/interleaver 230, then the error detector 325 may determine that the extracted one or more EDC values differ from the calculated one or more EDC values, thereby enabling the error detector 325 to distinguish between control information vectors having different bit lengths. Hence, the UE 115-a may discard descrambled/deinterleaved bit sequences and corresponding decoding hypotheses that do not descramble/deinterleave in a manner that is inverse to the scrambling/interleaving performed by the scrambler/interleaver 230 of base station 105-a.

In another example, the base station 105-a may scramble frozen bits, information bits, EDC bits, or any combination thereof, prior to polar encoding of a data block to permit the UE 115-a to distinguish between control information vectors having different bit lengths. The scrambler 220 of base station 105-a may apply a mask to scramble one or more of the frozen bits, the k information bits, one or more of the EDC values, or any combination thereof. The mask may be, for example, an identifier of the UE 115-a (e.g., C-RNTI). The scrambler 220 may output the data block of length N to the polar encoder 225 for polar encoding. In some examples, the scrambler 220 may perform different scrambling based on whether the information bits are UE-specific or common to a group of UEs. In an example, the scrambler 220 may scramble frozen bits, information bits, EDC bits, or any combination thereof, using a mask that is an identifier of the UE 115-a in a UE-specific information bits within a UE-specific search space of a control channel (e.g., PDCCH). For a common search space, the scrambler 220 may scramble frozen bits, information bits, EDC bits, or any combination thereof, using a mask that is an identifier of the UE 115-a or a different mask.

The descrambler 320 of UE 115-a may perform operations that are inverse to the operations performed by the scrambler 220. For the list size L of bit sequences for each decoding hypothesis, the descrambler 320 may descramble each of the bit sequences using a mask. The mask may be, for example, an identifier of the UE 115-a (e.g., C-RNTI). The UE 115-a may be aware of the locations of the frozen bits, the k information bits, one or more of the EDC values, or any combination thereof, for each decoding hypothesis. The list decoder 315 of the UE 115-a may extract a payload portion of a decoding candidate bit sequence that corresponds to locations of the frozen bits, the k information bits, one or more of the EDC values, or any combination thereof, within the data block. The descrambler 320 may descramble the frozen bits, the k information bits, one or more of the EDC values, or any combination thereof, to generate a list size L of descrambled bit sequences for each decoding hypothesis. If the descrambling performed by the descrambler 320 differs from the scrambling performed by the scrambler 220, then the error detector 325 may determine that the extracted one or more EDC values differ from one or more EDC values calculated from the descrambled bit sequences, thereby enabling the error detector 325 to distinguish between control information vectors having different bit lengths. Hence, the UE 115-a may discard descrambled bit sequences and corresponding decoding hypotheses that do not descramble in a manner that is inverse to the scrambling performed by the scrambler 220 of base station 105-a.

If only frozen bits are scrambled, then the error detector 325 may determine, for a particular decoding hypothesis, whether scrambling bits of a frozen bit portion of a decoding candidate bit sequence with a mask results in bit sequence having a bit length that matches expected values for the frozen bits. If a bit length of a decoding hypothesis is too long or too short, then masking the frozen bit portion of a decoding candidate bit sequence with a mask will result in a bit sequence that does not match expected values for the frozen bits, and hence that decoding hypothesis may be discarded.

Figure 5:
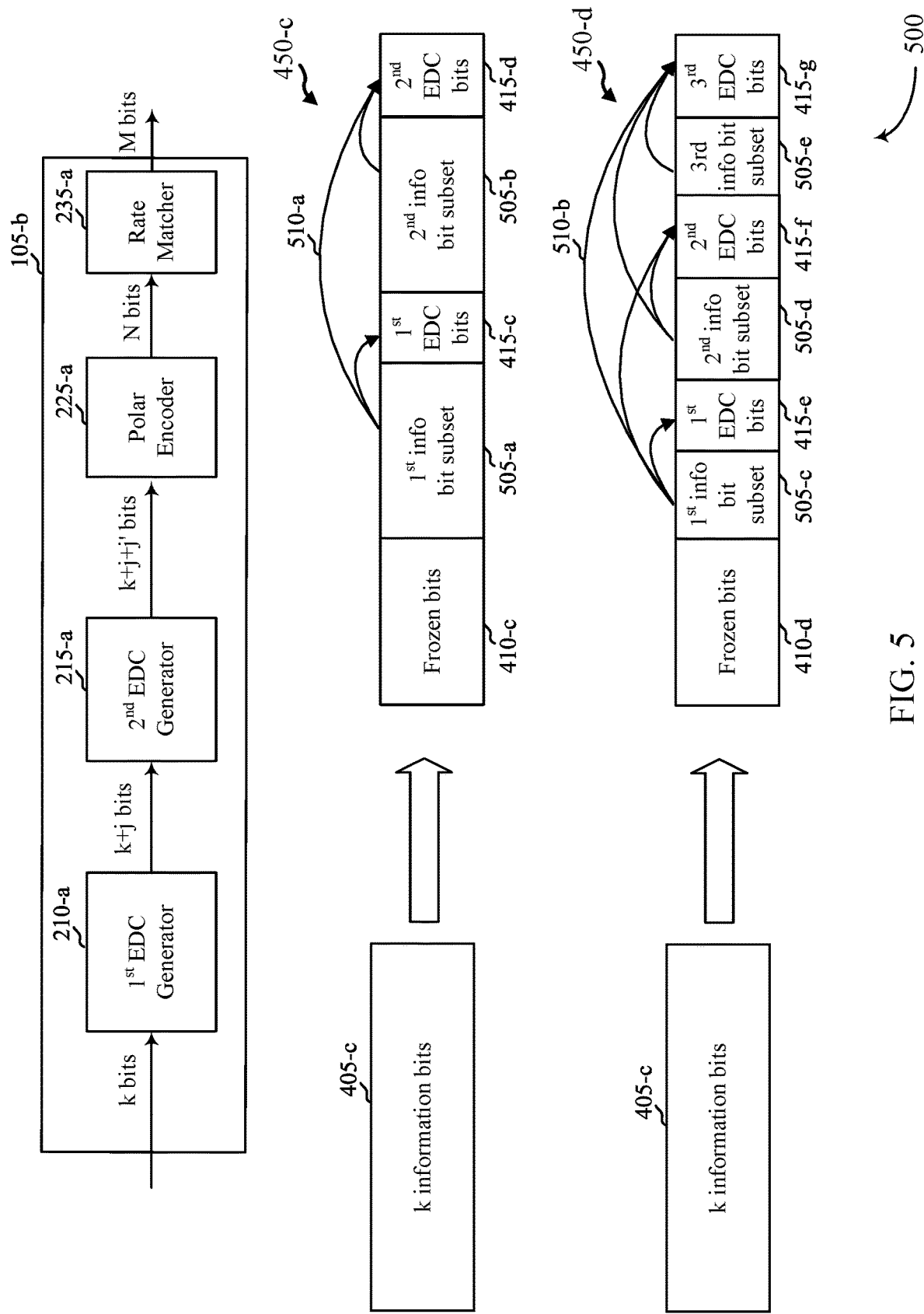
FIG. 5 illustrates an example diagram of data blocks including multiple error detection codes that support size ambiguity reduction and false alarm rate reduction for polar codes in accordance with aspects of the present disclosure.

The principles described herein may apply to data blocks that include two or more EDC values. The EDC values may be CRC values, parity check bits, or the like. FIG. 5 illustrates an example diagram 500 of data blocks to include multiple error detection codes that supports size ambiguity reduction and false alarm rate reduction for polar codes in accordance with various aspects of the present disclosure. Depicted is portions of a base station 105-b and examples of generating data blocks 450-c, 450-d from a control information bit vector 405-c. Base station 105-b is an example of base stations 105-a, 105 of FIGS. 1-4.

Base station 105-b may include a first EDC generator 210-a, a second EDC generator 215-a, a polar encoder 225-a, and a rate matcher 235-a. The first EDC generator 210-a may receive a control information bit vector 405-c that includes k information bits, may generate a j bit EDC value that is a function of a first subset of the k information bits, and output a first payload having k+j bits to the second EDC generator 215-a. The second EDC generator 215-a may generate a second EDC value that is a function of the first subset of the k information bits, or a second subset of the k information bits, or both.

In some examples, each of the first EDC generator 210-a and the second EDC generator 215-a may initialize a variable state for an EDC calculation algorithm to be a non-all-zero state, and apply the EDC calculation algorithm initialized with the variable state to information bits of the control information vector to generate one or more EDC values. The second EDC generator 215-a may output a second payload having k+j+j' bits to the polar encoder 225-a.

The polar encoder 225-a may add a frozen bit sequence that includes one or more frozen bits to the second payload to generate a data block 450 of length N. In some examples, bits of the one or more EDC values may be distributed throughout the data block 450 that is to be polar encoded. The data block may, for example, include frozen bits, the information bits, and the distributed EDC. In some cases, the frozen bits may each be set as '0' and up to all bits in a bit sequence of the initialized variable state may be set as '1', and thus the EDC calculation algorithm may be initialized with a variable state that has at least one bit value that is different from the value associated with the frozen bits of the polar code.

In the depicted example, data block 450-c includes frozen bits 410-c, first information bit subset 505-a, first EDC bits 415-c, second information bit subset 505-d, and second EDC bits 415-d. First EDC bits 415-c are not adjacent to, nor consecutive with, second EDC bits 415-d, and hence bits of the EDC are distributed in the data block 450-c. The first information bit subset 505-a may be a first subset of the k information bits of the control information bit vector 405-c, and the second information bit subset 505-b may be a different, second subset of the k information bits of the control information bit vector 405-c. The first EDC bits 415-c may include j bits of the first EDC value generated by the first EDC generator 210-a, and the second EDC bits 415-d may include j' bits of the second EDC value generated by the second EDC generator 215-a.

The arrows 510-a may represent that the EDC bits 415 are functions of selected portions of the data block 450-c. For example, a first arrow begins at the first information bit subset 505-a and ends at the first EDC bits 415-c, representing that the first EDC bits 415-c are a function of the first information bit subset 505-a. A second arrow begins at the first information bit subset 505-a and ends at the second EDC bits 415-d, and a third arrow begins at the second information bit subset 505-b and ends at the second EDC bits 415-d. The second and third arrows represent that the second EDC bits 415-d are a function of the first information bit subset 505-a and the second information bit subset 505-b.

In some examples, a data block 450 may include two or more EDC values. The data block 450-d includes more than two EDC values. The data block 450-d includes frozen bits 410-d, first information bit subset 505-c, first EDC bits 415-e, second information bit subset 505-d, second EDC bits 415-f, third information bit subset 505-e, and third EDC bits 415-g. Arrows 510-b are depicted relative to data block 450-b showing similar relationships between the EDC bits 415 and the information bit subsets 505.

Figure 6:
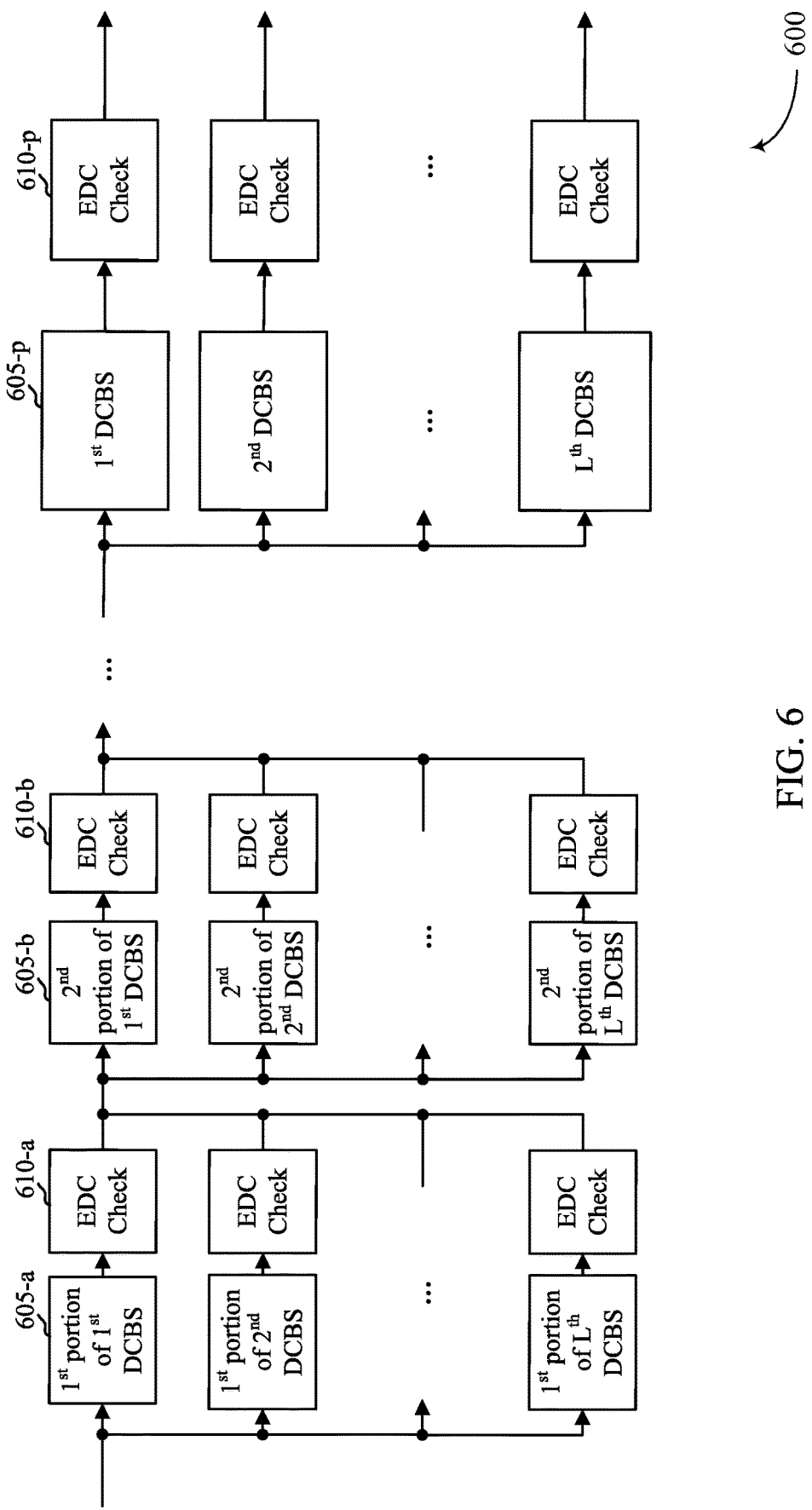
FIG. 6 illustrates an example diagram of a decoding and error detection flowchart that supports size ambiguity reduction and false alarm rate reduction for polar codes in accordance with aspects of the present disclosure.

The examples described herein may provide techniques for making early termination decisions for data blocks having multiple EDCs. An early termination decision may be where the list decoder 315 of the UE 115-a uses each of the EDC values to determine whether to stop or continue stop processing of a particular decoding candidate bit sequence. FIG. 6 illustrates an example decoding and error detection flowchart 600 that supports size ambiguity reduction and false alarm rate reduction for polar codes in accordance with various aspects of the present disclosure. The list decoder 315 and the error detector 325 may implement aspects of the decoding and error detection flowchart 600.

Rather than decoding a polar-encoded codeword to generate a list size number L of candidate paths corresponding to decoding candidate bit sequences (DCBSs) each of length N, the list decoder 315 may generate a portion of each DCBS and the error detector 325 may perform error detection on the DCBS portion to make an early termination decision. If a DCBS portion fails error detection, the error detector 325 may determine to terminate decoding of a particular candidate path (e.g., prune the candidate path).

Assuming that bits are not bit-reversed, the list decoder 315 generates a candidate path having a decoding candidate bit sequence in the same order as data blocks 450-a, 450-b of FIG. 5, and hence decoding of the data blocks 450-a, 450-b in FIG. 5 may occur in a decoding order proceeding from left to right. As reflects by arrows 510-a, 510-b, the EDC bits are a function of one or more information bits subsets 505 that occur earlier in the decoding order. As the UE 115-a knows the locations of the EDC bits within a decoding candidate bit sequence for each decoding hypothesis, the list decoder 315 may output portions of the DCBS to the error detector 325 for performing error detection. If bit-reversed, the UE 115-a may perform bit-reversal on one or more portions of a decoding candidate bit sequence and then output bit-reversed portions of the DCBS.

With reference to FIG. 6, the list decoder 315 may provide a first portion 605-a of DCBS for each of the L candidate paths for a decoding hypothesis. The error detector 325 may extract an information bit subset 505 and EDC bits 415 from an information bit portion and an EDC portion of each of the L DCBSs for performing error detection. In FIG. 5, for example, the first portion 605-a of DCBS may include first information bit subset 505-a and first EDC bits 415-c. The error detector 325 may extract the first portion of the DCBS that includes the information bit subset 505 and the EDC bits 415, and may perform an EDC check 610-a. To perform the EDC check 610-a, the error detector 325 may calculate an EDC value from the bits of the information bit subset 505. If an EDC value from the extracted EDC bits matches the calculated EDC value, the error detector 325 determines to continue decoding the corresponding candidate path. In another example, the EDC check 610-a may be a parity check. If the parity check passes, the error detector 325 determines to continue decoding the corresponding candidate path. The error detector 325 may perform the EDC check on the first portion of the L DCBSs, and may prune candidate paths that fail the EDC check. If all L DCBSs fail the parity check for a particular decoding hypothesis, then the error detector 325 may terminate decoding of that decoding hypothesis.

The list decoder 315 and the error detector 325 may continue this process each time one or more EDC bits are encountered within a DCBS for a particular decoding hypothesis. For example, the list decoder 315 may output to the error detector 325 a second portion 605-b of the DCBS that includes multiple information bit subsets 505 and second EDC bits 415. The error detector 325 may extract information bit subsets 505-a and 505-b, and second EDC bits 415-*d* from each of up to L DCBSs for the decoding hypothesis for performing error detection. In this example, the second EDC bits 415-*d* are a function of the information bit subsets 505-*a* and 505-*b*, and the error detector 325 may determine whether the information bit subsets 505-*a* and 505-*b* pass the second EDC check 610-*b*. The error detector 325 may prune candidate paths that fail the EDC check. If all L DCBSs fail the EDC check, then the error detector 325 may terminate decoding of that decoding hypothesis. The process may be repeat when each EDC value is encountered within each DCBS for each decoding hypothesis.

The decoding and error detection flowchart 600 may continue until one or more decoding candidate bit sequences 605-*p* of length N are identified, and an EDC check 610-*p* may be performed on those bit sequences. The number of stages in the decoding and error detection flowchart 600 may correspond to the number of EDC values within a particular decoding hypothesis. In an example, for the data blocks 450-*a*, 450-*b* of FIG. 4 that have a single EDC, decoding and error detection flowchart 600 include a single stage where an EDC check is performed on up to L DCBSs of length N. In another example, for the data block 450-*c* of FIG. 5 that have a two EDC values, decoding and error detection flowchart 600 include only two stages where an EDC check is performed using EDC bits 415-*c* in a first stage and EDC bits 415-*d* in a second stage.

At the last stage, the error detector 325 may output k information bits from the control information vector of a DCBS if the DCBS is the only DCBS in any of the hypotheses that satisfies the multiple EDC checks. Otherwise, the error detector 325 may output a decoding error.

Beneficially, the base station 105-*a* may generate the polar-encoded codeword in a manner that improves the ability of the UE 115-*a* to determine which of multiple bit lengths was used for a transmitted control information vector 405.

Additionally, in conventional systems, false alarms are harmful to communications systems and may refer to the situation when a UE decodes a bit sequence that is not intended for the UE, or no bit sequence was actually sent. A false alarm may occur when a UE 115-*a* incorrectly detects a control channel, though a control message on that channel is not intended for this UE, or no control message was sent on that channel.

Figure 7:
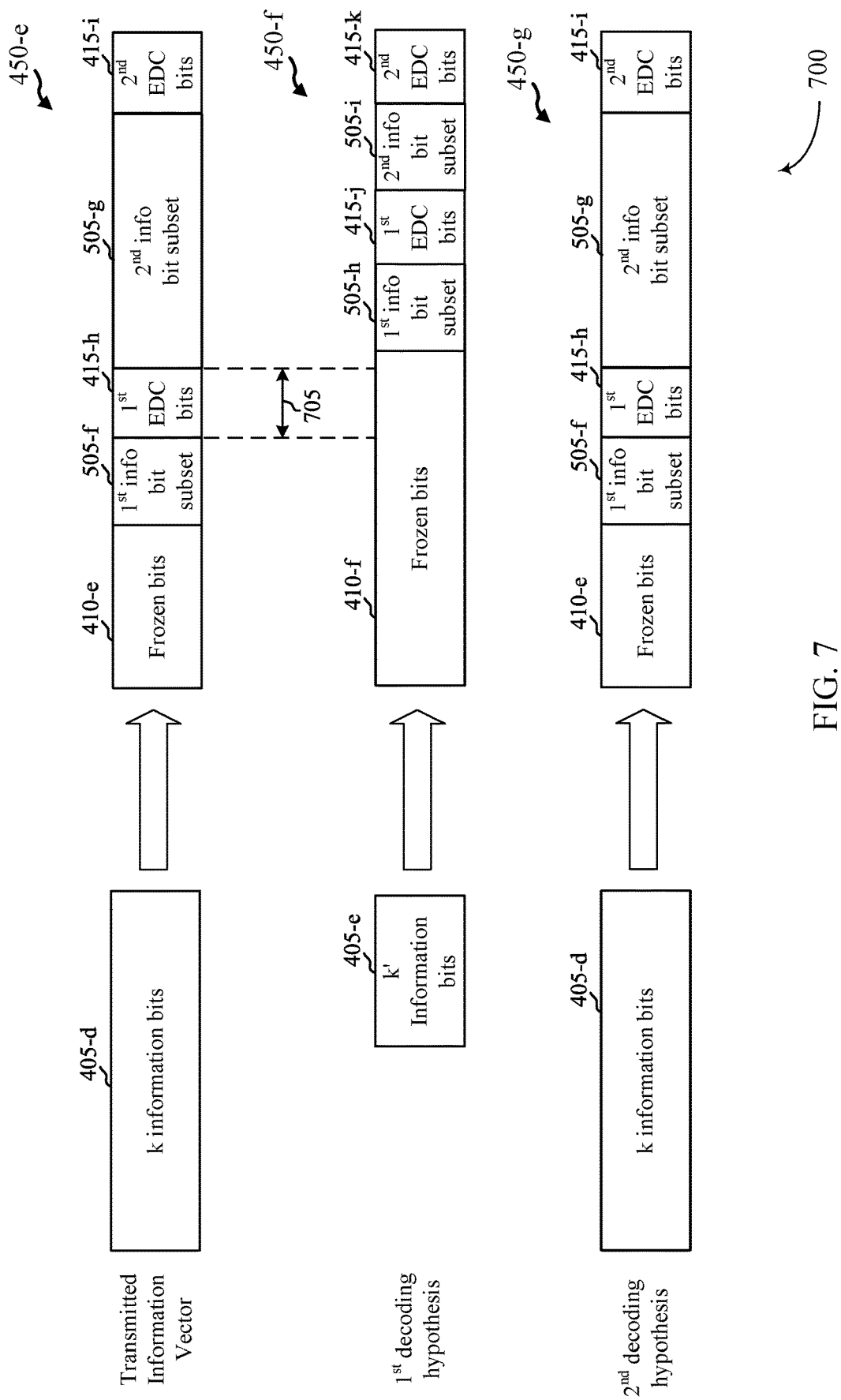
FIG. 7 illustrates an example diagram of data blocks that support size ambiguity reduction and false alarm rate reduction for polar codes in accordance with aspects of the present disclosure.

The examples described herein may provide for reducing a false alarm rate when decoding control information that may have one of different possible lengths. FIG. 7 illustrates an example diagram 700 of data blocks that support size ambiguity reduction and false alarm rate reduction for polar codes in accordance with various aspects of the present disclosure. The base station 105-*a* may select a bit length for a control information vector 405 from multiple different bit lengths. A first control information vector 405-*d* may include k information bits and a second control information vector 405-*e* may include k' information bits, where k'<k. In the depicted example, the control information vectors 405-*d*, 405-*e* are shown on the left, and data blocks 450-*e*, 450-*f*, and 450-*g* of length N are shown on the right. The top most data block 450-*e* corresponds to the transmitted control information vectors 405-*d*, the middle data block 450-*f* corresponds to a first decoding hypothesis that the control information vector 405-*d* includes k' information bits, and the bottom data block 450-*g* corresponds to a second decoding hypothesis that the control information vector 405-*d* includes k information bits.

In data block 450-*e*, bits of the EDC 415-*h*, 415-*i* are depicted as being distributed in the data block 450-*e*. In the example of FIG. 7, data block 450-*e* may include a sequence of frozen bits 410-*e*, a first information bit subset 505-*f*, first EDC bits 415-*h* that are a function of the first information bit subset 505-*f*, a second information bit subset 505-*g*, and second EDC bits 415-*i* that are a function of the first and second information bit subsets 505-*f*, 505-*g*. Data block 450-*f* may include a sequence of frozen bits 410-*f*, a first information bit subset 505-*h*, first EDC bits 415-*j* that are a function of the first information bit subset 505-*h*, a second information bit subset 505-*i*, and second EDC bits 415-*k* that are a function of the first and second information bit subsets 505-*h*, 505-*i*. Data block 450-*g* may have the same structure as data block 450-*e*.

In this example, the base station 105-*a* transmits a signal that includes a polar-encoded codeword generated using data block 450-*e* that includes control information for a different UE than UE 115-*a*. The base station 105-*a* may generate one or more EDC values that assist the UE 115-*a* in determining that the signal that includes a polar-encoded codeword generated using data block 450-*e* is not intended for UE 115-*a*. With reference to FIG. 2, the first EDC generator 210 may initialize an initial variable state for the EDC computation to include at least one non-zero bit in the initial variable state (e.g., variable state includes all non-zero bit values, some or all of RNTI of UE 115-*a*, or the like), similar to the manner discussed above. The EDC value may have a non-zero value even after inputting k consecutive bits set to zero into the EDC algorithm.

If the initial variable state is a function of an identifier assigned to the UE 115-*a*, the error detector 325 may perform the EDC check using its identifier. In the example of FIG. 7, the base station 105-*a* may generate the first EDC bits 415-*h* having a variable state initialized with an identifier of a UE other than UE 115-*a*. The UE 115-*a* may receive a signal that includes a polar-encoded codeword generated using data block 450-*e*, and generates an EDC value using its identifier. Because the other UE and UE 115-*a* are assigned different identifiers, the UE 115-*a* calculates a different EDC value than in first EDC bits 415-*h* and hence the EDC check fails. The UE 115-*a* then discards the second decoding hypothesis.

The UE 115-*a* may discard the first decoding hypothesis because an EDC check fails as an EDC generated from a subsequence 705 of frozen bits 410-*a* using its identifier differs from an EDC value generated as a function the identifier of the different UE and the first information bit subset 505-*d*. The UE 115-*a* may thus determine to early terminate and not decode any subsequent bits of the first decoding hypothesis after the EDC check of EDC bits 415-*h* fails. The bit length of the transmitted control information vector 405-*d* is greater than the bit length of the first decoding hypothesis, and hence the first and second EDC bits 415-*j*, 415-*k* are both protecting against a false alarm. In such an example, the EDC bits may be CRC bits, parity check bits, or both. The base station 105-*a* may generate one or more other EDCs, such as EDC 415-*i*, for the data block 450-*e* using the all-non-zero initial variable state. Thus, the base station 105-*a* may initialize a variable state for an EDC algorithm to assist the UE 115-*a* in discarding one or more hypotheses to reduce a false alarm rate.

In another example, the base station 105-*a* may scramble a first EDC of a data block including multiple EDCs with a mask to reduce a false alarm rate. In an example, the first EDC generator 210 may generate an EDC value as a function of the first information bit subset 505-*f*. The first EDC generator 210 may scramble the EDC value with a mask. In an example, the mask may be a bit sequence where all bits are set to one. The scrambled value may result in an EDC value that is non-zero, and hence the EDC bits 415 may include one or more bits set to a one. In the example of FIG. 7, the list decoder 315 may extract a masked EDC portion of a decoding candidate bit sequence corresponding to a location of first EDC bits 415-$h$ of data block 450-$e$. The error detector 325 may descramble the bits of the EDC portion to generate a processed EDC value. The error detector 325 may apply an EDC algorithm to a subset of a payload portion of the decoding candidate bit sequence, corresponding to the location of the first information bit subset 505-$f$ within decoding block 450-$e$, to generate a calculated EDC value. The error detector 325 may make an early termination decision by comparing the processed EDC value with the calculated EDC value. For example, the early termination decision may be to early terminate decoding of the decoding candidate bit sequence if the processed EDC does not match the calculated EDC value, and the continue decoding if they match. Early termination may involve halting decoding of a payload portion of a decoding candidate bit sequence prior to decoding a last bit of the decoding candidate bit sequence in the decoding order.

For the first decoding hypothesis, the UE 115-$a$ may discard the decoding candidate bit sequences of the first decoding hypothesis because an EDC generated from a subsequence 705 of frozen bits 410-$a$ may not pass an EDC check using the EDC bits 415-$h$, thereby reducing the false alarm rate and may be used for early termination. The base station 105-$a$ may generate one or more other EDCs, such as EDC 415-$i$, in a same or similar manner.

In another example, the base station 105-$a$ may generate a first EDC of a data block that uses a single parity scheme to reduce a false alarm rate and support early termination. The first EDC generator 210 may generate an EDC value that uses odd parity. For odd parity, a parity bit may be set to zero if an odd number of bits are ones. As zero is an even number, the first EDC generator 210 may generate an EDC value set to a value of one if there are 0, 2, 4, 6, etc., bits set to one. The EDC value generated for a sequence of zeros is thus set to a bit value of one. In the example of FIG. 7, the UE 115-$a$ may discard the first decoding hypothesis because an EDC generated from a subsequence 705 of frozen bits 410-$a$ might not pass an EDC check using the EDC bits 415-$h$, thereby reducing the false alarm rate and may be used for early termination. The base station 105-$a$ may generate one or more other EDCs, such as EDC 415-$i$, in a same or similar manner.

In another example, the base station 105-$a$ may scramble frozen bits of a data block including multiple EDCs with a mask to reduce a false alarm rate. In the example of FIG. 7, the first EDC generator 210 may scramble the frozen bits 410-$e$ with a mask. The mask may be an identifier of the UE 115-$a$ (e.g., RNTI). The descrambler 320 of the UE 115-$a$ may descramble a frozen bit portion of the DCBS with the mask. The error detector 325 may compare the descrambled bits with expected values for the descrambled bits based on the mask. The UE 115-$a$ may determine to early terminate decoding a DCBS, a decoding hypothesis, or both, if the descrambled bits differ from expected values for the descrambled bits. The difference may occur, for example, if the base station 105-$a$ scrambled the bits using a mask that is an identifier of a different UE than UE 115-$a$. Thus, the base station 105-$a$ may scramble frozen bits of a data block including multiple EDCs with a mask to reduce a false alarm rate and to make an early termination decision.

Figure 8:
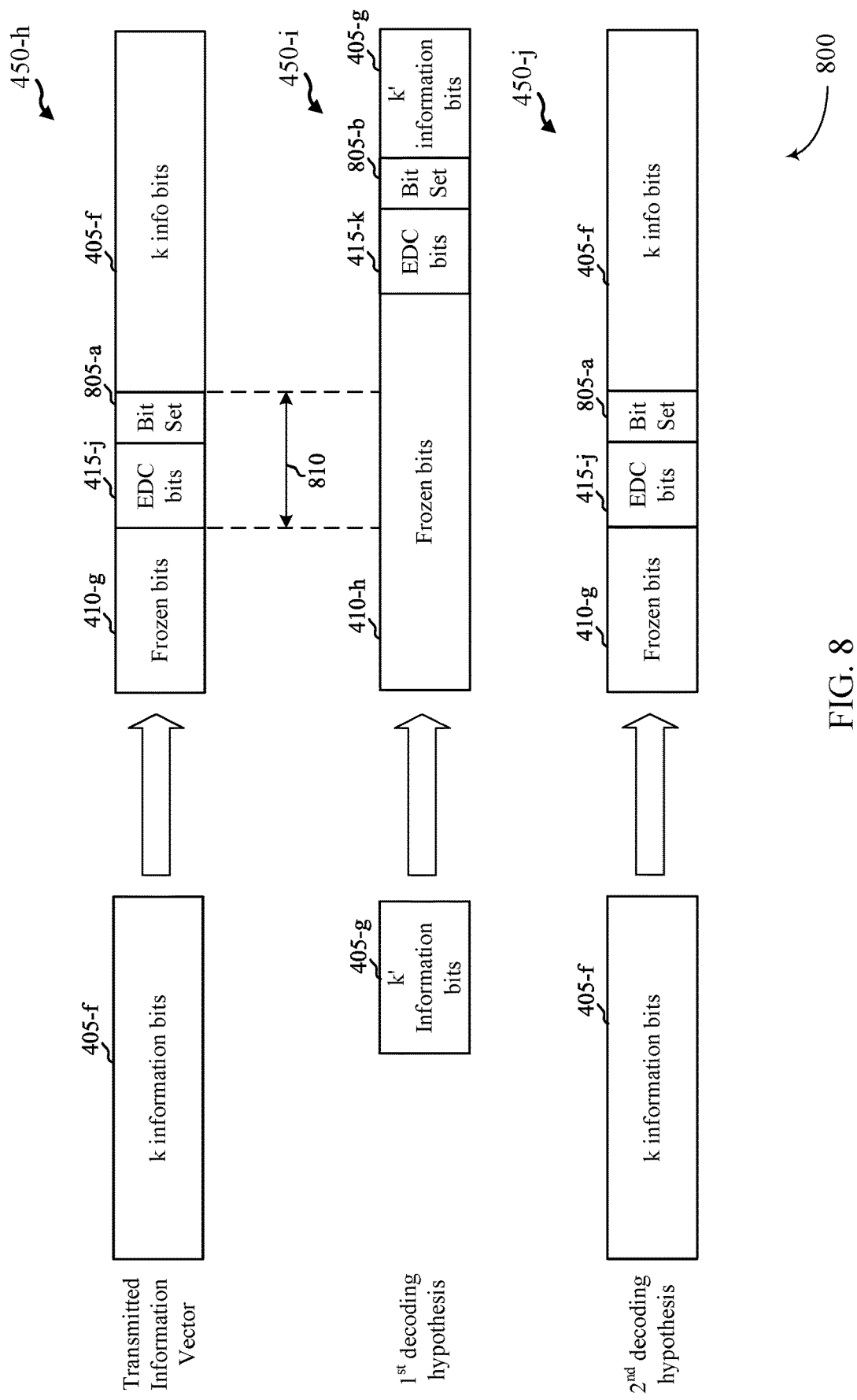
FIG. 8 illustrates an example diagram of data blocks that support size ambiguity reduction and false alarm rate reduction for polar codes in accordance with aspects of the present disclosure.

The examples described herein may provide additional techniques that support early termination and false alarm rate reduction. FIG. 8 illustrates an example diagram 800 of data blocks that support size ambiguity reduction and false alarm rate reduction for polar codes in accordance with various aspects of the present disclosure. The base station 105-$a$ may select a bit length for a control information vector 405 from multiple different bit lengths. A first control information vector 405-$f$ may include k information bits and a second control information vector 405-$g$ may include k' information bits, where k'<k. In the depicted example, the control information vectors 405-$f$, 405-$g$ are shown on the left, and data blocks 450-$h$, 450-$i$, and 450-$j$ of length N are shown on the right. The top most data block 450-$h$ corresponds to the transmitted control information vectors 405-$f$, the middle data block 450-$i$ corresponds to a first decoding hypothesis that the control information vector 405-$f$ includes k' information bits, and the bottom data block 450-$j$ corresponds to a second decoding hypothesis that the control information vector 405-$f$ includes k information bits.

Data block 450-$h$ may include a sequence of frozen bits 410-$g$, EDC bits 415-$j$, a bit set 805-$a$, and control information vector 405-$f$. The EDC bits 415-$j$ are a function of the k information bits of the control information vector 405-$f$. Data block 450-$i$ may include a sequence of frozen bits 410-$h$, EDC bits 415-$k$, a bit set 805-$b$, and control information vector 405-$g$. The EDC bits 415-$k$ are a function of the k' information bits of the control information vector 405-$g$. Data block 450-$j$ may have the same structure as data block 450-$h$.

In this example, the base station 105-$a$ transmits a signal that includes a polar-encoded codeword generated using data block 450-$h$ that includes control information for a different UE than UE 115-$a$. The base station 105-$a$ may generate EDC bits 415 and a bit set 805 to assist the UE 115-$a$ in determining that the signal that includes a polar-encoded codeword generated using data block 450-$h$ is not intended for UE 115-$a$.

With reference to FIG. 2, the first EDC generator 210 may initialize an initial variable state for the EDC computation to include at least one non-zero bit in the initial variable state (e.g., variable state includes all non-zero bit values, some or all of an identifier of UE other than UE 115-$a$, etc.), similar to the manner discussed above. After generating an EDC, the first EDC generator 210 may continue to generate bits (e.g., continue to operate linear-feedback-shift-register) to generate one or more additional bit values to be included in bit set 805-$a$. The bits of the bit set 805 may include the same values as a corresponding number of the beginning bits 415 of the EDC value. In the example of FIG. 8, the first EDC generator 210 of base station 105-$a$ may generate the first EDC bits 415-$j$ and bit set 805-$a$ using an EDC algorithm, and include the first EDC bits 415-$j$ and the bit set 805-$a$ in the data block 450-$h$ to be polar-encoded. In some examples, the first EDC generator 210 may have a non-all-zero initial variable state (e.g., variable state that includes all one-state, some or all of an identifier of UE, etc.). In some cases, the first EDC generator 210 may scramble the EDC value with a mask (e.g., non-all zero mask, all one-state mask, mask that includes some or all of an identifier of UE, etc.). The same mask, or a portion thereof, may be applied to the bit set 805 to generate a masked bit set.

The UE 115-$a$ may receive a signal that includes a polar-encoded codeword generated using data block 450-$h$. The list decoder 315 may obtain a portion of one or more decoding candidate bit sequences for each hypothesis. The list decoder 315 may extract a first portion of bits of the decoding candidate bit sequences corresponding to the first EDC bits 415-$j$ and a second portion of bits of the decoding candidate bit sequences corresponding to the bit set 805-*a*, and output the extracted bits to the error detector 325. The error detector 325 may determine a correlation state between the first and second bit portions. As the bits of the bit set 805-*a* may include the same values as a corresponding number of the beginning bits of the EDC value, the error detector 325 may determine a correlation state that indicates whether bits of the bit set 805-*a* match bits a corresponding number of the beginning bits of the EDC value. If the correlation state indicates that a match is detected, the list decoder 315 may continue decoding of the corresponding decoding candidate bit sequence. For example, the list decoder 315 may continue decoding to generate a length N decoding candidate bit sequence. The list decoder 315 may output a payload portion of the decoding candidate bit sequence, which may include the locations corresponding to control information vector 405-*f*, or EDC bits 415-*j*, or bit set 805-*a*, or any combination thereof, of data block 450-*a*. The error detector 325 may calculate an EDC value as a function of the extracted information bit portion for comparison to the EDC portion.

If the correlation state indicates a match is not detected, the list decoder 315 may early terminate decoding of the corresponding decoding candidate bit sequence, decoding hypothesis, or both. In the example of FIG. 8, the EDC bits 415-*j* may include at least one non-zero value because the EDC computation is initialized with a non-all-zero initial state. The UE 115-*a* may determine that the correlation state between the EDC bits 415-*j* with the bit set 805-*a* is not the same as an expected correlation state between bits of the subsequence 810. Hence, the UE 115-*a* may discard the first decoding hypothesis, thereby providing early termination and reduction of the false alarm rate.

In the example of FIG. 8, it is noted that the EDC bits 415 are shown immediately after the frozen bits 410 in the decoding order. The EDC bits 415 and bit set 805 may be placed at other locations within the data block 450. In some examples, an information bit subset may be located on either side of the EDC bits 415 and bit set 805. In some examples, the EDC bits 415 may or might not be adjacent to one another in the decoding order.

Advantageously, the examples provided herein may improve the ability of a receiver to determine the bit length of a transmitted control information vector, may improve decoder performance by supporting early termination decisions, and may improve a false alarm rate.

Figure 9:
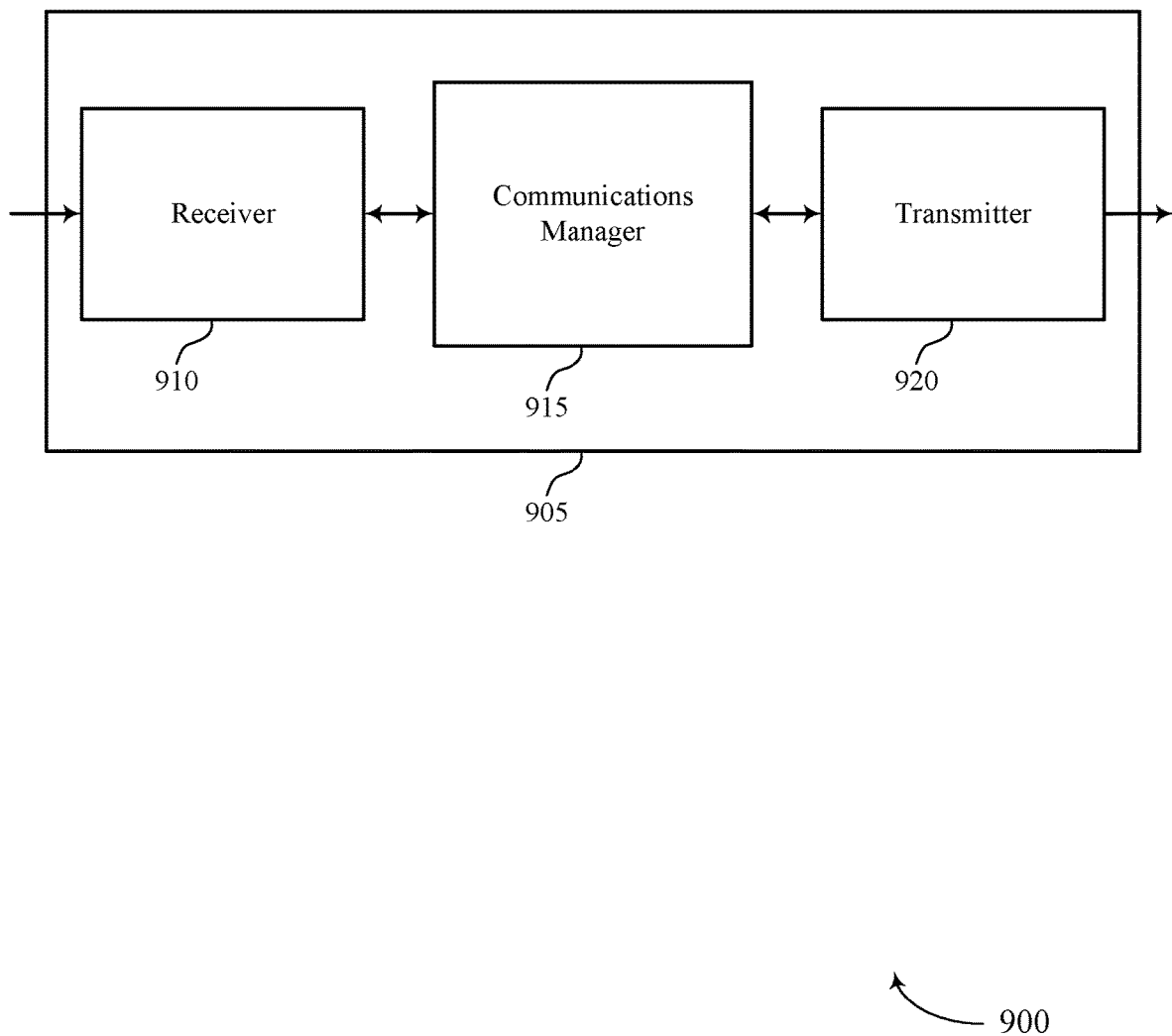
FIGS. 9 through 11 show block diagrams of a device that supports size ambiguity reduction and false alarm rate reduction for polar codes in accordance with aspects of the present disclosure.

FIG. 9 shows a block diagram 900 of a wireless device 905 that supports size ambiguity reduction and false alarm rate reduction for polar codes in accordance with aspects of the present disclosure. Wireless device 905 may be an example of aspects of a UE 115 as described herein. Wireless device 905 may include receiver 910, communications manager 915, and transmitter 920. Wireless device 905 may also include a processor. Each of these components may be in communication with one another (e.g., via one or more buses).

Receiver 910 may receive information such as packets, user data, or control information associated with various information channels (e.g., control channels, data channels, and information related to size ambiguity reduction and false alarm rate reduction for polar codes, etc.). Information may be passed on to other components of the device. The receiver 910 may be an example of aspects of the transceiver 1235 described with reference to FIG. 12. The receiver 910 may utilize a single antenna or a set of antennas.

Communications manager 915 may be an example of aspects of the communications manager 1215 described with reference to FIG. 12.

Communications manager 915 and/or at least some of its various sub-components may be implemented in hardware, software executed by a processor, firmware, or any combination thereof. If implemented in software executed by a processor, the functions of the communications manager 915 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The communications manager 915 and/or at least some of its various sub-components may be physically located at various positions, including being distributed such that portions of functions are implemented at different physical locations by one or more physical devices. In some examples, communications manager 915 and/or at least some of its various sub-components may be a separate and distinct component in accordance with various aspects of the present disclosure. In other examples, communications manager 915 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Communications manager 915 may monitor a signal for a polar-encoded codeword having a codeword size, determine a decoding candidate bit sequence based on the signal, where the decoding candidate bit sequence is associated with a decoding hypothesis for control information having a particular bit length of a set of different bit lengths for the codeword size, calculate an EDC value for a payload portion of the decoding candidate bit sequence using an EDC algorithm, where the calculating includes initializing a variable state for the EDC algorithm with at least one non-zero bit value, and determine a decoding output state for the payload portion of the decoding candidate bit sequence based on the EDC value and an EDC portion of the decoding candidate bit sequence.

The communications manager 915 may also monitor a signal for a polar-encoded codeword having a codeword size, determine a decoding candidate bit sequence based on the signal, where the decoding candidate bit sequence is associated with a decoding hypothesis for control information having a particular bit length of a set of different bit lengths for the codeword size, calculate an EDC value for a payload portion of the decoding candidate bit sequence using an EDC algorithm, where the calculating includes performing bit-reversal on bits of the payload portion, and determine a decoding output state for the payload portion of the decoding candidate bit sequence based on the EDC value and an EDC portion of the decoding candidate bit sequence.

The communications manager 915 may also monitor a signal for a polar-encoded codeword having a codeword size, modify the polar-encoded codeword to generate a modified polar-encoded codeword based on a decoding hypothesis for control information having a particular bit length of a set of different bit lengths for the codeword size, where the modifying includes descrambling, deinterleaving, or both, the polar-encoded codeword based on the particular bit length, determine a decoding candidate bit sequence based on the modified polar-encoded codeword and the decoding hypothesis, calculate an EDC value for a payload portion of the decoding candidate bit sequence using an EDC algorithm, and determine a decoding output state for the payload portion of the decoding candidate bit sequence based on the EDC value and an EDC portion of the decoding candidate bit sequence.

The communications manager 915 may also monitor a signal for a polar-encoded codeword having a codeword size, determine a decoding candidate bit sequence based on the signal, where the decoding candidate bit sequence is associated with a decoding hypothesis for control information having a particular bit length of a set of different bit lengths for the codeword size, descramble a payload portion of the decoding candidate bit sequence, calculate an EDC value for the descrambled payload portion using an EDC algorithm, and determine a decoding output state for the descrambled payload portion based on the EDC value and an EDC portion of the decoding candidate bit sequence.

The communications manager 915 may also monitor a signal for a polar-encoded codeword having a codeword size, determine a decoding candidate bit sequence based on the signal, where the decoding candidate bit sequence is associated with a decoding hypothesis for control information having a particular bit length of a set of different bit lengths for the codeword size, extract a masked EDC portion of the decoding candidate bit sequence and descrambling the masked EDC portion with a mask to generate a processed EDC value, apply an EDC algorithm to a subset of a payload portion of the decoding candidate bit sequence to generate a calculated EDC value, and generate an early termination decision based on the processed EDC value and the calculated EDC value.

The communications manager 915 may also monitor a signal for a polar-encoded codeword having a codeword size, determine a decoding candidate bit sequence based on the signal, where the decoding candidate bit sequence is associated with a decoding hypothesis for control information having a particular bit length of a set of different bit lengths for the codeword size, extract an EDC portion and a bit set from a payload portion of the decoding candidate bit sequence, the bit set generated by an EDC algorithm, determine a correlation state between the EDC portion and the bit set, and generate an early termination decision based on the correlation state.

The communications manager 915 may also monitor a signal for a polar-encoded codeword having a codeword size, determine a decoding candidate bit sequence based on the signal, where the decoding candidate bit sequence is associated with a decoding hypothesis for control information having a particular bit length of a set of different bit lengths for the codeword size, determine that a payload portion of the decoding candidate bit sequence includes a demarcation bit located at a beginning of a decoding order of the payload portion, calculate an EDC value for the payload portion using an EDC algorithm, and determine a decoding output state for the payload portion of the decoding candidate bit sequence based on the EDC value and an EDC portion of the decoding candidate bit sequence.

The communications manager 915 may also monitor a signal for a polar-encoded codeword having a codeword size, determine a decoding candidate bit sequence based on the signal, where the determining identifies that a frozen bit portion of the decoding candidate bit sequence is masked with an identifier of the UE, and where the decoding candidate bit sequence is associated with a decoding hypothesis for control information having a particular bit length of a set of different bit lengths for the codeword size, calculate an EDC value for a payload portion using an EDC algorithm, and determine a decoding output state for the payload portion of the decoding candidate bit sequence based on the EDC value and an EDC portion of the decoding candidate bit sequence.

Transmitter 920 may transmit signals generated by other components of the device. In some examples, the transmitter 920 may be collocated with a receiver 910 in a transceiver module. For example, the transmitter 920 may be an example of aspects of the transceiver 1235 described with reference to FIG. 12. The transmitter 920 may utilize a single antenna or a set of antennas.

Figure 10:
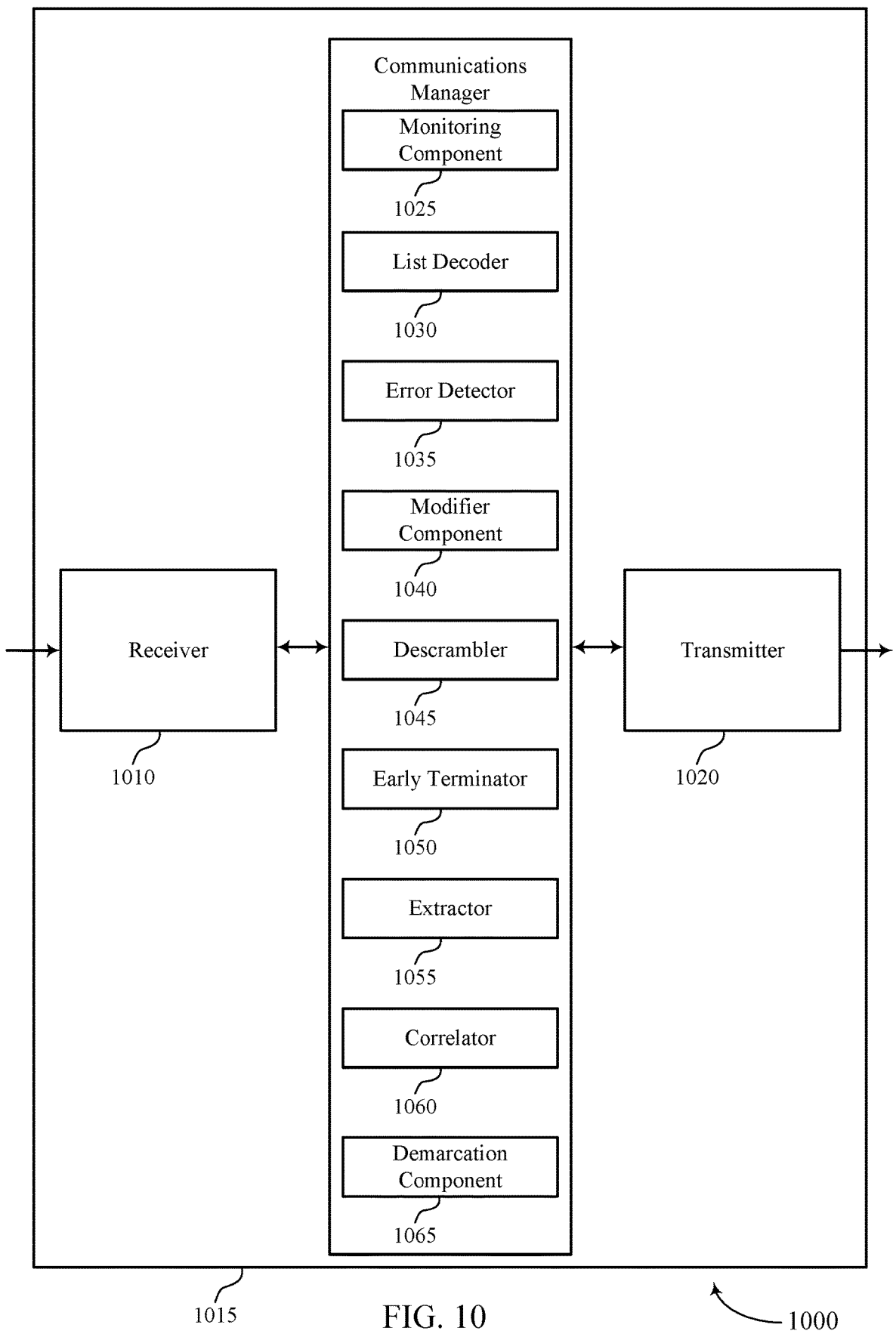

FIG. 10 shows a block diagram 1000 of a wireless device 1005 that supports size ambiguity reduction and false alarm rate reduction for polar codes in accordance with aspects of the present disclosure. Wireless device 1005 may be an example of aspects of a wireless device 905 or a UE 115 as described with reference to FIG. 9. Wireless device 1005 may include receiver 1010, communications manager 1015, and transmitter 1020. Wireless device 1005 may also include a processor. Each of these components may be in communication with one another (e.g., via one or more buses).

Receiver 1010 may receive a polar-encoded codeword. The receiver 1010 may be an example of aspects of the transceiver 1235 described with reference to FIG. 12. The receiver 1010 may utilize a single antenna or a set of antennas.

Communications manager 1015 may be an example of aspects of the communications manager 1215 described with reference to FIG. 12.

Communications manager 1015 may also include monitoring component 1025, list decoder 1030, error detector 1035, modifier component 1040, descrambler 1045, early terminator 1050, extractor 1055, correlator 1060, and demarcation component 1065.

Monitoring component 1025 may monitor a signal for a polar-encoded codeword having a codeword size.

List decoder 1030 may determine a decoding candidate bit sequence based on the signal, where the decoding candidate bit sequence is associated with a decoding hypothesis for control information having a particular bit length of a set of different bit lengths for the codeword size. List decoder 1030 may determine a decoding candidate bit sequence based on the modified polar-encoded codeword and the decoding hypothesis. List decoder 1030 may determine a decoding candidate bit sequence based on the signal, where the determining identifies that a frozen bit portion of the decoding candidate bit sequence is masked with an identifier of the UE, and where the decoding candidate bit sequence is associated with a decoding hypothesis for control information having a particular bit length of a set of different bit lengths for the codeword size.

Error detector 1035 may calculate an EDC value for a payload portion of the decoding candidate bit sequence using an EDC algorithm, where the calculating includes initializing a variable state for the EDC algorithm with at least one non-zero bit value. Error detector 1035 may extract a second EDC portion from the decoding candidate bit sequence, and calculate a second EDC value based on the payload portion of the decoding candidate bit sequence, where the decoding output state is based on a comparison of the second EDC portion and the second EDC value. Error detector 1035 may calculate an EDC value for a payload portion of the decoding candidate bit sequence using an EDC algorithm, where the calculating includes performing bit-reversal on bits of the payload portion. Error detector

1035 may determine a decoding output state for the payload portion of the decoding candidate bit sequence based on the EDC value and an EDC portion of the decoding candidate bit sequence.

Error detector 1035 may calculate an EDC value for a payload portion of the decoding candidate bit sequence using an EDC algorithm. Error detector 1035 may calculate an EDC value for the descrambled payload portion using an EDC algorithm, determine a decoding output state for a descrambled payload portion based on the EDC value and an EDC portion of the decoding candidate bit sequence, apply an EDC algorithm to a subset of a payload portion of the decoding candidate bit sequence to generate a calculated EDC value, apply an EDC algorithm to the payload portion to calculate a second EDC value, and determine a decoding output state for the payload portion of the decoding candidate bit sequence based on the second EDC portion and the second EDC value. Error detector 1035 may apply an EDC algorithm to the payload portion of the decoding candidate bit sequence to generate a second EDC value, and determine a decoding output state for the payload portion of the decoding candidate bit sequence based on the second EDC value and the second EDC portion of the decoding candidate bit sequence. Error detector 1035 may calculate an EDC value for the payload portion using an EDC algorithm, and calculate an EDC value for a payload portion using an EDC algorithm.

In some cases, the decoding output state includes a decoding error or decoded control information extracted from the decoding candidate bit sequence. In some cases, the decoding output state is based on a comparison of the EDC value and the EDC portion of the decoding candidate bit sequence. In some cases, the EDC value corresponds to a subset of the payload portion, and where the decoding output state indicates to terminate decoding of the payload portion prior to decoding at least a last bit of the payload portion. In some cases, the decoding output state includes a decoding error or decoded control information extracted from the decoding candidate bit sequence. In some cases, the decoding output state includes a decoding error or decoded control information extracted from the decoding candidate bit sequence. In some cases, the decoding output state is based on a comparison of the EDC value and the EDC portion of the decoding candidate bit sequence.

In some cases, the decoding output state is based on a comparison of the EDC value and the EDC portion of the decoding candidate bit sequence. In some cases, the decoding output state includes a decoding error or decoded control information extracted from the decoding candidate bit sequence. In some cases, the decoding output state includes a decoding error or decoded control information extracted from the decoding candidate bit sequence. In some cases, the decoding output state includes a decoding error or decoded control information extracted from the decoding candidate bit sequence.

In some cases, the decoding output state is based on a comparison of the EDC value and the EDC portion of the decoding candidate bit sequence. In some cases, the decoding output state includes a decoding error or decoded control information extracted from the decoding candidate bit sequence. In some cases, the decoding output state is based on a comparison of the EDC value and the EDC portion of the decoding candidate bit sequence. In some cases, the decoding output state is based on a comparison of the EDC value and the EDC portion of the decoding candidate bit sequence.

Modifier component 1040 may modify the polar-encoded codeword to generate a modified polar-encoded codeword based on a decoding hypothesis for control information having a particular bit length of a set of different bit lengths for the codeword size, where the modifying includes descrambling, deinterleaving, or both, the polar-encoded codeword based on the particular bit length.

Descrambler 1045 may descramble the EDC portion of the decoding candidate bit sequence with a mask. In some cases, the decoding output state is based on the descrambled EDC portion. Descrambler 1045 may descramble a payload portion of the decoding candidate bit sequence. Descrambler 1045 may extract a masked EDC portion of the decoding candidate bit sequence, and descramble the masked EDC portion with a mask to generate a processed EDC value. In some cases, the descrambled payload portion of the decoding candidate bit sequence includes frozen bits, information bits, or both.

Early terminator 1050 may generate an early termination decision based on the processed EDC value and the calculated EDC value and generate an early termination decision based on a correlation state. In some cases, the early termination decision is to terminate decoding of the payload portion prior to decoding at least a last bit of the payload portion. In some cases, the early termination decision is to continue decoding of the decoding candidate bit sequence. In some cases, the early termination decision is to terminate decoding of the payload portion prior to decoding at least a last bit of the payload portion. In some cases, the early termination decision is to continue decoding of the payload portion.

Extractor 1055 may extract a second EDC portion from a decoding candidate bit sequence, extract an EDC portion and a bit set from a payload portion of the decoding candidate bit sequence, the bit set generated by an EDC algorithm, and extract a second EDC portion of the decoding candidate bit sequence. In some cases, extracting the EDC portion from the decoding candidate bit sequence includes extracting a defined number of bits from the decoding candidate bit sequence corresponding to a candidate location for the EDC portion within the decoding candidate bit sequence. In some cases, the candidate location is at a beginning of a decoding order of the payload portion or intermediate to the decoding order.

Correlator 1060 may determine a correlation state between the EDC portion and the bit set.

Demarcation component 1065 may determine that a payload portion of the decoding candidate bit sequence includes a demarcation bit located at a beginning of a decoding order of the payload portion.

Transmitter 1020 may transmit signals including a polar-encoded codeword generated by other components of the device. In some examples, the transmitter 1020 may be collocated with a receiver 1010 in a transceiver module. For example, the transmitter 1020 may be an example of aspects of the transceiver 1235 described with reference to FIG. 12. The transmitter 1020 may utilize a single antenna or a set of antennas.

Figure 11:
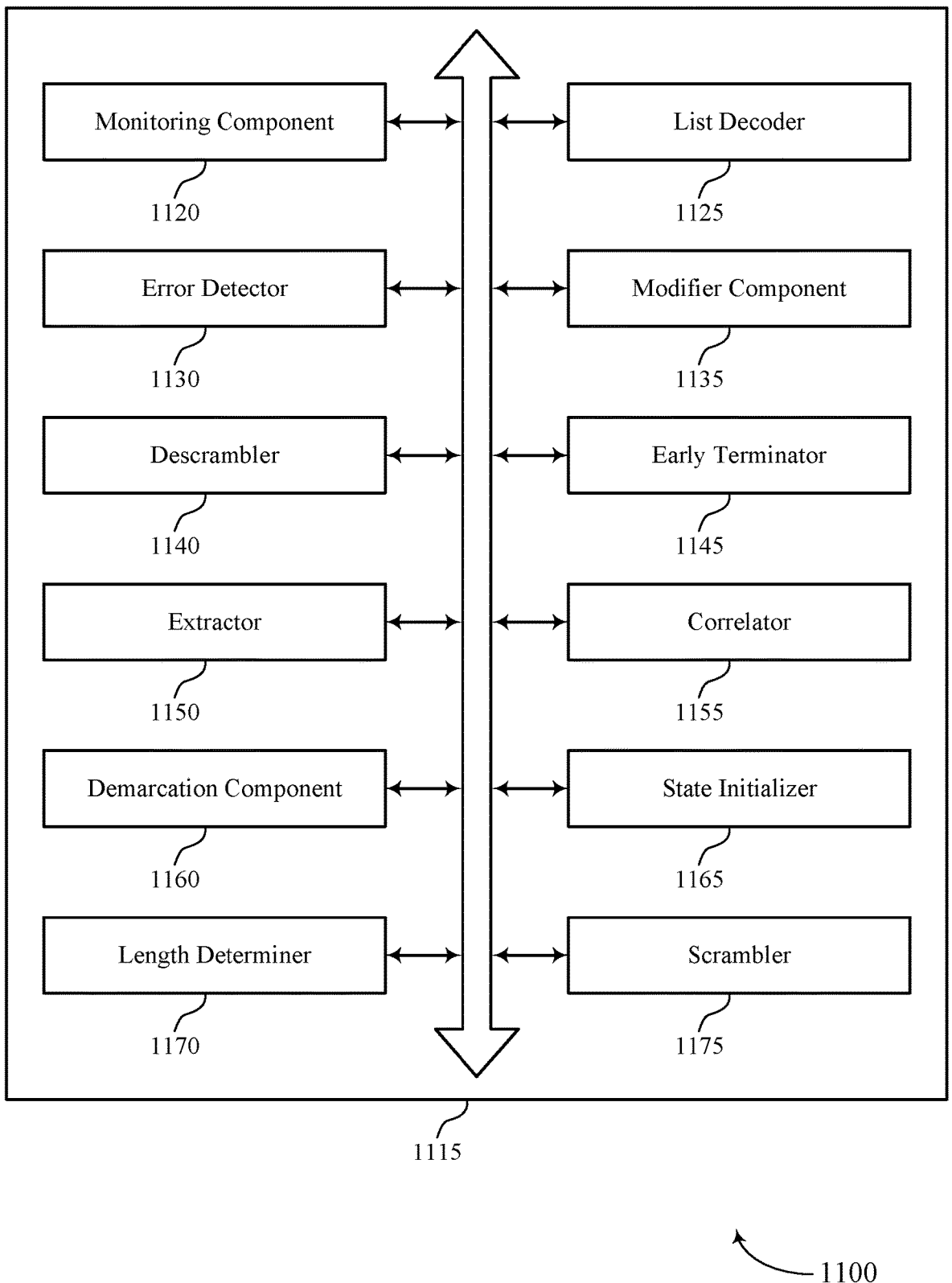

FIG. 11 shows a block diagram 1100 of a communications manager 1115 that supports size ambiguity reduction and false alarm rate reduction for polar codes in accordance with aspects of the present disclosure. The communications manager 1115 may be an example of aspects of a communications manager 915, a communications manager 1015, or a communications manager 1215 described with reference to FIGS. 9, 10, and 12. The communications manager 1115 may include monitoring component 1120, list decoder 1125, error detector 1130, modifier component 1135, descrambler 1140, early terminator 1145, extractor 1150, correlator 1155, demarcation component 1160, state initializer 1165, length determiner 1170, and scrambler 1175. Each of these modules may communicate, directly or indirectly, with one another (e.g., via one or more buses).

Monitoring component 1120 may monitor a signal for a polar-encoded codeword having a codeword size.

List decoder 1125 may determine a decoding candidate bit sequence based on the signal, where the decoding candidate bit sequence is associated with a decoding hypothesis for control information having a particular bit length of a set of different bit lengths for the codeword size. List decoder 1125 may determine a decoding candidate bit sequence based on the modified polar-encoded codeword and the decoding hypothesis, and determine a decoding candidate bit sequence based on the signal. In some cases, the determining identifies that a frozen bit portion of the decoding candidate bit sequence is masked with an identifier of the UE. In some examples, the decoding candidate bit sequence is associated with a decoding hypothesis for control information having a particular bit length of a set of different bit lengths for the codeword size.

Error detector 1130 may calculate an EDC value for a payload portion of the decoding candidate bit sequence using an EDC algorithm, where the calculating includes initializing a variable state for the EDC algorithm with at least one non-zero bit value. Error detector 1130 may extract a second EDC portion from the decoding candidate bit sequence, and calculate a second EDC value based on the payload portion of the decoding candidate bit sequence. In some cases, the decoding output state is based on a comparison of the second EDC portion and the second EDC value. Error detector 1130 may calculate an EDC value for a payload portion of the decoding candidate bit sequence using an EDC algorithm, where the calculating includes performing bit-reversal on bits of the payload portion. Error detector 1130 may determine a decoding output state for the payload portion of the decoding candidate bit sequence based on the EDC value and an EDC portion of the decoding candidate bit sequence.

Error detector 1130 may calculate an EDC value for a payload portion of the decoding candidate bit sequence using an EDC algorithm. Error detector 1130 may calculate an EDC value for the descrambled payload portion using an EDC algorithm, determine a decoding output state for the descrambled payload portion based on the EDC value and an EDC portion of the decoding candidate bit sequence. Error detector 1130 may apply an EDC algorithm to a subset of a payload portion of the decoding candidate bit sequence to generate a calculated EDC value. In some cases, bits of the payload portion of the decoding candidate bit sequence may include a set of control information bits and a set of EDC bits. In some cases, each frozen bit of a set of frozen bits used to generate the polar-encoded codeword has a value set to zero and each bit of a set of bits of the initialized variable state has a value set to one.

Error detector 1130 may apply an EDC algorithm to the payload portion to calculate a second EDC value, and determine a decoding output state for the payload portion of the decoding candidate bit sequence based on the second EDC portion and the second EDC value. Error detector 1130 may apply an EDC algorithm to the payload portion of the decoding candidate bit sequence to generate a second EDC value, determine a decoding output state for the payload portion of the decoding candidate bit sequence based on the second EDC value and the second EDC portion of the decoding candidate bit sequence, calculate an EDC value for the payload portion using an EDC algorithm, and calculate an EDC value for a payload portion using an EDC algorithm.

In some cases, the decoding output state includes a decoding error or decoded control information extracted from the decoding candidate bit sequence. In some cases, the decoding output state is based on a comparison of the EDC value and the EDC portion of the decoding candidate bit sequence. In some cases, the EDC value corresponds to a subset of the payload portion, and where the decoding output state indicates to terminate decoding of the payload portion prior to decoding at least a last bit of the payload portion. In some cases, the decoding output state includes a decoding error or decoded control information extracted from the decoding candidate bit sequence. In some cases, the decoding output state includes a decoding error or decoded control information extracted from the decoding candidate bit sequence. In some cases, the decoding output state is based on a comparison of the EDC value and the EDC portion of the decoding candidate bit sequence.

In some cases, the decoding output state is based on a comparison of the EDC value and the EDC portion of the decoding candidate bit sequence. In some cases, the decoding output state includes a decoding error or decoded control information extracted from the decoding candidate bit sequence. In some cases, the decoding output state includes a decoding error or decoded control information extracted from the decoding candidate bit sequence. In some cases, the decoding output state includes a decoding error or decoded control information extracted from the decoding candidate bit sequence. In some cases, the decoding output state includes a decoding error or decoded control information extracted from the decoding candidate bit sequence.

In some cases, the decoding output state is based on a comparison of the EDC value and the EDC portion of the decoding candidate bit sequence. In some cases, the decoding output state includes a decoding error or decoded control information extracted from the decoding candidate bit sequence. In some cases, the decoding output state is based on a comparison of the EDC value and the EDC portion of the decoding candidate bit sequence. In some cases, the decoding output state is based on a comparison of the EDC value and the EDC portion of the decoding candidate bit sequence.

Modifier component 1135 may modify the polar-encoded codeword to generate a modified polar-encoded codeword based on a decoding hypothesis for control information having a particular bit length of a set of different bit lengths for the codeword size, where the modifying includes descrambling, deinterleaving, or both. In some examples, the polar-encoded codeword based on the particular bit length.

Descrambler 1140 may descramble the EDC portion of the decoding candidate bit sequence with a mask, where the decoding output state is based on the descrambled EDC portion, descramble a payload portion of the decoding candidate bit sequence, and extract a masked EDC portion of the decoding candidate bit sequence and descrambling the masked EDC portion with a mask to generate a processed EDC value. In some cases, the descrambled payload portion of the decoding candidate bit sequence includes frozen bits, information bits, or both.

Early terminator 1145 may generate an early termination decision based on the processed EDC value and the calculated EDC value and generate an early termination decision based on the correlation state. In some cases, the early termination decision is to terminate decoding of the payload portion prior to decoding at least a last bit of the payload portion. In some cases, the early termination decision is to continue decoding of the decoding candidate bit sequence. In some cases, the early termination decision is to terminate decoding of the payload portion prior to decoding at least a last bit of the payload portion. In some cases, the early termination decision is to continue decoding of the payload portion.

Extractor 1150 may extract a second EDC portion from the decoding candidate bit sequence. Extractor 1150 may extract an EDC portion and a bit set from a payload portion of the decoding candidate bit sequence, the bit set generated by an EDC algorithm, and extract a second EDC portion of the decoding candidate bit sequence. In some cases, extracting the EDC portion from the decoding candidate bit sequence includes extracting a defined number of bits from the decoding candidate bit sequence corresponding to a candidate location for the EDC portion within the decoding candidate bit sequence. In some cases, the candidate location is at a beginning of a decoding order of the payload portion or intermediate to the decoding order. In some cases, the EDC portion of the decoding candidate bit sequence is separated by one or more bits from the second EDC portion of the decoding candidate bit sequence.

Correlator 1155 may determine a correlation state between the EDC portion and the bit set.

Demarcation component 1160 may determine that a payload portion of the decoding candidate bit sequence includes a demarcation bit located at a beginning of a decoding order of the payload portion.

State initializer 1165 may initialize a variable state for an EDC algorithm based on an identifier of the UE. In some cases, the variable state is initialized to include a set of bits each having a value set to one. In some cases, applying the EDC algorithm includes initializing a variable state for the EDC algorithm with at least one non-zero bit value.

Length determiner 1170 may determine a length of a payload portion of a decoding candidate bit sequence that corresponds to one of a set of different bit lengths.

Scrambler 1175 may scramble a defined number of bits output by an EDC algorithm with a mask to generate the second EDC value.

Figure 12:
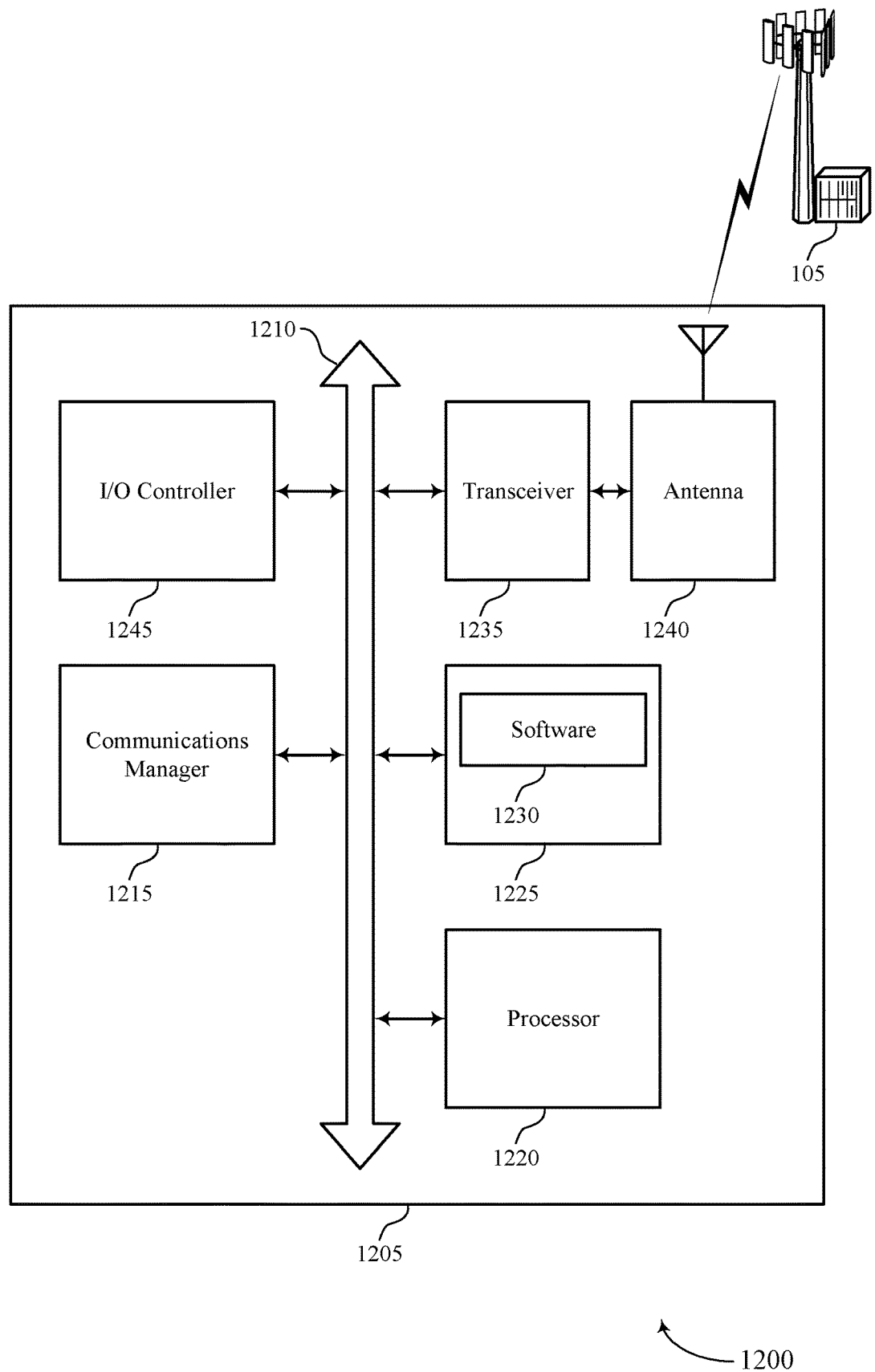
FIG. 12 illustrates a block diagram of a system including a UE that supports size ambiguity reduction and false alarm rate reduction for polar codes in accordance with aspects of the present disclosure.

FIG. 12 shows a diagram of a system 1200 including a device 1205 that supports size ambiguity reduction and false alarm rate reduction for polar codes in accordance with aspects of the present disclosure. Device 1205 may be an example of or include the components of wireless device 905, wireless device 1005, or a UE 115 as described above, e.g., with reference to FIGS. 9 and 10. Device 1205 may include components for bi-directional voice and data communications including components for transmitting and receiving communications, including communications manager 1215, processor 1220, memory 1225, software 1230, transceiver 1235, antenna 1240, and I/O controller 1245. These components may be in electronic communication via one or more buses (e.g., bus 1210). Device 1205 may communicate wirelessly with one or more base stations 105.

Processor 1220 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1220 may be configured to operate a memory array using a memory controller. In other cases, a memory controller may be integrated into processor 1220. Processor 1220 may be configured to execute computer-readable instructions stored in a memory to perform various functions (e.g., functions or tasks supporting size ambiguity reduction and false alarm rate reduction for polar codes).

Memory 1225 may include random access memory (RAM) and read only memory (ROM). The memory 1225 may store computer-readable, computer-executable software 1230 including instructions that, when executed, cause the processor to perform various functions described herein. In some cases, the memory 1225 may contain, among other things, a basic input/output system (BIOS) which may control basic hardware or software operation such as the interaction with peripheral components or devices.

Software 1230 may include code to implement aspects of the present disclosure, including code to support size ambiguity reduction and false alarm rate reduction for polar codes. Software 1230 may be stored in a non-transitory computer-readable medium such as system memory or other memory. In some cases, the software 1230 may not be directly executable by the processor but may cause a computer (e.g., when compiled and executed) to perform functions described herein.

Transceiver 1235 may communicate bi-directionally, via one or more antennas, wired, or wireless links as described above. For example, the transceiver 1235 may represent a wireless transceiver and may communicate bi-directionally with another wireless transceiver. The transceiver 1235 may also include a modem to modulate the packets and provide the modulated packets to the antennas for transmission, and to demodulate packets received from the antennas.

In some cases, the wireless device may include a single antenna 1240. However, in some cases the device may have more than one antenna 1240, which may be capable of concurrently transmitting or receiving multiple wireless transmissions.

I/O controller 1245 may manage input and output signals for device 1205. I/O controller 1245 may also manage peripherals not integrated into device 1205. In some cases, I/O controller 1245 may represent a physical connection or port to an external peripheral. In some cases, I/O controller 1245 may utilize an operating system such as iOS®, ANDROID®, MS-DOS®, MS-WINDOWS®, OS/2®, UNIX®, LINUX®, or another known operating system. In other cases, I/O controller 1245 may represent or interact with a modem, a keyboard, a mouse, a touchscreen, or a similar device. In some cases, I/O controller 1245 may be implemented as part of a processor. In some cases, a user may interact with device 1205 via I/O controller 1245 or via hardware components controlled by I/O controller 1245.

Figure 13:
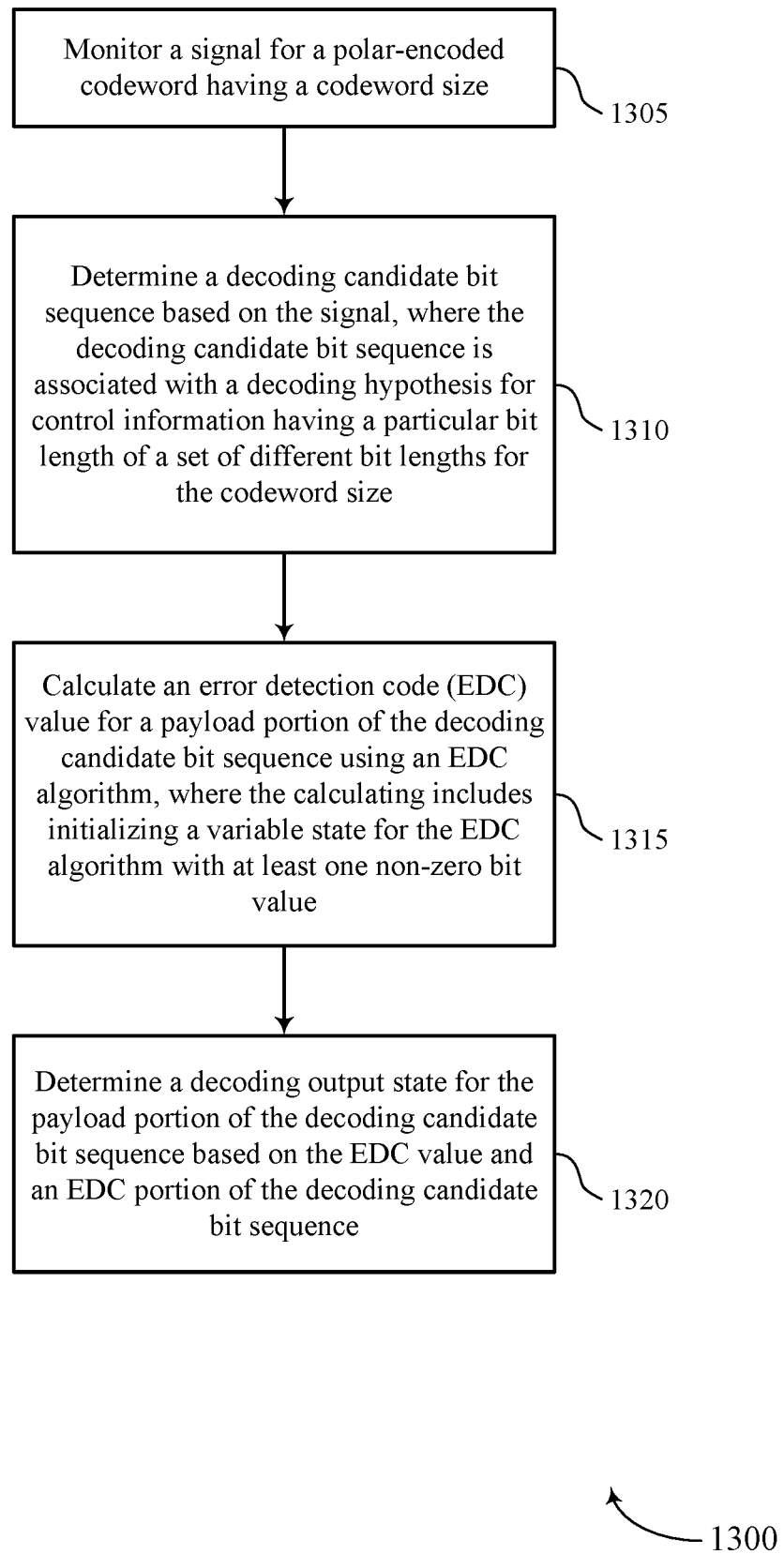
FIGS. 13 through 21 illustrate methods for size ambiguity reduction and false alarm rate reduction for polar codes in accordance with aspects of the present disclosure.

FIG. 13 shows a flowchart illustrating a method 1300 for size ambiguity reduction and false alarm rate reduction for polar codes in accordance with aspects of the present disclosure. The operations of method 1300 may be implemented by a UE 115 or its components as described herein. For example, the operations of method 1300 may be performed by a communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 1305 the UE 115 may monitor a signal for a polar-encoded codeword having a codeword size. The operations of block 1305 may be performed according to the methods described herein. In certain examples, aspects of the operations of block 1305 may be performed by a monitoring component as described with reference to FIGS. 9 through 12.

At block 1310 the UE 115 may determine a decoding candidate bit sequence based at least in part on the signal, wherein the decoding candidate bit sequence is associated with a decoding hypothesis for control information having a particular bit length of a plurality of different bit lengths for the codeword size. The operations of block 1310 may be performed according to the methods described herein. In certain examples, aspects of the operations of block 1310 may be performed by a list decoder as described with reference to FIGS. 9 through 12.

At block 1315 the UE 115 may calculate an EDC value for a payload portion of the decoding candidate bit sequence using an EDC algorithm, wherein the calculating comprises initializing a variable state for the EDC algorithm with at least one non-zero bit value. The operations of block 1315 may be performed according to the methods described herein. In certain examples, aspects of the operations of block 1315 may be performed by an error detector as described with reference to FIGS. 9 through 12.

At block 1320 the UE 115 may determine a decoding output state for the payload portion of the decoding candidate bit sequence based at least in part on the EDC value and an EDC portion of the decoding candidate bit sequence. The operations of block 1320 may be performed according to the methods described herein. In certain examples, aspects of the operations of block 1320 may be performed by an error detector as described with reference to FIGS. 9 through 12.

Figure 14:
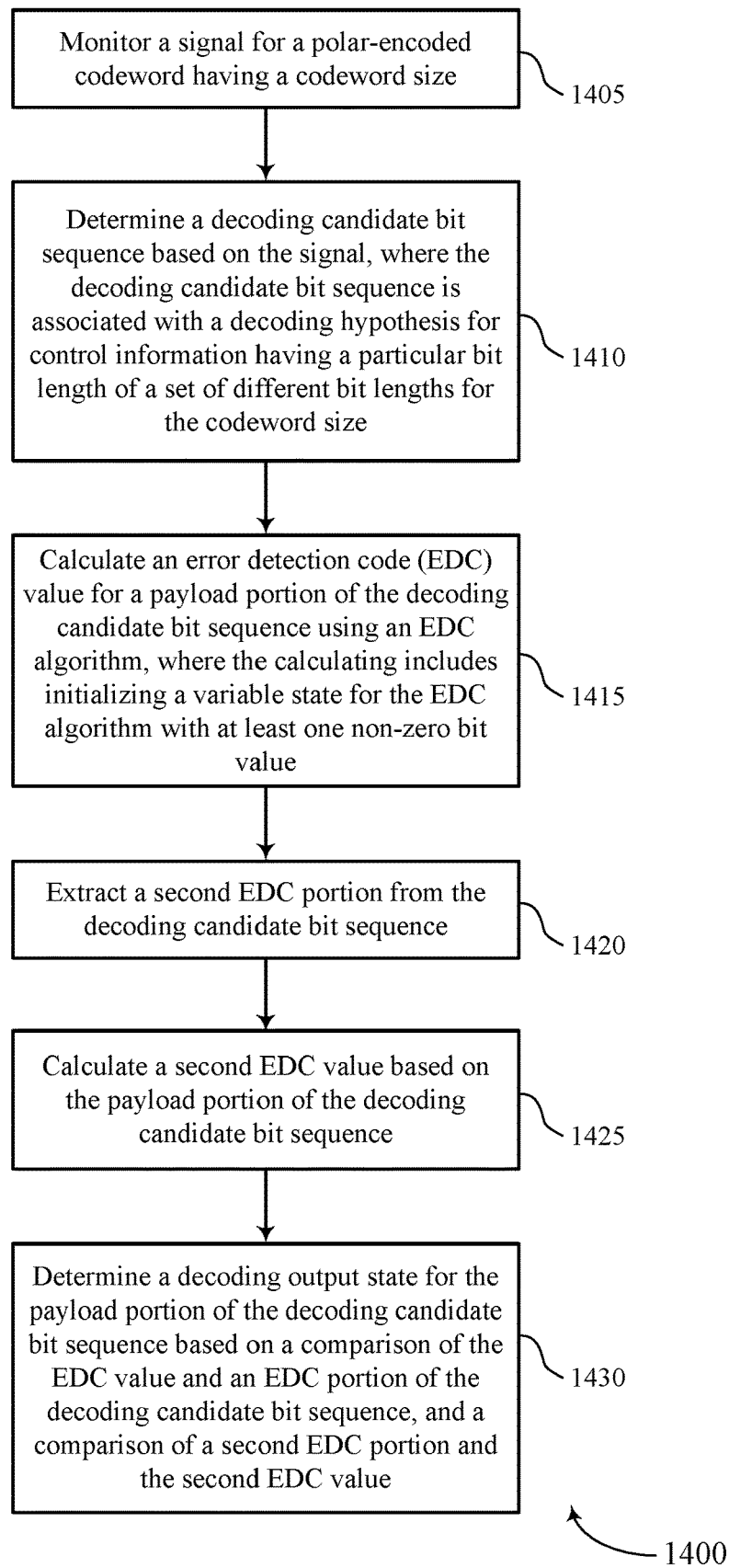

FIG. 14 shows a flowchart illustrating a method 1400 for size ambiguity reduction and false alarm rate reduction for polar codes in accordance with aspects of the present disclosure. The operations of method 1400 may be implemented by a UE 115 or its components as described herein. For example, the operations of method 1400 may be performed by a communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 1405 the UE 115 may monitor a signal for a polar-encoded codeword having a codeword size. The operations of block 1405 may be performed according to the methods described herein. In certain examples, aspects of the operations of block 1405 may be performed by a monitoring component as described with reference to FIGS. 9 through 12.

At block 1410 the UE 115 may determine a decoding candidate bit sequence based at least in part on the signal, wherein the decoding candidate bit sequence is associated with a decoding hypothesis for control information having a particular bit length of a plurality of different bit lengths for the codeword size. The operations of block 1410 may be performed according to the methods described herein. In certain examples, aspects of the operations of block 1410 may be performed by a list decoder as described with reference to FIGS. 9 through 12.

At block 1415 the UE 115 may calculate an EDC value for a payload portion of the decoding candidate bit sequence using an EDC algorithm, wherein the calculating comprises initializing a variable state for the EDC algorithm with at least one non-zero bit value. The operations of block 1415 may be performed according to the methods described herein. In certain examples, aspects of the operations of block 1415 may be performed by an error detector as described with reference to FIGS. 9 through 12.

At block 1420 the UE 115 may extract a second EDC portion from the decoding candidate bit sequence. The operations of block 1420 may be performed according to the methods described herein. In certain examples, aspects of the operations of block 1420 may be performed by an error detector as described with reference to FIGS. 9 through 12.

At block 1425 the UE 115 may calculate a second EDC value based at least in part on the payload portion of the decoding candidate bit sequence. The operations of block 1425 may be performed according to the methods described herein. In certain examples, aspects of the operations of block 1425 may be performed by an error detector as described with reference to FIGS. 9 through 12.

At block 1430 the UE 115 may determine a decoding output state for the payload portion of the decoding candidate bit sequence based at least in part on a comparison of the EDC value and an EDC portion of the decoding candidate bit sequence, and a comparison of a second EDC portion of the decoding candidate bit sequence and the second EDC value. The operations of block 1430 may be performed according to the methods described herein. In certain examples, aspects of the operations of block 1430 may be performed by an error detector as described with reference to FIGS. 9 through 12.

Figure 15:
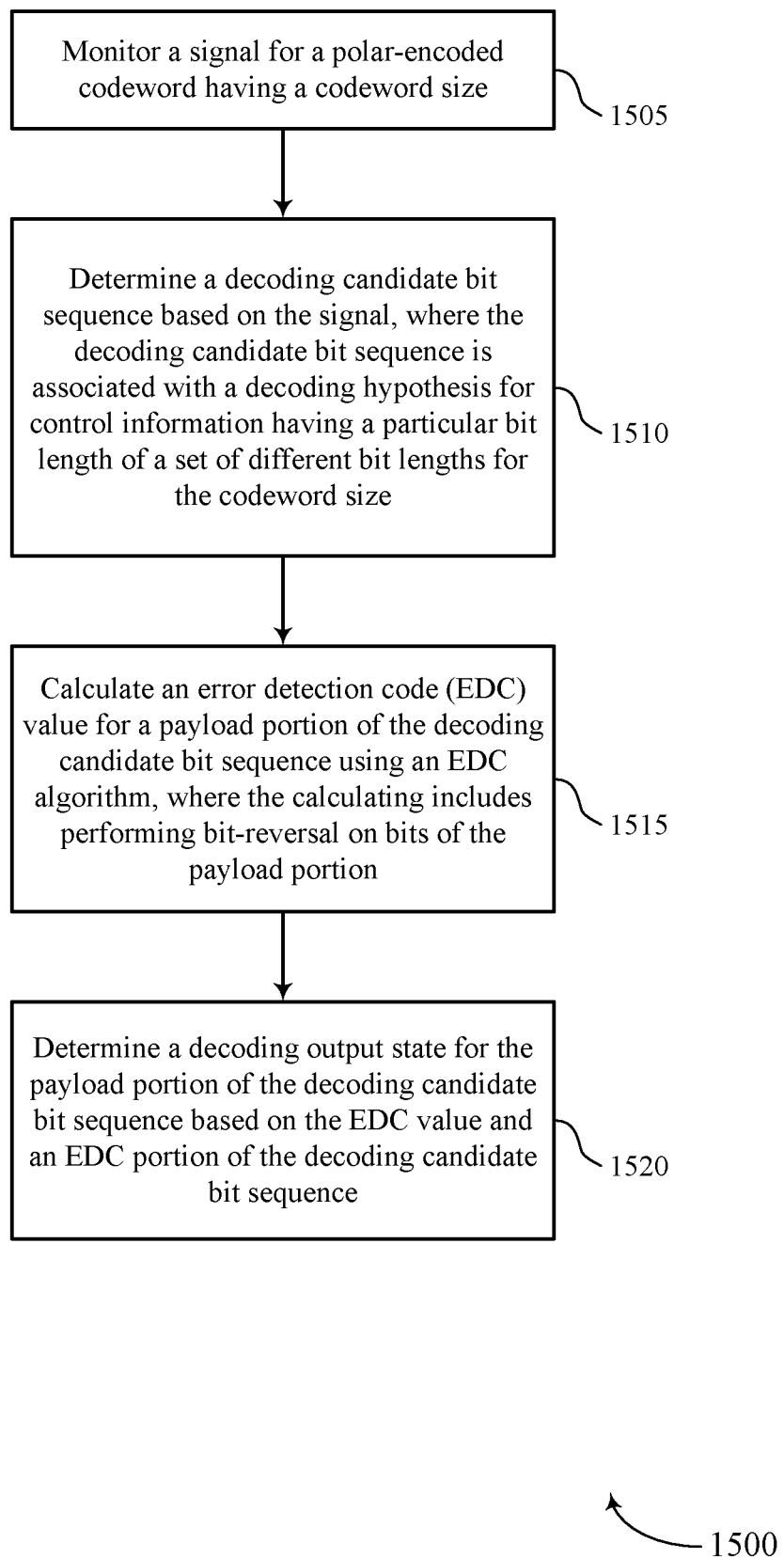

FIG. 15 shows a flowchart illustrating a method 1500 for size ambiguity reduction and false alarm rate reduction for polar codes in accordance with aspects of the present disclosure. The operations of method 1500 may be implemented by a UE 115 or its components as described herein. For example, the operations of method 1500 may be performed by a communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 1505 the UE 115 may monitor a signal for a polar-encoded codeword having a codeword size. The operations of block 1505 may be performed according to the methods described herein. In certain examples, aspects of the operations of block 1505 may be performed by a monitoring component as described with reference to FIGS. 9 through 12.

At block 1510 the UE 115 may determine a decoding candidate bit sequence based at least in part on the signal, wherein the decoding candidate bit sequence is associated with a decoding hypothesis for control information having a particular bit length of a plurality of different bit lengths for the codeword size. The operations of block 1510 may be performed according to the methods described herein. In certain examples, aspects of the operations of block 1510 may be performed by a list decoder as described with reference to FIGS. 9 through 12.

At block 1515 the UE 115 may calculate an EDC value for a payload portion of the decoding candidate bit sequence using an EDC algorithm, wherein the calculating comprises performing bit-reversal on bits of the payload portion. The operations of block 1515 may be performed according to the methods described herein. In certain examples, aspects of the operations of block 1515 may be performed by an error detector as described with reference to FIGS. 9 through 12.

At block 1520 the UE 115 may determine a decoding output state for the payload portion of the decoding candidate bit sequence based at least in part on the EDC value and an EDC portion of the decoding candidate bit sequence. The operations of block 1520 may be performed according to the methods described herein. In certain examples, aspects of the operations of block 1520 may be performed by an error detector as described with reference to FIGS. 9 through 12.

Figure 16:
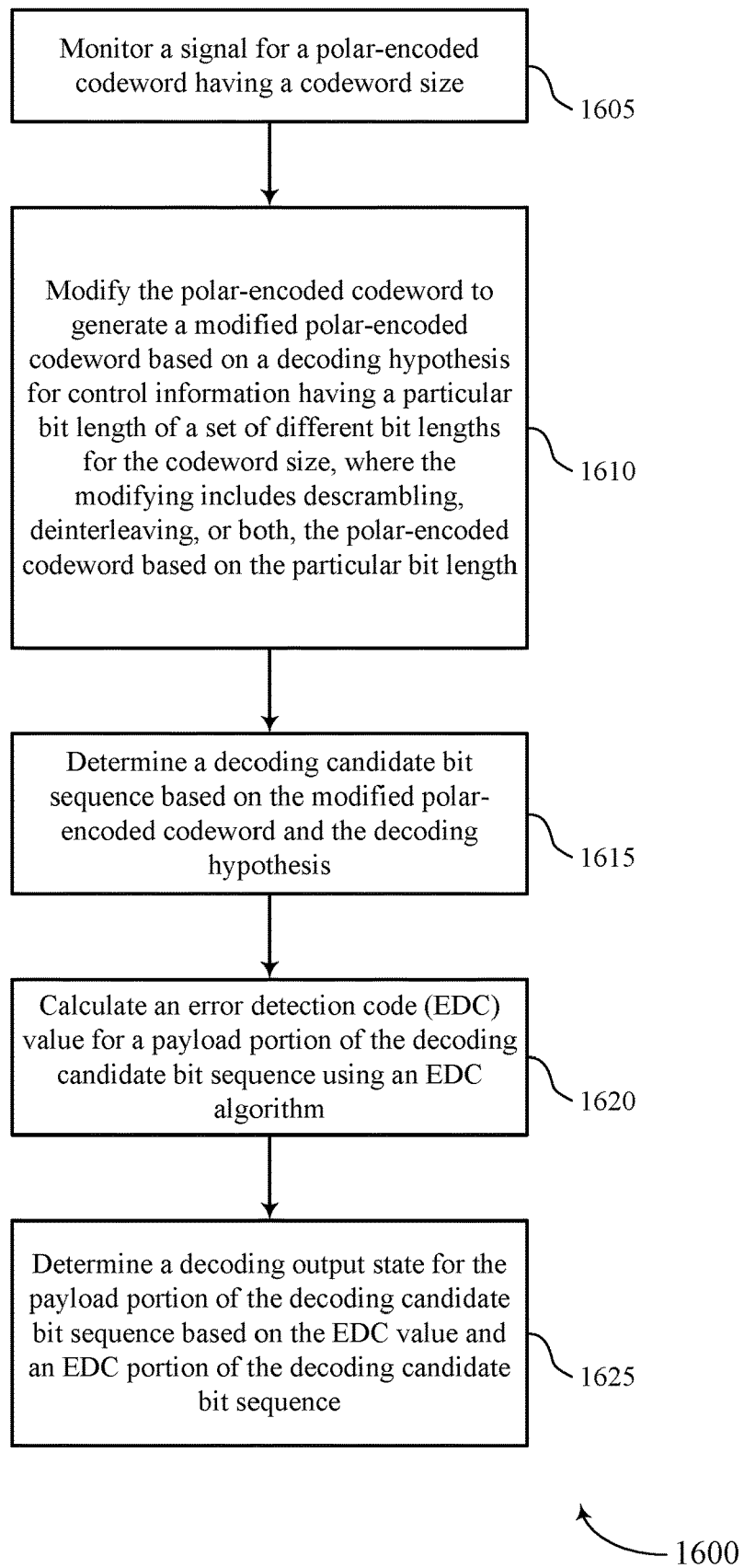

FIG. 16 shows a flowchart illustrating a method 1600 for size ambiguity reduction and false alarm rate reduction for polar codes in accordance with aspects of the present disclosure. The operations of method 1600 may be implemented by a UE 115 or its components as described herein. For example, the operations of method 1600 may be performed by a communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 1605 the UE 115 may monitor a signal for a polar-encoded codeword having a codeword size. The operations of block 1605 may be performed according to the methods described herein. In certain examples, aspects of the operations of block 1605 may be performed by a monitoring component as described with reference to FIGS. 9 through 12.

At block 1610 the UE 115 may modify the polar-encoded codeword to generate a modified polar-encoded codeword based at least in part on a decoding hypothesis for control information having a particular bit length of a plurality of different bit lengths for the codeword size, wherein the modifying comprises descrambling, deinterleaving, or both, the polar-encoded codeword based at least in part on the particular bit length. The operations of block 1610 may be performed according to the methods described herein. In certain examples, aspects of the operations of block 1610 may be performed by a modifier component as described with reference to FIGS. 9 through 12.

At block 1615 the UE 115 may determine a decoding candidate bit sequence based at least in part on the modified polar-encoded codeword and the decoding hypothesis. The operations of block 1615 may be performed according to the methods described herein. In certain examples, aspects of the operations of block 1615 may be performed by a list decoder as described with reference to FIGS. 9 through 12.

At block 1620 the UE 115 may calculate an EDC value for a payload portion of the decoding candidate bit sequence using an EDC algorithm. The operations of block 1620 may be performed according to the methods described herein. In certain examples, aspects of the operations of block 1620 may be performed by an error detector as described with reference to FIGS. 9 through 12.

At block 1625 the UE 115 may determine a decoding output state for the payload portion of the decoding candidate bit sequence based at least in part on the EDC value and an EDC portion of the decoding candidate bit sequence. The operations of block 1625 may be performed according to the methods described herein. In certain examples, aspects of the operations of block 1625 may be performed by an error detector as described with reference to FIGS. 9 through 12.

Figure 17:
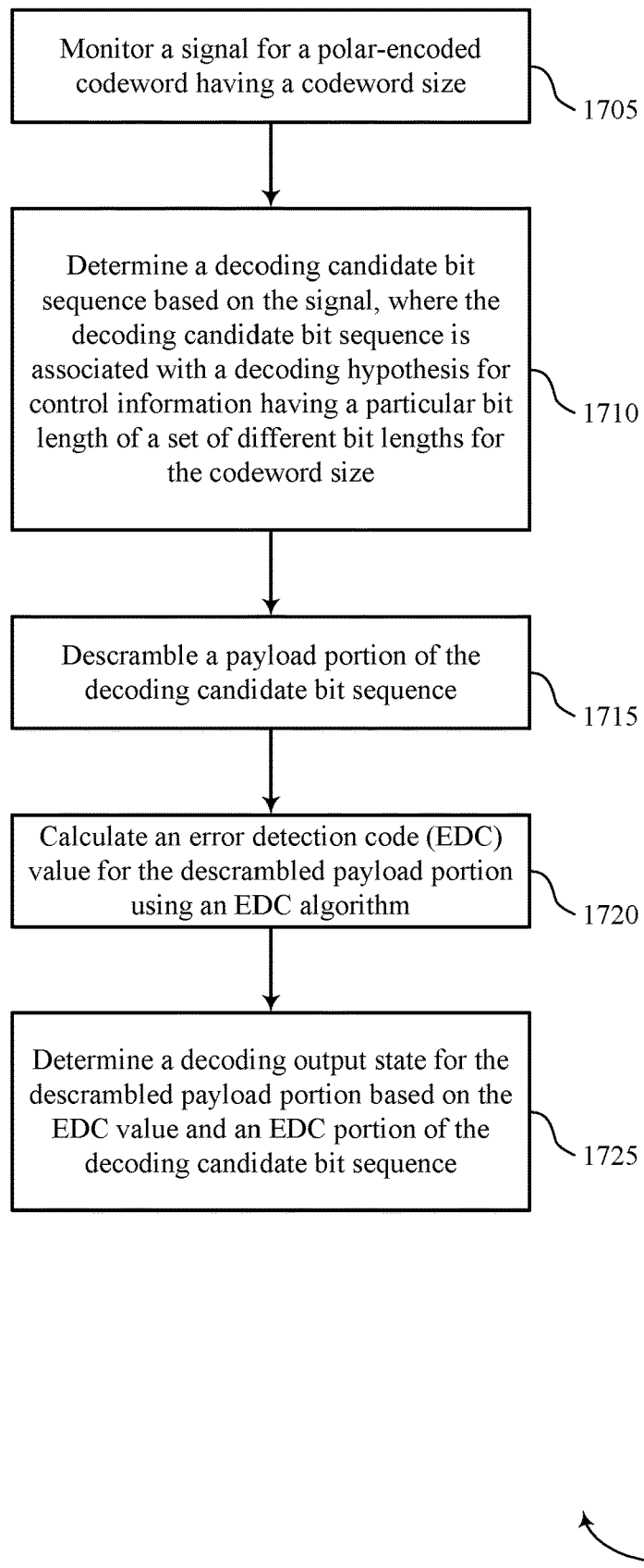

FIG. 17 shows a flowchart illustrating a method 1700 for size ambiguity reduction and false alarm rate reduction for polar codes in accordance with aspects of the present disclosure. The operations of method 1700 may be implemented by a UE 115 or its components as described herein. For example, the operations of method 1700 may be performed by a communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

block 1705 the UE 115 may monitor a signal for a polar-encoded codeword having a codeword size. The operations of block 1705 may be performed according to the methods described herein. In certain examples, aspects of the operations of block 1705 may be performed by a monitoring component as described with reference to FIGS. 9 through 12.

At block 1710 the UE 115 may determine a decoding candidate bit sequence based at least in part on the signal, wherein the decoding candidate bit sequence is associated with a decoding hypothesis for control information having a particular bit length of a plurality of different bit lengths for the codeword size. The operations of block 1710 may be performed according to the methods described herein. In certain examples, aspects of the operations of block 1710 may be performed by a list decoder as described with reference to FIGS. 9 through 12.

At block 1715 the UE 115 may descramble a payload portion of the decoding candidate bit sequence. The operations of block 1715 may be performed according to the methods described herein. In certain examples, aspects of the operations of block 1715 may be performed by a descrambler as described with reference to FIGS. 9 through 12.

At block 1720 the UE 115 may calculate an EDC value for the descrambled payload portion using an EDC algorithm. The operations of block 1720 may be performed according to the methods described herein. In certain examples, aspects of the operations of block 1720 may be performed by an error detector as described with reference to FIGS. 9 through 12.

At block 1725 the UE 115 may determine a decoding output state for the descrambled payload portion based at least in part on the EDC value and an EDC portion of the decoding candidate bit sequence. The operations of block 1725 may be performed according to the methods described herein. In certain examples, aspects of the operations of block 1725 may be performed by an error detector as described with reference to FIGS. 9 through 12.

Figure 18:
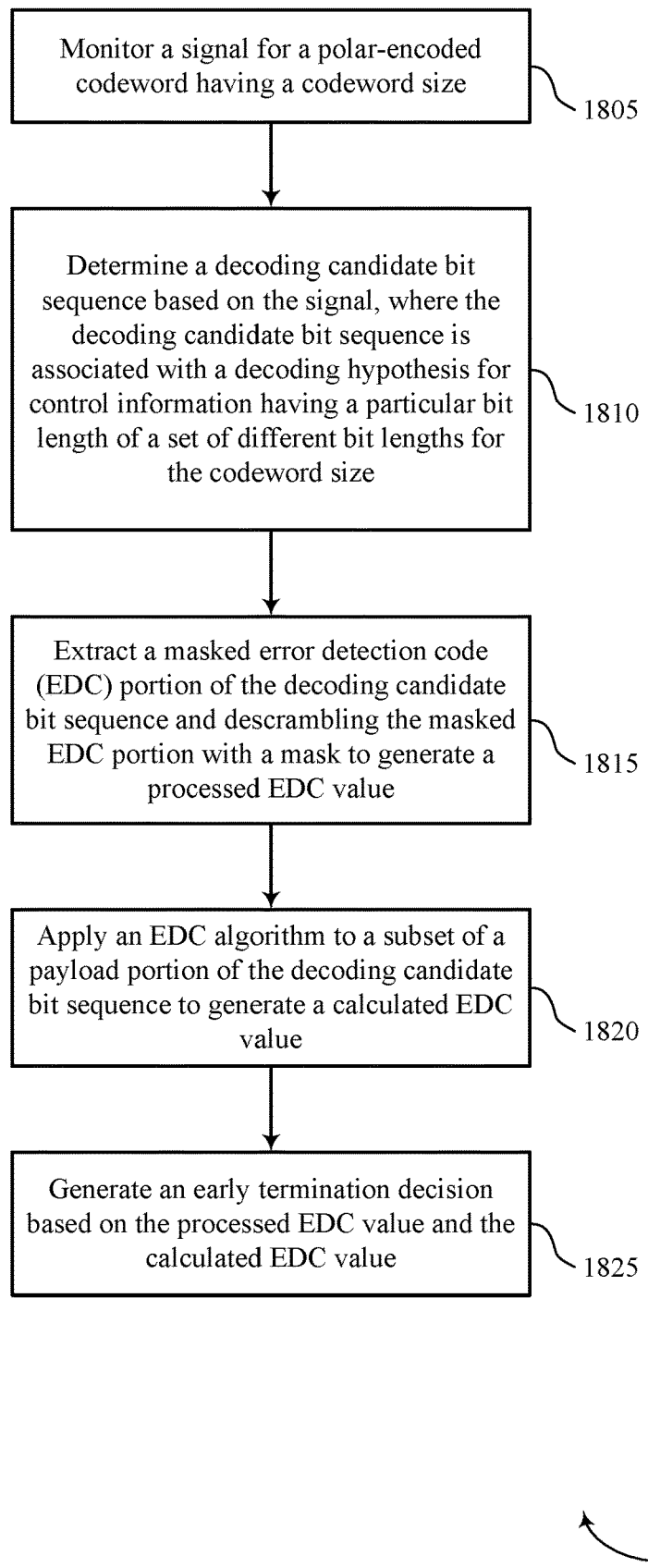

FIG. 18 shows a flowchart illustrating a method 1800 for size ambiguity reduction and false alarm rate reduction for polar codes in accordance with aspects of the present disclosure. The operations of method 1800 may be implemented by a UE 115 or its components as described herein. For example, the operations of method 1800 may be performed by a communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 1805 the UE 115 may monitor a signal for a polar-encoded codeword having a codeword size. The operations of block 1805 may be performed according to the methods described herein. In certain examples, aspects of the operations of block 1805 may be performed by a monitoring component as described with reference to FIGS. 9 through 12.

At block 1810 the UE 115 may determine a decoding candidate bit sequence based at least in part on the signal, wherein the decoding candidate bit sequence is associated with a decoding hypothesis for control information having a particular bit length of a plurality of different bit lengths for the codeword size. The operations of block 1810 may be performed according to the methods described herein. In certain examples, aspects of the operations of block 1810 may be performed by a list decoder as described with reference to FIGS. 9 through 12.

At block 1815 the UE 115 may extract a masked EDC portion of the decoding candidate bit sequence and descrambling the masked EDC portion with a mask to generate a processed EDC value. The operations of block 1815 may be performed according to the methods described herein. In certain examples, aspects of the operations of block 1815 may be performed by a descrambler as described with reference to FIGS. 9 through 12.

At block 1820 the UE 115 may apply an EDC algorithm to a subset of a payload portion of the decoding candidate bit sequence to generate a calculated EDC value. The operations of block 1820 may be performed according to the methods described herein. In certain examples, aspects of the operations of block 1820 may be performed by an error detector as described with reference to FIGS. 9 through 12.

At block 1825 the UE 115 may generate an early termination decision based at least in part on the processed EDC value and the calculated EDC value. The operations of block 1825 may be performed according to the methods described herein. In certain examples, aspects of the operations of block 1825 may be performed by an early terminator as described with reference to FIGS. 9 through 12.

Figure 19:
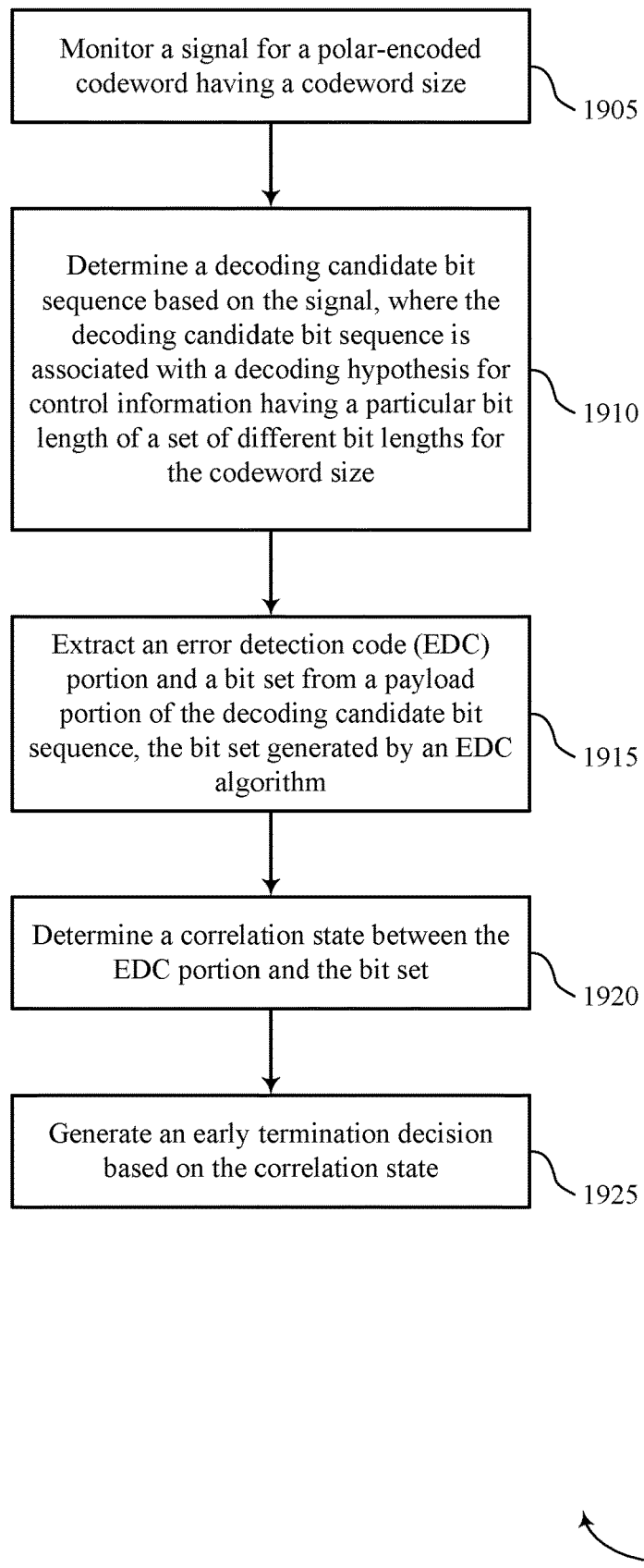

FIG. 19 shows a flowchart illustrating a method 1900 for size ambiguity reduction and false alarm rate reduction for polar codes in accordance with aspects of the present disclosure. The operations of method 1900 may be implemented by a UE 115 or its components as described herein. For example, the operations of method 1900 may be performed by a communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 1905 the UE 115 may monitor a signal for a polar-encoded codeword having a codeword size. The operations of block 1905 may be performed according to the methods described herein. In certain examples, aspects of the operations of block 1905 may be performed by a monitoring component as described with reference to FIGS. 9 through 12.

At block 1910 the UE 115 may determine a decoding candidate bit sequence based at least in part on the signal, wherein the decoding candidate bit sequence is associated with a decoding hypothesis for control information having a particular bit length of a plurality of different bit lengths for the codeword size. The operations of block 1910 may be performed according to the methods described herein. In certain examples, aspects of the operations of block 1910 may be performed by a list decoder as described with reference to FIGS. 9 through 12.

At block 1915 the UE 115 may extract an EDC portion and a bit set from a payload portion of the decoding candidate bit sequence, the bit set generated by an EDC algorithm. The operations of block 1915 may be performed according to the methods described herein. In certain examples, aspects of the operations of block 1915 may be performed by a extractor as described with reference to FIGS. 9 through 12.

At block 1920 the UE 115 may determine a correlation state between the EDC portion and the bit set. The operations of block 1920 may be performed according to the methods described herein. In certain examples, aspects of the operations of block 1920 may be performed by a correlator as described with reference to FIGS. 9 through 12.

At block 1925 the UE 115 may generate an early termination decision based at least in part on the correlation state. The operations of block 1925 may be performed according to the methods described herein. In certain examples, aspects of the operations of block 1925 may be performed by an early terminator as described with reference to FIGS. 9 through 12.

Figure 20:
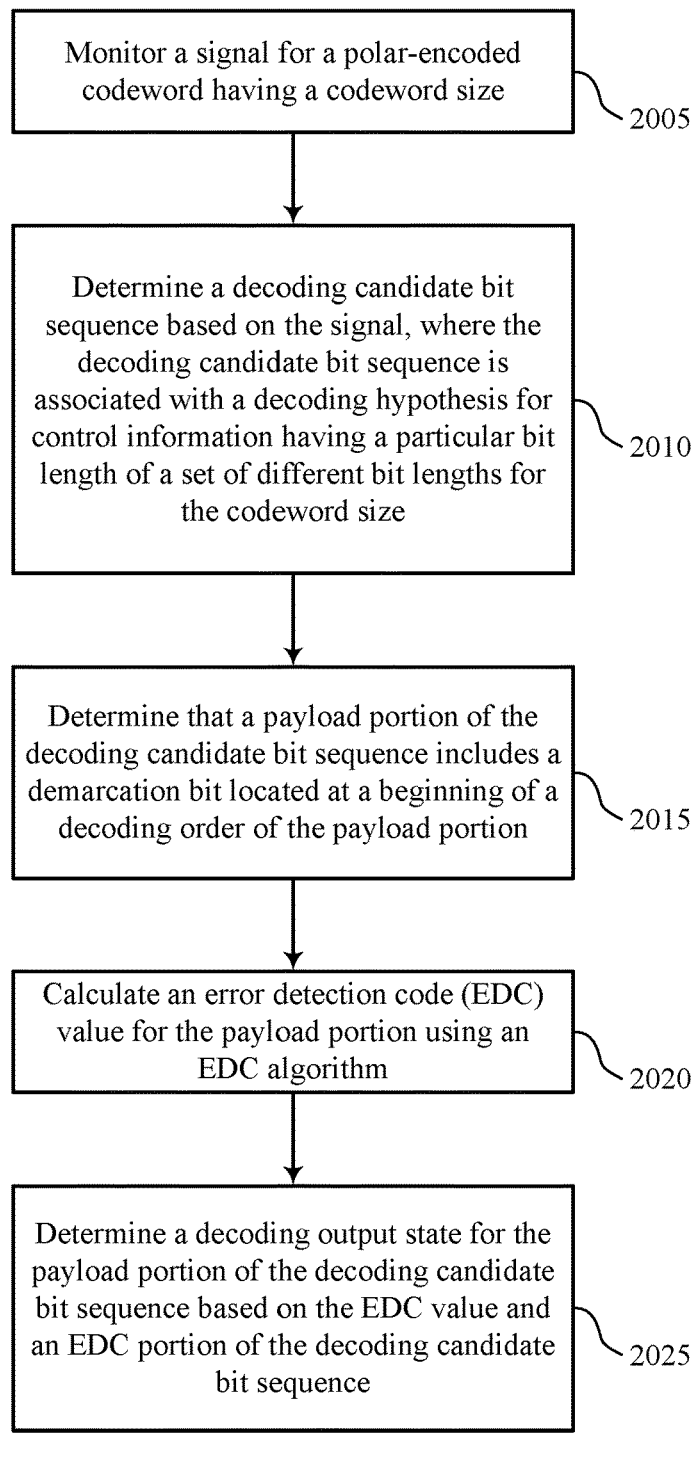

FIG. 20 shows a flowchart illustrating a method 2000 for size ambiguity reduction and false alarm rate reduction for polar codes in accordance with aspects of the present disclosure. The operations of method 2000 may be implemented by a UE 115 or its components as described herein. For example, the operations of method 2000 may be performed by a communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 2005 the UE 115 may monitor a signal for a polar-encoded codeword having a codeword size. The operations of block 2005 may be performed according to the methods described herein. In certain examples, aspects of the operations of block 2005 may be performed by a monitoring component as described with reference to FIGS. 9 through 12.

At block 2010 the UE 115 may determine a decoding candidate bit sequence based at least in part on the signal, wherein the decoding candidate bit sequence is associated with a decoding hypothesis for control information having a particular bit length of a plurality of different bit lengths for the codeword size. The operations of block 2010 may be performed according to the methods described herein. In certain examples, aspects of the operations of block 2010 may be performed by a list decoder as described with reference to FIGS. 9 through 12.

At block 2015 the UE 115 may determine that a payload portion of the decoding candidate bit sequence comprises a demarcation bit located at a beginning of a decoding order of the payload portion. The operations of block 2015 may be performed according to the methods described herein. In certain examples, aspects of the operations of block 2015 may be performed by a demarcation component as described with reference to FIGS. 9 through 12.

At block 2020 the UE 115 may calculate an EDC value for the payload portion using an EDC algorithm. The operations of block 2020 may be performed according to the methods described herein. In certain examples, aspects of the operations of block 2020 may be performed by an error detector as described with reference to FIGS. 9 through 12.

At block 2025 the UE 115 may determine a decoding output state for the payload portion of the decoding candidate bit sequence based at least in part on the EDC value and an EDC portion of the decoding candidate bit sequence. The operations of block 2025 may be performed according to the methods described herein. In certain examples, aspects of the operations of block 2025 may be performed by an error detector as described with reference to FIGS. 9 through 12.

Figure 21:
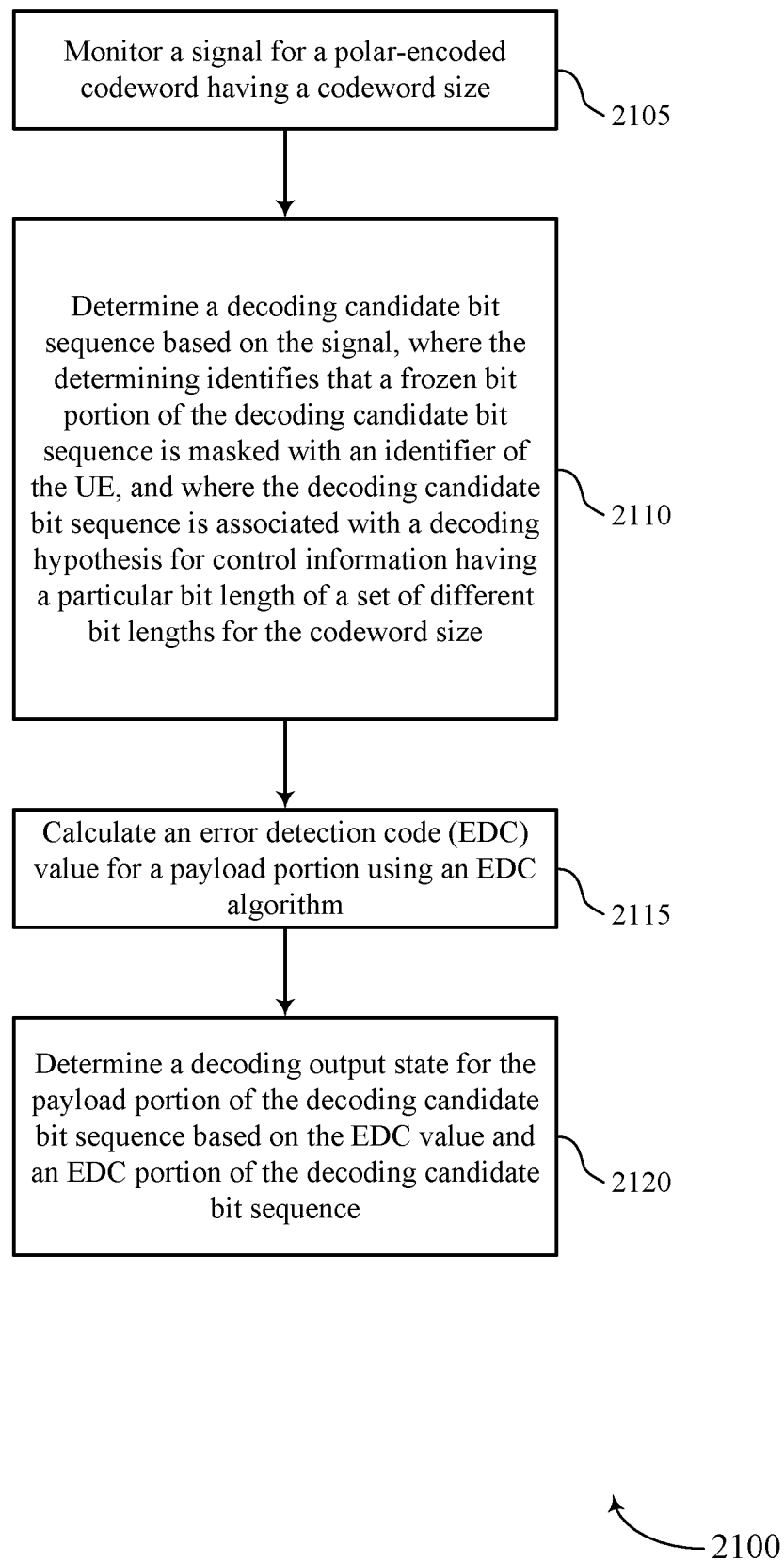

FIG. 21 shows a flowchart illustrating a method 2100 for size ambiguity reduction and false alarm rate reduction for polar codes in accordance with aspects of the present disclosure. The operations of method 2100 may be implemented by a UE 115 or its components as described herein. For example, the operations of method 2100 may be performed by a communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 2105 the UE 115 may monitor a signal for a polar-encoded codeword having a codeword size. The operations of block 2105 may be performed according to the methods described herein. In certain examples, aspects of the operations of block 2105 may be performed by a monitoring component as described with reference to FIGS. 9 through 12.

At block 2110 the UE 115 may determine a decoding candidate bit sequence based at least in part on the signal, wherein the determining identifies that a frozen bit portion of the decoding candidate bit sequence is masked with an identifier of the UE, and wherein the decoding candidate bit sequence is associated with a decoding hypothesis for control information having a particular bit length of a plurality of different bit lengths for the codeword size. The operations of block 2110 may be performed according to the methods described herein. In certain examples, aspects of the operations of block 2110 may be performed by a list decoder as described with reference to FIGS. 9 through 12.

At block 2115 the UE 115 may calculate an EDC value for a payload portion using an EDC algorithm. The operations of block 2115 may be performed according to the methods described herein. In certain examples, aspects of the operations of block 2115 may be performed by an error detector as described with reference to FIGS. 9 through 12.

At block 2120 the UE 115 may determine a decoding output state for the payload portion of the decoding candidate bit sequence based at least in part on the EDC value and an EDC portion of the decoding candidate bit sequence. The operations of block 2120 may be performed according to the methods described herein. In certain examples, aspects of the operations of block 2120 may be performed by an error detector as described with reference to FIGS. 9 through 12.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNB, gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication by a user equipment (UE), comprising:
monitoring, by the UE, a signal for a polar-encoded codeword having a codeword size;
determining, by the UE, a decoding candidate bit sequence based at least in part on the signal, wherein the decoding candidate bit sequence is associated with a decoding hypothesis for control information having a particular bit length of a plurality of different bit lengths for the codeword size;
calculating, by the UE, an error detection code (EDC) value for a payload portion of the decoding candidate bit sequence using an EDC algorithm, wherein the calculating comprises initializing a variable state for the EDC algorithm with at least one non-zero bit value; and
determining, by the UE, a decoding output state for the payload portion of the decoding candidate bit sequence based at least in part on the EDC value and an EDC portion of the decoding candidate bit sequence.

2. The method of claim 1, further comprising:
descrambling the EDC portion of the decoding candidate bit sequence with a mask, wherein the decoding output state is based at least in part on the descrambled EDC portion.

3. The method of claim 1, wherein:
the decoding output state is based at least in part on a comparison of the EDC value and the EDC portion of the decoding candidate bit sequence.

4. The method of claim 3, wherein:
the EDC value corresponds to a subset of the payload portion, and wherein the decoding output state indicates to terminate decoding of the payload portion prior to decoding at least a last bit of the payload portion.

5. The method of claim 3, further comprising:
extracting a second EDC portion from the decoding candidate bit sequence; and
calculating a second EDC value based at least in part on the payload portion of the decoding candidate bit sequence, wherein the decoding output state is based at least in part on a comparison of the second EDC portion and the second EDC value.

6. The method of claim 5, wherein:
the EDC portion of the decoding candidate bit sequence is separated by one or more bits from the second EDC portion of the decoding candidate bit sequence.

7. The method of claim 1, wherein:
the variable state is initialized based at least in part on an identifier of the UE.

8. The method of claim 1, wherein:
the variable state is initialized to include a plurality of bits each having a value set to one.

9. The method of claim 1, wherein:
bits of the payload portion of the decoding candidate bit sequence comprise a plurality of control information bits and a plurality of EDC bits, and
each frozen bit of a plurality of frozen bits used to generate the polar-encoded codeword has a value set to zero and each bit of a plurality of bits of the initialized variable state has a value set to one.

10. The method of claim 1, wherein:
the decoding output state comprises a decoding error or decoded control information extracted from the decoding candidate bit sequence.

11. A method for wireless communication by a user equipment (UE), comprising:
monitoring, by the UE, a signal for a polar-encoded codeword having a codeword size;
determining, by the UE, a decoding candidate bit sequence based at least in part on the signal, wherein the decoding candidate bit sequence is associated with a decoding hypothesis for control information having a particular bit length of a plurality of different bit lengths for the codeword size;
extracting, by the UE, an error detection code (EDC) portion and a bit set from a payload portion of the decoding candidate bit sequence, the bit set generated by an EDC algorithm;
determining, by the UE, a correlation state between the EDC portion and the bit set; and
generating, by the UE, an early termination decision based at least in part on the correlation state.

12. The method of claim 11, wherein:
the early termination decision is to terminate decoding of the payload portion prior to decoding at least a last bit of the payload portion.

13. The method of claim 11, wherein:
the early termination decision is to continue decoding of the payload portion.

14. The method of claim 11, further comprising:
extracting a second EDC portion of the decoding candidate bit sequence;
applying the EDC algorithm to the payload portion of the decoding candidate bit sequence to generate a second EDC value; and
determining a decoding output state for the payload portion of the decoding candidate bit sequence based at least in part on the second EDC value and the second EDC portion of the decoding candidate bit sequence.

15. The method of claim 14, wherein:
the EDC portion of the decoding candidate bit sequence is separated by one or more bits from the second EDC portion of the decoding candidate bit sequence.

16. The method of claim 14, wherein applying the EDC algorithm comprises:
initializing a variable state for the EDC algorithm with at least one non-zero bit value.

17. The method of claim 11, wherein:
bits of the payload portion of the decoding candidate bit sequence comprise a plurality of control information bits and a plurality of EDC bits, and
each frozen bit of a plurality of frozen bits used to generate the polar-encoded codeword has a value set to zero and each bit of a plurality of bits of an initialized variable state for the EDC algorithm has a value set to one.

18. The method of claim 14, wherein applying the EDC algorithm comprises:
scrambling a defined number of bits output by the EDC algorithm with a mask to generate the second EDC value.

19. The method of claim 14, wherein:
the decoding output state comprises a decoding error or decoded control information extracted from the decoding candidate bit sequence.

20. The method of claim 15, wherein extracting the EDC portion from the decoding candidate bit sequence comprises:
extracting a defined number of bits from the decoding candidate bit sequence corresponding to a candidate location for the EDC portion within the decoding candidate bit sequence.

21. The method of claim 20, wherein:
the candidate location is at a beginning of a decoding order of the payload portion or intermediate to the decoding order.

22. A method for wireless communication by a user equipment (UE), comprising:
monitoring, by the UE, a signal for a polar-encoded codeword having a codeword size;
determining, by the UE, a decoding candidate bit sequence based at least in part on the signal, wherein the decoding candidate bit sequence is associated with a decoding hypothesis for control information having a particular bit length of a plurality of different bit lengths for the codeword size;
determining, by the UE, that a payload portion of the decoding candidate bit sequence comprises a demarcation bit located at a beginning of a decoding order of the payload portion;
calculating, by the UE, an error detection code (EDC) value for the payload portion using an EDC algorithm; and
determining, by the UE, a decoding output state for the payload portion of the decoding candidate bit sequence based at least in part on the EDC value and an EDC portion of the decoding candidate bit sequence.

23. The method of claim 22, wherein:
the decoding output state is based at least in part on a comparison of the EDC value and the EDC portion of the decoding candidate bit sequence.

24. The method of claim 22, wherein:
the decoding output state comprises a decoding error or decoded control information extracted from the decoding candidate bit sequence.

25. The method of claim 22, wherein:
the EDC portion comprises a first EDC portion of the decoding candidate bit sequence and a second EDC portion of the decoding candidate bit sequence, and
the first EDC portion of the decoding candidate bit sequence is separated by one or more bits from the second EDC portion of the decoding candidate bit sequence.

26. The method of claim 22, wherein:
bits of the payload portion of the decoding candidate bit sequence comprise a plurality of control information bits and a plurality of EDC bits, and
each frozen bit of a plurality of frozen bits used to generate the polar-encoded codeword has a value set to zero and each bit of a plurality of bits of an initialized variable state for the EDC algorithm has a value set to one.

27. An apparatus for wireless communication, comprising:
a processor;
memory in electronic communication with the processor; and
instructions stored in the memory and operable, when executed by the processor, to cause the apparatus to:
monitor a signal for a polar-encoded codeword having a codeword size;
determine a decoding candidate bit sequence based at least in part on the signal, wherein the decoding candidate bit sequence is associated with a decoding hypothesis for control information having a particular bit length of a plurality of different bit lengths for the codeword size;
calculate an error detection code (EDC) value for a payload portion of the decoding candidate bit sequence using an EDC algorithm, wherein the calculating comprises initializing a variable state for the EDC algorithm with at least one non-zero bit value; and
determine a decoding output state for the payload portion of the decoding candidate bit sequence based at least in part on the EDC value and an EDC portion of the decoding candidate bit sequence.

28. The apparatus of claim 27, wherein the instructions are further executable by the processor to:
descramble the EDC portion of the decoding candidate bit sequence with a mask, wherein the decoding output state is based at least in part on the descrambled EDC portion.

29. The apparatus of claim 27, wherein:
the decoding output state is based at least in part on a comparison of the EDC value and the EDC portion of the decoding candidate bit sequence.

30. The apparatus of claim 29, wherein:
the EDC value corresponds to a subset of the payload portion, and wherein the decoding output state indicates to terminate decoding of the payload portion prior to decoding at least a last bit of the payload portion.

31. The apparatus of claim 29, wherein the instructions are further executable by the processor to:
extract a second EDC portion from the decoding candidate bit sequence; and
calculate a second EDC value based at least in part on the payload portion of the decoding candidate bit sequence, wherein the decoding output state is based at least in part on a comparison of the second EDC portion and the second EDC value.

32. The apparatus of claim 31, wherein:
the EDC portion of the decoding candidate bit sequence is separated by one or more bits from the second EDC portion of the decoding candidate bit sequence.

33. The apparatus of claim 27, wherein:
the variable state is initialized based at least in part on an identifier of a user equipment.

34. The apparatus of claim 27, wherein:
the variable state is initialized to include a plurality of bits each having a value set to one.

35. The apparatus of claim 27, wherein:
bits of the payload portion of the decoding candidate bit sequence comprise a plurality of control information bits and a plurality of EDC bits, and
each frozen bit of a plurality of frozen bits used to generate the polar-encoded codeword has a value set to zero and each bit of a plurality of bits of the initialized variable state has a value set to one.

36. The apparatus of claim 27, wherein:
the decoding output state comprises a decoding error or decoded control information extracted from the decoding candidate bit sequence.

37. An apparatus for wireless communication, comprising:
a processor;
memory in electronic communication with the processor; and
instructions stored in the memory and operable, when executed by the processor, to cause the apparatus to:
monitor a signal for a polar-encoded codeword having a codeword size;
determine a decoding candidate bit sequence based at least in part on the signal, wherein the decoding candidate bit sequence is associated with a decoding hypothesis for control information having a particular bit length of a plurality of different bit lengths for the codeword size;
extract an error detection code (EDC) portion and a bit set from a payload portion of the decoding candidate bit sequence, the bit set generated by an EDC algorithm;
determine a correlation state between the EDC portion and the bit set; and
generate an early termination decision based at least in part on the correlation state.

38. The apparatus of claim 37, wherein:
the early termination decision is to terminate decoding of the payload portion prior to decoding at least a last bit of the payload portion.

39. The apparatus of claim 37, wherein:
the early termination decision is to continue decoding of the payload portion.

40. The apparatus of claim 37, wherein the instructions are further executable by the processor to:
extract a second EDC portion of the decoding candidate bit sequence;
apply the EDC algorithm to the payload portion of the decoding candidate bit sequence to generate a second EDC value; and
determine a decoding output state for the payload portion of the decoding candidate bit sequence based at least in part on the second EDC value and the second EDC portion of the decoding candidate bit sequence.

41. The apparatus of claim 40, wherein:
the EDC portion of the decoding candidate bit sequence is separated by one or more bits from the second EDC portion of the decoding candidate bit sequence.

42. The apparatus of claim 40, wherein applying the EDC algorithm comprises instructions further executable by the processor to:
initialize a variable state for the EDC algorithm with at least one non-zero bit value.

43. The apparatus of claim 40, wherein applying the EDC algorithm comprises instructions further executable by the processor to:
scramble a defined number of bits output by the EDC algorithm with a mask to generate the second EDC value.

44. The apparatus of claim 40, wherein:
the decoding output state comprises a decoding error or decoded control information extracted from the decoding candidate bit sequence.

45. The apparatus of claim 37, wherein extracting the EDC portion from the decoding candidate bit sequence comprises instructions further executable by the processor to:
extract a defined number of bits from the decoding candidate bit sequence corresponding to a candidate location for the EDC portion within the decoding candidate bit sequence.

46. The apparatus of claim 45, wherein:
the candidate location is at a beginning of a decoding order of the payload portion or intermediate to the decoding order.

47. The apparatus of claim 37, wherein:
bits of the payload portion of the decoding candidate bit sequence comprise a plurality of control information bits and a plurality of EDC bits, and
each frozen bit of a plurality of frozen bits used to generate the polar-encoded codeword has a value set to zero and each bit of a plurality of bits of an initialized variable state for the EDC algorithm has a value set to one.

48. An apparatus for wireless communication, comprising:
a processor;
memory in electronic communication with the processor; and
instructions stored in the memory and operable, when executed by the processor, to cause the apparatus to:
monitor a signal for a polar-encoded codeword having a codeword size;
determine a decoding candidate bit sequence based at least in part on the signal, wherein the decoding candidate bit sequence is associated with a decoding hypothesis for control information having a particular bit length of a plurality of different bit lengths for the codeword size;
determine that a payload portion of the decoding candidate bit sequence comprises a demarcation bit located at a beginning of a decoding order of the payload portion;
calculate an error detection code (EDC) value for the payload portion using an EDC algorithm; and
determine a decoding output state for the payload portion of the decoding candidate bit sequence based at least in part on the EDC value and an EDC portion of the decoding candidate bit sequence.

49. The apparatus of claim 48, wherein:
the decoding output state is based at least in part on a comparison of the EDC value and the EDC portion of the decoding candidate bit sequence.

50. The apparatus of claim 48, wherein:
the decoding output state comprises a decoding error or decoded control information extracted from the decoding candidate bit sequence.

51. The apparatus of claim 48, wherein:
the EDC portion comprises a first EDC portion of the decoding candidate bit sequence and a second EDC portion of the decoding candidate bit sequence, and
the first EDC portion of the decoding candidate bit sequence is separated by one or more bits from the second EDC portion of the decoding candidate bit sequence.

52. The apparatus of claim 48, wherein:
bits of the payload portion of the decoding candidate bit sequence comprise a plurality of control information bits and a plurality of EDC bits, and
each frozen bit of a plurality of frozen bits used to generate the polar-encoded codeword has a value set to zero and each bit of a plurality of bits of an initialized variable state for the EDC algorithm has a value set to one.

53. An apparatus for wireless communication, comprising:
means for monitoring a signal for a polar-encoded codeword having a codeword size;
means for determining a decoding candidate bit sequence based at least in part on the signal, wherein the decoding candidate bit sequence is associated with a decoding hypothesis for control information having a particular bit length of a plurality of different bit lengths for the codeword size;
means for calculating an error detection code (EDC) value for a payload portion of the decoding candidate bit sequence using an EDC algorithm, wherein the calculating comprises initializing a variable state for the EDC algorithm with at least one non-zero bit value; and means for determining a decoding output state for the payload portion of the decoding candidate bit sequence based at least in part on the EDC value and an EDC portion of the decoding candidate bit sequence.

54. A non-transitory computer readable medium storing code for wireless communication, the code comprising instructions executable by a processor to:

monitor a signal for a polar-encoded codeword having a codeword size;

determine a decoding candidate bit sequence based at least in part on the signal, wherein the decoding candidate bit sequence is associated with a decoding hypothesis for control information having a particular bit length of a plurality of different bit lengths for the codeword size;

calculate an error detection code (EDC) value for a payload portion of the decoding candidate bit sequence using an EDC algorithm, wherein the calculating comprises initializing a variable state for the EDC algorithm with at least one non-zero bit value; and determine a decoding output state for the payload portion of the decoding candidate bit sequence based at least in part on the EDC value and an EDC portion of the decoding candidate bit sequence.

* * * * *